(12) United States Patent
Arai et al.

(10) Patent No.: US 6,624,636 B2
(45) Date of Patent: Sep. 23, 2003

(54) METHOD AND APPARATUS FOR ESTIMATING TERMINAL VOLTAGE OF BATTERY, METHOD AND APPARATUS FOR COMPUTING OPEN CIRCUIT VOLTAGE OF BATTERY, AND METHOD AND APPARATUS FOR COMPUTING BATTERY CAPACITY

(75) Inventors: Youichi Arai, Shizuoka (JP); Hideaki Kamohara, Shizuoka (JP); Michito Enomoto, Shizouka (JP); Tomohiro Kawaguchi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/080,278

(22) Filed: Feb. 22, 2002

(65) Prior Publication Data

US 2002/0145430 A1 Oct. 10, 2002

(30) Foreign Application Priority Data

Feb. 23, 2001 (JP) ........................................ 2001-048349

(51) Int. Cl.[7] .............................................. G01N 27/416
(52) U.S. Cl. ....................................................... 324/426
(58) Field of Search ................................ 324/426, 427, 324/429, 430, 431, 433; 320/132, 149, DIG. 21

(56) References Cited

U.S. PATENT DOCUMENTS

| | | | | |
|---|---|---|---|---|
| 3,873,911 A | * | 3/1975 | Champlin | |
| 4,745,349 A | * | 5/1988 | Palanisamy et al. | |
| 4,912,416 A | * | 3/1990 | Champlin | |
| 5,708,347 A | * | 1/1998 | Palanisamy et al. | |
| 6,424,158 B2 | * | 7/2002 | Klang | |

\* cited by examiner

Primary Examiner—Edward H. Tso
(74) Attorney, Agent, or Firm—Armstrong, Westerman & Hattori, LLP

(57) ABSTRACT

A method and an apparatus for computing a charging state of a battery without being affected by an influence of polarization are provided. First computing means computes a voltage-current characteristic including the influence of the polarization during an decrease of a discharge current of the battery on the basis of a terminal voltage and discharge current measured while the battery carries out a constant load discharge with a current value large enough to cancel a charge-side polarization arisen in the battery at least just before the discharge. A second computing means shifts the voltage-current characteristic to a specific extent in the direction of a voltage coordinate axis. A residual voltage drop value in advance stored by storing means is added to a present estimated voltage value estimated by estimating means on the basis of the shifted voltage-current characteristic, thereby a present open circuit voltage of the battery is computed.

20 Claims, 21 Drawing Sheets

I – V CHARACTERISTIC

CONSTANT CURRENT DISCHARGE CHARACTERISTIC

IMAGINARY CONSTANT CURRENT DISCHARGE CHARACTERISTIC

METHOD AND APPARATUS FOR ESTIMATING TERMINAL VOLTAGE OF BATTERY, METHOD AND APPARATUS FOR COMPUTING OPEN CIRCUIT VOLTAGE OF BATTERY, AND METHOD AND APPARATUS FOR COMPUTING BATTERY CAPACITY

BACKGROUND OF THE INVENTION (1) Field of the Invention

The present invention relates to a method and apparatus for estimating an estimated voltage that is an estimated terminal voltage of a battery, which supplies the electric power to loads in a vehicle, in its constant load discharging state, a method and apparatus for computing an open circuit voltage corresponding to a terminal voltage of the battery in its equilibrium state, and a method and apparatus for computing a charging capacity of the battery. More specifically, the present invention relates to a method and apparatus for estimating an estimated voltage that is an estimated terminal voltage of a battery in its constant load discharging state, in which a voltage-current characteristic derived from a periodically measured terminal voltage and discharge current of the battery is used, a method and apparatus for computing an open circuit voltage and charging capacity of the battery from the estimated voltage.

(2) Description of the Related Art

So far, a driving source of a vehicle has been mainly an engine, in which gasoline or gas oil is employed as the fuel, but in recent years a vehicle employing an electromotive motor, which does not directly discharge the combustion gas, as the only or the supplementary driving source has appeared. As to a vehicle loading the electromotive motor, grasping a charging capacity of a battery, which supplies the electric power to the electromotive motor, is important for computing a possible traveling distance and so on.

So far, an integration method of current or electric power has been employed, in which an integrated consumed electric power computed by using an integrated value of the discharge current is subtracted from a full charging capacity so as to compute the present charging capacity. However, in such a method, an original full charging capacity is changed depending upon individual differences among batteries, deterioration rates of the batteries and so on, therefore the present charging capacity of the battery cannot be accurately computed.

A state of charge of the battery can be known by measuring the density of the electrolyte of the battery since there is a certain linear relationship between the density of the electrolyte and the state of charge. However, actually in a battery during charging or discharging and a battery right after the completion of charge or discharge thereof, chemical reactions occurring between the electrolyte and the electrodes make the density of the electrolyte non-uniform, therefore the state of charge of the battery cannot be known accurately by measuring the density of the electrolyte.

Besides, the charging capacity of the battery may be known by measuring the terminal voltage of the battery. But the terminal voltage is not stable unless the discharge current is stabilized, therefore actually the terminal voltage correlating with the state of charge of the battery cannot be obtained by the measurement.

As shown in characteristic graphs in FIG. 22, in which the battery is subjected to the discharge with each constant current ranging from 10 to 80 A in units of 10 A, the discharging time (horizontal axis) increases with decreasing the discharge current while the terminal voltage (vertical axis) of the battery drastically decreases with the discharging time.

Here, the horizontal axis of the characteristic graphs in FIG. 22 is the time, however, since the discharge is carried out with the constant current and the battery capacity is expressed by electrical quantity (Ah), this horizontal axis can be regarded as the battery capacity.

Then, the characteristic graphs in FIG. 22 reveals that smaller the discharge current, higher the electric power to be obtained and that the capacity drop near the state of full charge of the battery is slow while the capacity drop near the state of full discharge is rapid.

As described above, even if the discharge current can be stabilized, since there is no linear correlation between the charging capacity of the battery and the terminal voltage thereof, the charging capacity cannot be derived from the terminal voltage of the battery.

Thus, appears to be reasonable is a method for computing the capacity employing a relationship between the state of charge of the battery and the open circuit voltage, which is possibly a linear relationship since there is about a linear relation between the electrolyte density of the battery and the open circuit voltage and since there is a linear relation between the electrolyte density of the battery and the state of charge of the battery.

However, the sole weak point of this method for computing the capacity is that the open circuit voltage can be measured during non-discharging period of time when the state of charge of the battery does not change, except the self-discharging. In other words, the open circuit voltage cannot be measured during discharging when the state of charge of the battery changes.

Consequently, a point of the above method for computing the capacity is how to find out the open circuit voltage during the discharge of the battery.

The terminal voltage and the discharge current can be measured during the discharge of the battery. As shown in FIG. 22, since the terminal voltage appears to decrease with increasing the discharge current even when the state of charge of the battery does not change, there is a voltage-current characteristic (I-V characteristic) showing a negative correlation between the terminal voltage and the discharge current, which changes with changing the state of charge of the battery.

Thus, in order to know a plurality of the voltage-current characteristics of the battery in response to the state of charge of the battery, the following measurement is carried out.

First, a discharge is continuously carried out by using an impulse current, in which a current $I_a$ and a current $I_b$ smaller than $I_a$ are periodically mutually appear, and then the predetermined number of the sets (for example, 100 sets) of the terminal voltage having a reverse phase with respect to the discharge current and the discharge current, i.e. $(I_a, V_1)$, $(I_b, V_2)$, $(I_a, V_3)$, $(I_b, V_4)$, - - - are continuously sampled at the same period of time with the impulse cycle (for example, 1 millisecond) of the discharge current.

Then, from thus sampled sets of the terminal voltage and the discharge current, i.e. $(I_a, V_{01})$, $(I_b, V_{02})$, $(I_a, V_{03})$, $(I_b, V_{04})$, - - - , by using the method of least squares, coefficients $a_1$ and $b_1$ in an equation $V=a_1I+b_1$, i.e. a linear relationship between the voltage and current of the battery are obtained, wherein the equation $V=a_1I+b_1$ is placed as the voltage-current characteristic of the battery corresponding to the capacity during the above sampling.

Then, the similar discharge to the discharge described above is continuously carried out by using an impulse current, in which currents $I_a$ and $I_a$ are periodically mutually appear, and then the predetermined number of the sets of the terminal voltage having a reverse phase with respect to the discharge current and the discharge current, i.e. $(I_a, V_{11})$, $(I_b, V_{12})$, $(I_a, V_{13})$, $(I_b, V_{14})$, - - - are continuously sampled. Then, from thus sampled sets of the terminal voltage and the discharge current, by using the method of least squares, coefficients $a_2$ and $b_2$ in an equation $V=a_2I+b_2$, i.e. a linear relationship between the voltage and current of the battery are obtained, wherein the equation $V=a_2I+b_2$ is placed as the voltage-current characteristic of the battery corresponding to the capacity during the above sampling.

Thereafter, similarly, coefficients $a_n$ and $b_n$ in an equation $V=a_nI+b_n$, i.e. a linear relationship between the voltage and current of the battery are obtained, wherein the equation $V=a_nI+b_n$ is placed as the voltage-current characteristic of the battery corresponding to each mutually different capacity which gradually decreases, thereby the voltage-current characteristics of the battery corresponding to the respective capacities ranging from 100% to 0%.

In FIG. 23, there is schematically shown a relation between the sampled sets of the terminal voltage and the discharge current. i.e. $(I_a, V_{n1})$, $(I_b, V_{n2})$, $(I_a, V_{n3})$, $(I_b, V_{n4})$, - - - and the linear voltage-current equation $V=a_nI+b_n$, which is obtained from the sets by using the method of least squares.

Here, an imaginary current value Is that is an imaginary constant current value is substituted to the voltage-current characteristic equation of the battery corresponding to the respective capacities, then if the resultant obtained V is defined as an estimated voltage Vn that is an estimated terminal voltage of the battery in its state of constant-load discharge, a constant current discharging characteristic shown in graphs in FIG. 24 is obtained.

When any positive value is substituted for the imaginary current value Is, the corresponding constant current discharging characteristic becomes a non-linear characteristic, in which the estimated terminal voltage Vn rapidly decreases as the capacity of the horizontal axis increases in the vicinity of the right end of the respective curves, and even in the case of the imaginary current value Is=0 A, in which the open circuit voltage must be theoretically shown, the constant current discharging characteristic shows a similar characteristic.

According to the graphs in FIG. 24, since smaller the imaginary current value Is, smaller the degree of decreasing in the estimated voltage Vn as the capacity reduces to zero, therefore when a negative value is substituted as the imaginary current value Is to the voltage-current characteristic equation of the battery corresponding to the respective capacities, the resultant constant current discharging characteristic is expressed by curves shown in FIG. 25. In this case, the characteristic of the estimated voltage Vn in the vicinity of the capacity being zero shows an inflectional change having a boundary of the imaginary current value Is=−10 A.

Consequently, theoretically if the imaginary current value Is is set to be −10 A, the estimated voltage Vn in the constant current discharge shows a linear relationship with respect to the capacity of the battery.

FIG. 26 shows graphs illustrating the voltage-current characteristic of the battery corresponding to the respective capacities with having the vertical axis of the discharge current I and the horizontal axis of the terminal voltage V. In the following, that the estimated voltage Vn during the constant current discharging has a linear relationship with respect to the battery capacity will be verified.

Since coefficients $a_1$, $a_2$, - - - , $a_n$, expressing the respective gradients of the voltage-current characteristic equations are mutually different and coefficients $b_1$, $b_2$ - - - , $b_n$ expressing the respective intercepts of the voltage-current characteristic equations also are mutually different, in the region of positive discharge current that actually exists, no value I of discharge current, at which the terminal voltage V linearly changes with the change in the battery capacity, exists.

To the contrary, in the region of negative discharge current that is an imaginary region shown in FIG. 26, the terminal voltage V shows a characteristic of changing linearly with respect to the battery capacity, that is, the terminal voltage V of the battery corresponding to each capacity at the discharge current value I=−10 A is the estimated voltage Vn.

A graph in FIG. 27 shows a relationship between the battery capacity at the imaginary current value Is=−10 A and the estimated voltage Vn that has a linear correlation with the battery capacity. As shown in FIG. 16, the estimated voltage Vn exists between the open circuit voltage Vs at the fully charged state and the open circuit voltage Ve at the end of discharge, therefore a capacity value corresponding to the estimated voltage Vn is a residual capacity, i.e. a state of charge (SOC).

Consequently, since the estimated voltage takes the place of the open circuit voltage of the battery, even upon discharge when the open circuit voltage cannot be measured, provided that the discharge is a constant load discharge, in which the load supplying the electric power does not change during discharge, the terminal voltage that changes delicately during discharge and the discharge current are measured, thereby the voltage-current characteristic that is a relation between the terminal voltage and the discharge current during the constant load discharge is known. Then, the imaginary current value Is=−10 A is substituted into the resultant characteristic equation (V=aI+b) so as to know the estimated voltage Vn, thereby the a state of charge (SOC) of the battery can be calculated from the estimated voltage Vn.

The present state of charge (SOC) with respect to the fully charged capacity can be calculated from the graph shown in FIG. 27 as follows:

$$SOC=\{(Vn-Ve)(Vs-Ve)\}\times 100(\%).$$

More accurately, the present state of charge (SOC) with respect to the fully charged capacity can be calculated as follows in terms of a ratio of the electric power (V×Ah):

$$SOC = \{[(Vn + Ve)2] \times [(Vn - Ve)(Vs - Ve)] \times Ah\}$$
$$\{[(Vs + Ve)2] \times Ah\} \times 100 \ (\%)$$
$$= \{(Vn^2 - Ve^2)(Vs^2 - Ve^2)\} \times 100 \ (\%).$$

Generally, as shown in FIG. 28, during the discharge of a battery, a voltage drop due to a pure resistance (ohmic resistance of the battery) such as IR drop (=the pure resistances discharge current) and a voltage drop due to a polarization at the discharging side takes place, on the other hand during the charge of the battery, a voltage rise due to the pure resistance such as voltage rise due to a polarization at the charging side takes place.

Especially as shown in FIG. 28, an activation polarization for advancing redox reactions on the surface of the electrodes, which is included in the polarization at the discharging side arising during the discharge of the battery, and a concentration polarization due to the difference in concentrations of the reactants and products generated from a result of the mass transfer between the electrode surfaces and the solution, take place with some delay with respect to the increase and decrease in the discharge current, therefore the polarization does not show a linear relationship with the value of the discharge current.

Consequently, when the estimated voltage Vn is to be calculated instead of the open circuit voltage in order to compute the state of charge (SOC) of the battery, the terminal voltage and the discharge current are measured during the discharge so as to calculate the voltage-current characteristic. However, since the terminal voltage includes the voltage drop due to the polarization during the discharge, the calculated voltage-current characteristic and the estimated voltage Vn calculated therefrom include the voltage drop due to the polarization besides the state of charge (SOC) of the battery, therefore the estimated voltage Vn as it cannot be employed to calculate accurately the state of charge (SOC) of the battery.

Further, since the amount of the voltage drop due to the polarization varies depending upon the amount of the discharge current and the length of the discharging period of time required for the discharge current to reach its maximum value after the discharge is started, when the discharge current value or the discharge time varies, a gradient in the voltage-current characteristic of the battery that is calculated from the measured values of the terminal voltage and the discharge current during discharge changes, in response thereto.

Furthermore, the estimated voltage Vn estimated from the voltage-current characteristic, the charging state SOC of the battery calculated from the estimated voltage Vn, or each value of the non-measurable open circuit voltage OCV, which may be calculated prior to the charging state SOC, also can be a different value depending upon the difference in the discharge current value or the discharge time.

SUMMARY OF THE INVENTION

It is therefore an objective of the present invention to solve the above problem and to provide a method and apparatus for estimating an estimated voltage that is an estimated terminal voltage of a battery in its constant load discharging state, a method and apparatus for computing an open circuit voltage corresponding to a terminal voltage of the battery in its equilibrium state, and a method and apparatus for computing a charging capacity of the battery, wherein the open circuit voltage and charging capacity of the battery are computed from the estimated voltage, and the estimation of the estimated voltage of the battery and the computation of the open circuit voltage or the charging capacity of the battery can be accurately carried out, even if the amount of the voltage drop included in the terminal voltage of the battery during the discharge thereof varies depending upon the discharge current value or the discharge time.

In order to attain the above objective, the present invention is to provide a method for estimating a terminal voltage of a battery comprising the steps of:

periodically measuring a terminal voltage and a discharge current of a battery that supplies an electric power to loads in a vehicle;

calculating a voltage-current characteristic expressing a correlation between the terminal voltage and the discharge current; and estimating an estimated voltage that is an estimated terminal voltage of the battery in a constant load discharging state thereof from the voltage-current characteristic, wherein when the battery carries out a constant load discharge with a current value large enough to cancel a charge-side polarization arisen in the battery at least just before the discharge, the voltage-current characteristic including an influence of a polarization is calculated from the terminal voltage and the discharge current of the battery, which are periodically measured while the discharge current of the constant load discharge decreases from the maximum current value, the voltage-current characteristic including the influence of the polarization is shifted in the direction of a voltage coordinate axis so that a voltage value at a reference current value lower than the maximum current value in the voltage-current characteristic including the influence of the polarization agrees with a reference voltage value at the reference current value in the voltage-current characteristic, which does not include the influence of the polarization but depends only on a pure resistance component of the battery, and a voltage value corresponding to a predetermined imaginary current value in the voltage-current characteristic including the influence of the polarization shifted in the direction of the voltage coordinate axis is estimated as a value of the estimated voltage.

With the construction described above, once the discharge current of the constant load discharge reaches the current value large enough to cancel the charge-side polarization arisen in the battery at least just before the discharge, even if the voltage drop or rise due to the polarization at the charge or discharge side arisen in the former discharge remains before the start of the discharge, the system is in a state that the polarization of the discharge side corresponding to a discharge current value, which exceeds the residual voltage drop, arises or in a state that the polarization of the discharge side, the magnitude of which corresponds to the discharge current value, newly arises after the residual voltage rise is canceled.

On the other hand, even if the battery in an equilibrium state carries out a constant load discharge with a discharge current value large enough to cancel the charge-side polarization arisen in the battery at least just before the discharge, when the discharge current reaches the discharge current value, the polarization arises, the magnitude of which corresponds to the discharge current value.

Therefore, when the battery carries out a constant load discharge with a discharge current value large enough to cancel the charge-side polarization arisen in the battery at least just before the discharge, not depending upon that the battery was in an equilibrium state before the start of the constant load discharge or that the polarized state at the discharge or charge side arisen in the former discharge is not quite completely canceled, the estimated voltage estimated from the voltage-current characteristic, which is calculated from the discharge current and the terminal voltage of the battery while the discharge current is decreasing from the discharge current value large enough to cancel the charge-side polarization arisen in the battery at least just before the discharge, is the same.

The magnitude of the polarization arisen in the battery during the discharge depends on the discharge current value and the discharge period of time required for the discharge current to reach the maximum value thereof.

Therefore, if the discharge period of time for the discharge current to reach the maximum value thereof after the start of the discharge is long, the voltage drop value of the terminal voltage arisen in the battery due to the polarization due to the discharge becomes larger than that when the discharge period of time is short even if the maximum value of the discharge current is the same. On the other hand, if the maximum value of the discharge current is large, the voltage drop value of the terminal voltage arisen in the battery due to the polarization due to the discharge becomes larger than that when the maximum value of the discharge current is small even if the discharge period of time is the same.

Further, the voltage drop value of the terminal voltage arisen in the battery due to the polarization due to the discharge increases with almost the same pace as that of the discharge current increasing while the discharge current increases, however when the discharge current once reaches the maximum value thereof and starts decreasing, the voltage drop value of the terminal voltage decreases with a pace slower than that of the discharge current decreasing, as a result, the greater part of the voltage drop value of the terminal voltage due to the polarization is not canceled for a while even after the discharge is finished and the discharge current becomes zero accordingly.

Summarizing the characteristics described above, when the voltage-current characteristic including the influence of the polarization, which shows the correlation between the terminal voltage and discharge current, is computed from the terminal voltage and discharge current measured during the discharge, the difference in the voltage drop value depending on the discharge current value and the discharge period of time significantly affects the characteristic during the increase of the discharge current and hardly affects the characteristic during the decrease of the discharge current.

Consequently, out of the voltage-current characteristic including the influence of the polarization, as for the characteristic during the increase of the discharge current, the characteristic itself changes depending on the discharge current value and the discharge period of time. On the other hand, as for the characteristic during the decrease of the discharge current, the characteristic itself hardly changes even when the discharge current value and the discharge period of time change, that is, only a parameter value indicating an intercept on a voltage coordinate axis in a general equation indicating the characteristic changes and only a terminal voltage value corresponding to a discharge current value changes.

Therefore, out of the voltage-current characteristic including the influence of the polarization of the battery, which is computed by measuring the discharge current and terminal voltage during the discharge, the characteristic itself during the decrease of the discharge current does not change if the discharge current value and the discharge period of time change.

Therefore, when the battery carries out a constant load discharge with a current value large enough to cancel a charge-side polarization arisen in the battery at least just before the discharge, the voltage-current characteristic including an influence of a polarization is calculated from the terminal voltage and the discharge current of the battery, which are periodically measured while the discharge current of the constant load discharge decreases from the maximum current value, and the voltage-current characteristic including the influence of the polarization is shifted in the direction of a voltage coordinate axis so that a voltage value at a reference current value lower than the maximum current value in the voltage-current characteristic including the influence of the polarization agrees with a reference voltage value at the reference current value in the voltage-current characteristic, which does not include the influence of the polarization but depends only on a pure resistance component of the battery. Thereby, the voltage-current characteristic including the influence of the polarization during the decrease of the discharge current is pumped up (raised up) in the direction of a voltage coordinate axis by a factor of a voltage drop value due to the polarization, the generated amount of which increases due to the increase of the discharge current, as a result, the variable component by the discharge current value and the discharge period of time of the voltage-current characteristic during the increase of the discharge current is removed from the voltage-current characteristic including the influence of the polarization during the decrease of the discharge current.

Preferably, the voltage-current characteristic including the influence of the polarization is expressed by an approximate curve equation.

With the construction described above, the low pace of the decrease in the voltage drop value of the terminal voltage, which is arisen in the battery due to the polarization by the discharge, is more correctly reflected in the voltage-current characteristic including the influence of the polarization, thereby the accuracy of the estimated voltage estimated on the basis of the voltage-current characteristic including the influence of the polarization becomes higher.

Preferably, the current value large enough to cancel a charge-side polarization arisen in the battery at least just before the discharge is set to be a predetermined large current value required to drive a maximum power consuming load independently out of the loads in the vehicle, which receive an electric power from the battery, and after the discharge current of the battery starts decreasing from the predetermined large current value, while the discharge current of the battery is lower than the predetermined large current value and is decreasing up to a target current value that is higher than a maximum discharge current value when the loads in the vehicle except the maximum power consuming load are driven, a voltage-current characteristic including an influence of a polarization for the battery in an equilibrium state thereof and the voltage-current characteristic including the influence of the polarization are calculated from the periodically measured terminal voltage and discharge current of the battery.

With the construction described above, the predetermined large current value required to drive the maximum power consuming load independently out of the loads in the vehicle exceeds each current value used for driving the other load even if a plurality of powers are simultaneously supplied to the other loads. Therefore, the predetermined large current value is set to be a current value large enough to cancel the charge-side polarization arisen in the battery at least just before the discharge, thereby when the discharge current reaches the predetermined large current value, a voltage drop exceeding the voltage drop due to the discharge-side polarization arisen by the former discharge is already arisen in the terminal voltage of the battery.

On the other hand, when the discharge current value of the battery decreases from the predetermined large current value and reaches to a target current value not less than a maximum discharge current value when the loads except the maximum power consuming load are driven, a voltage drop component due to the discharge-side polarization arisen by the power supply to the loads in the vehicle except the maximum power consuming load does not seemingly affect the voltage drop due to the discharge-side polarization remaining in the terminal voltage of the battery, but a remaining component except a component removed by that the discharge current decreases to the target current value out of the voltage drop due to the discharge-side polarization arisen by the discharge with the predetermined large current value seemingly affects the voltage drop due to the discharge-side polarization remaining in the terminal voltage of the battery.

Consequently, the voltage-current characteristic including the influence of the polarization is computed from the terminal voltage and the discharge current periodically measured while the discharge current of the battery, which has carried out the constant load discharge with the predetermined large current value, starts decreasing from the predetermined large current value and reaches the target current value. A present estimated voltage estimated on the basis of the voltage-current characteristic including the influence of the polarization purely reflects only the remaining component except the component canceled due to the decrease of the discharge current decreasing up to the target current value out of the voltage drop due to the discharge-side polarization arisen by the discharge with the predetermined large current value, even if the loads in the vehicle except the maximum power consuming load are still driven.

The present invention is also to provide a method for computing an open circuit voltage of a battery comprising the steps of:

- periodically measuring a terminal voltage and a discharge current of a battery that supplies an electric power to loads in a vehicle;
- calculating a voltage-current characteristic expressing a correlation between the terminal voltage and the discharge current;
- estimating an estimated voltage that is an estimated terminal voltage of the battery in a constant load discharging state thereof from the voltage-current characteristic; and
- computing an open circuit voltage of the battery corresponding to a terminal voltage of the battery in an equilibrium state thereof on the basis of the estimated voltage, wherein when the battery carries out a constant load discharge with a current value large enough to cancel a charge-side polarization arisen in the battery at least just before the discharge, the voltage-current characteristic including an influence of a polarization is calculated from the terminal voltage and the discharge current of the battery, which are periodically measured while the discharge current of the constant load discharge decreases from the maximum current value, the voltage-current characteristic including the influence of the polarization is shifted in the direction of a voltage coordinate axis so that a voltage value at a reference current value lower than the maximum current value in the voltage-current characteristic including the influence of the polarization agrees with a reference voltage value at the reference current value in the voltage-current characteristic, which does not include the influence of the polarization but depends only on a pure resistance component of the battery, a difference value between the open circuit voltage value at the current being zero in the voltage-current characteristic not including the influence of the polarization and the estimated voltage value estimated on the basis of the voltage-current characteristic including the influence of the polarization shifted in the direction of a voltage coordinate axis is in advance calculated as a residual voltage drop value due to an influence of a residual polarization upon a completion of the discharge of the battery, thereafter, whenever the battery carries out a constant load discharge with a current value large enough to cancel a charge-side polarization arisen in the battery at least just before the discharge, the voltage-current characteristic including the influence of the polarization is newly calculated from the terminal voltage and the discharge current of the battery periodically measured during the constant load discharge, the newly calculated voltage-current characteristic including the influence of the polarization is shifted in the direction of a voltage coordinate axis so that a voltage value at the reference current value in the newly calculated voltage-current characteristic including the influence of the polarization agrees with the reference voltage value in the voltage-current characteristic not including the influence of the polarization when the voltage-current characteristic including the influence of the polarization is newly calculated, a present estimated voltage is estimated on the basis of the newly calculated voltage-current characteristic including the influence of the polarization shifted in the direction of a voltage coordinate axis, and a present open circuit voltage is computed by adding the residual voltage drop value to the present estimated voltage value.

With the construction described above, when the discharge current of the constant load discharge of the battery reaches a current value large enough to cancel the charge-side polarization arisen in the battery at least just before the discharge, even if a voltage drop or voltage rise due to the polarization of the discharge-side or the charge-side arisen in the former discharge remains before the discharge starts, the battery becomes in a state that a discharge-side polarization having the magnitude corresponding to the discharge current value arises or in a state that a discharge-side polarization having the magnitude corresponding to the discharge current value newly arises after canceling the residual voltage rise.

On the other hand, even if the battery has carried out the constant load discharge with a current value large enough to cancel the charge-side polarization arisen in the battery at least just before the discharge, when the current value reaches the discharge current value, the battery becomes in a state that a discharge-side polarization having the magnitude corresponding to the discharge current value.

Therefore, when the battery carries out a constant load discharge with a discharge current value large enough to cancel the charge-side polarization arisen in the battery at least just before the discharge, not depending upon that the battery was in an equilibrium state before the start of the constant load discharge or that the polarized state at the discharge or charge side arisen in the former discharge is not quite completely canceled, the estimated voltage estimated from the voltage-current characteristic, which is calculated from the discharge current and the terminal voltage of the battery while the discharge current is decreasing from the discharge current value large enough to cancel the charge-side polarization arisen in the battery at least just before the discharge, is the same.

Then, not depending on whether or not the battery has been in an equilibrium state before the start of the constant load discharge with the discharge current value large enough to cancel the charge-side polarization arisen in the battery at least just before the discharge, the estimated voltage value estimated after the battery starts the constant load discharge is lower than an open circuit voltage corresponding to the terminal voltage of the battery in the equilibrium state thereof when the battery before the start of the constant load discharge has been supposed in an equilibrium state, by a residual voltage drop value in advance calculated as the residual voltage drop value due to the residual polarization at the end of the constant load discharge.

The magnitude of the polarization arisen in the battery during the discharge depends on the discharge current value and the discharge period of time required for the discharge current to reach the maximum value thereof.

Therefore, if the discharge period of time for the discharge current to reach the maximum value thereof after the start of the discharge is long, the voltage drop value of the terminal voltage arisen in the battery due to the polarization due to the discharge becomes larger than that when the discharge period of time is short even if the maximum value of the discharge current is the same. On the other hand, if the maximum value of the discharge current is large, the voltage drop value of the terminal voltage arisen in the battery due to the polarization due to the discharge becomes larger than that when the maximum value of the discharge current is small even if the discharge period of time is the same.

Further, the voltage drop value of the terminal voltage arisen in the battery due to the polarization due to the discharge increases with almost the same pace as that of the discharge current increasing while the discharge current increases, however when the discharge current once reaches the maximum value thereof and starts decreasing, the voltage drop value of the terminal voltage decreases with a pace slower than that of the discharge current decreasing, as a result, the greater part of the voltage drop value of the terminal voltage due to the polarization is not canceled for a while even after the discharge is finished and the discharge current becomes zero accordingly.

Summarizing the characteristics described above, when the voltage-current characteristic including the influence of the polarization, which shows the correlation between the terminal voltage and discharge current, is computed from the terminal voltage and discharge current measured during the discharge, the difference in the voltage drop value depending on the discharge current value and the discharge period of time significantly affects the characteristic during the increase of the discharge current and hardly affects the characteristic during the decrease of the discharge current.

Consequently, out of the voltage-current characteristic including the influence of the polarization, as for the characteristic during the increase of the discharge current, the characteristic itself changes depending on the discharge current value and the discharge period of time. On the other hand, as for the characteristic during the decrease of the discharge current, the characteristic itself hardly changes even when the discharge current value and the discharge period of time change, that is, only a parameter value indicating an intercept on a voltage coordinate in a general equation indicating the characteristic changes and only a terminal voltage value corresponding to a discharge current value changes.

Therefore, out of the voltage-current characteristic including the influence of the polarization of the battery, which is computed by measuring the discharge current and terminal voltage during the discharge, the characteristic itself during the decrease of the discharge current does not change if the discharge current value and the discharge period of time change.

Therefore, when the battery carries out a constant load discharge with a current value large enough to cancel a charge-side polarization arisen in the battery at least just before the discharge, the voltage-current characteristic including an influence of a polarization is calculated from the terminal voltage and the discharge current of the battery, which are periodically measured while the discharge current of the constant load discharge decreases from the maximum current value, and the voltage-current characteristic including the influence of the polarization is shifted in the direction of a voltage coordinate axis so that a voltage value at a reference current value lower than the maximum current value in the voltage-current characteristic including the influence of the polarization agrees with a reference voltage value at the reference current value in the voltage-current characteristic, which does not include the influence of the polarization but depends only on a pure resistance component of the battery. Thereby, the voltage-current characteristic including the influence of the polarization during the decrease of the discharge current is pumped up (raised up) in the direction of a voltage coordinate axis by a factor of a voltage drop value due to the polarization, the generated amount of which increases due to the increase of the discharge current, as a result, the variable component by the discharge current value and the discharge period of time of the voltage-current characteristic during the increase of the discharge current is removed from the voltage-current characteristic including the influence of the polarization during the decrease of the discharge current.

Therefore, a difference value between the estimated voltage value estimated on the basis of the voltage-current characteristic including the influence of the polarization after shifted in the direction of a voltage coordinate axis so that the voltage value at the reference current value in advance calculated as a residual voltage drop value, which is the residual voltage drop due to the residual polarization at the end of the discharge when the battery has carried out the constant load discharge agrees with the reference voltage value on the voltage-current characteristic not including the influence of the polarization and the open circuit voltage value that is a voltage value when the current is zero in the voltage-current characteristic not including the influence of the polarization does not include a variable component of the voltage-current characteristic due to the difference in the discharge current or in the discharge period of time.

In other words, the open circuit voltage value that is a voltage value when the current is zero in the voltage-current characteristic not including the influence of the polarization corresponds to the terminal voltage of the battery in an equilibrium state thereof when supposing that the battery has been in the equilibrium state before the start of the constant load discharge. Therefore, if the voltage-current characteristic including the influence of the polarization is shifted in the direction of a voltage coordinate axis so as to intersect at the reference value on the voltage-current characteristic not including the influence of the polarization, the estimated voltage estimated from the shifted voltage-current characteristic including the influence of the polarization is always lower than the open circuit voltage by the residual voltage drop value.

Preferably, after the residual voltage drop value is calculated, whenever the battery carries out a constant load discharge with a current value large enough to cancel a charge-side polarization arisen in the battery at least just before the discharge, the voltage-current characteristic not including the influence of the polarization is calculated when the voltage-current characteristic including the influence of the polarization is newly calculated from the terminal voltage and the discharge current of the battery periodically measured during the constant load discharge.

With the construction described above, when the voltage-current characteristic including the influence of the polarization is computed from the terminal voltage and discharge current of the battery periodically measured during the constant load discharge of the battery, the voltage-current characteristic not including the influence of the polarization is also computed from the terminal voltage and discharge current periodically measured, thereby it is used for computing the present open circuit voltage.

Preferably, whenever the battery becomes in an equilibrium state thereof, the terminal voltage value of the battery measured in the equilibrium state thereof is obtained as a present open circuit voltage value,

- a newest voltage-current characteristic not including the influence of the polarization is calculated from the terminal voltage and the discharge current of the battery, which are periodically measured when the battery carries out a constant load discharge with a current value large enough to cancel a charge-side polarization arisen in the battery at least just before the discharge starting from the equilibrium state,
- a newest voltage-current characteristic including the influence of the polarization is calculated from the terminal voltage and the discharge current of the battery periodically measured while a discharge current of the constant load discharge, which the battery carries out with a current value large enough to cancel a charge-side polarization arisen in the battery at least just before the discharge starting from the equilibrium state, is decreasing from a predetermined large current value,
- a newest residual voltage drop value is calculated on the basis of the obtained terminal voltage value and the newest voltage-current characteristic including the influence of the polarization, and
- thereafter, the present open circuit voltage is computed on the basis of the newest residual voltage drop value and the newest voltage-current characteristic not including the influence of the polarization.

With the construction described above, whenever the battery becomes in an equilibrium state the terminal voltage of the battery is measured and the measured value is obtained as a present open circuit voltage value. Thereafter, when the battery in the equilibrium state carries out the constant load discharge, a newest residual voltage drop value is computed on the basis of a newest voltage-current characteristic including the influence of the polarization computed from the periodically measured terminal voltage and discharge current of the battery and the terminal voltage of the battery in the equilibrium newly obtained as a present open circuit voltage value, thereby the residual voltage drop value to be used for computing the present open circuit voltage value is renewed to a newest value.

Further, when the battery in the equilibrium state carries out the constant load discharge with the current value large enough to cancel the charge-side polarization arisen in the battery at least just before the discharge, a newest voltage-current characteristic not including the influence of the polarization is computed from the terminal voltage and discharge current periodically measured, thereby the voltage-current characteristic not including the influence of the polarization, which is used for computing the residual voltage drop value and the present open circuit voltage, is renewed to a newest characteristic.

Preferably, the voltage-current characteristic including the influence of the polarization is expressed by an approximate curve equation.

With the construction described above, the low pace of the decrease in the voltage drop value of the terminal voltage, which is arisen in the battery due to the polarization by the discharge, is more correctly reflected in the voltage-current characteristic including the influence of the polarization, thereby the accuracy of the estimated voltage estimated on the basis of the voltage-current characteristic including the influence of the polarization and the accuracy of the open circuit voltage computed by using the estimated voltage become higher.

Preferably, the current value large enough to cancel a charge-side polarization arisen in the battery at least just before the discharge is set to be a predetermined large current value required to drive a maximum power consuming load independently out of the loads in the vehicle, which receive an electric power from the battery, and

- after the discharge current of the battery starts decreasing from the predetermined large current value, while the discharge current of the battery is lower than the predetermined large current value and is decreasing up to a target current value that is higher than a maximum discharge current value when the loads in the vehicle except the maximum power consuming load are driven, a voltage-current characteristic including an influence of a polarization for the battery in an equilibrium state thereof and the voltage-current characteristic including the influence of the polarization are calculated from the periodically measured terminal voltage and discharge current of the battery.

With the construction described above, the predetermined large current value required to drive the maximum power consuming load independently out of the loads in the vehicle exceeds each current value used for driving the other load even if a plurality of powers are simultaneously supplied to the other loads. Therefore, the predetermined large current value is set to be a current value large enough to cancel the charge-side polarization arisen in the battery at least just before the discharge, thereby when the discharge current reaches the predetermined large current value, a voltage drop exceeding the voltage drop due to the discharge-side polarization arisen by the former discharge is already arisen in the terminal voltage of the battery.

On the other hand, when the discharge current value of the battery decreases from the predetermined large current value and reaches to a target current value not less than a maximum discharge current value when the loads except the maximum power consuming load are driven, a voltage drop component due to the discharge-side polarization arisen by the power supply to the loads in the vehicle except the maximum power consuming load does not seemingly affect the voltage drop due to the discharge-side polarization remaining in the terminal voltage of the battery, but a remaining component except a component removed by that the discharge current decreases to the target current value out of the voltage drop due to the discharge-side polarization arisen by the discharge with the predetermined large current value seemingly affects the voltage drop due to the discharge-side polarization remaining in the terminal voltage of the battery.

Consequently, the voltage-current characteristic including the influence of the polarization is computed from the terminal voltage and the discharge current periodically measured while the discharge current of the battery, which has carried out the constant load discharge with the predetermined large current value, starts decreasing from the predetermined large current value and reaches the target current value. A present estimated voltage estimated on the basis of the voltage-current characteristic including the influence of the polarization purely reflects only the remaining component except the component canceled due to the decrease of the discharge current decreasing up to the target current value out of the voltage drop due to the discharge-side polarization arisen by the discharge with the predetermined large current value, even if the loads in the vehicle except the maximum power consuming load are still driven.

Preferably, whenever a present estimated voltage of the battery is estimated on the basis of the voltage-current characteristic including the influence of the polarization shifted in the direction of the voltage coordinate axis, the residual voltage drop value is revised in response to an inside or circumferential temperature of the battery upon the estimation and another inside or circumferential temperature of the battery when the voltage-current characteristic not including the influence of the polarization for the battery in the equilibrium state thereof is obtained, and the present open circuit voltage is computed from the revised residual voltage drop value.

With the construction described above, when the inside or circumferential temperature of the battery changes, the battery capacity changes and the terminal voltage of the battery also changes. Therefore, if the inside or circumferential temperature of the battery is different from each other between when the voltage-current characteristic not including the influence of the polarization to be used for computing the residual voltage drop value is obtained and when the present estimated voltage is estimated from the voltage-current characteristic including the influence of the polarization computed during the constant load discharge, a component of the terminal voltage reflected in the residual voltage drop value in response to the inside or circumferential temperature of the battery is different from a component of the terminal voltage reflected in the present estimated voltage in response to the inside or circumferential temperature of the battery.

However, if the residual voltage drop value is revised in response to the inside or circumferential temperature of the battery when the voltage-current characteristic not including the influence of the polarization is obtained and the inside or circumferential temperature of the battery when the present estimated voltage is estimated from the voltage-current characteristic including the influence of the polarization, which is computed during the constant load discharge, the component of the terminal voltage responding to the inside or circumferential temperature of the battery is reflected in the residual voltage drop value and in the estimated voltage under the same condition, therefore if the revised residual voltage drop value is used, the present open circuit voltage can be computed in a state that the variable component of the terminal voltage due to the difference of the inside or circumferential temperature of the battery is removed.

The present invention is also to provide a method for computing a battery capacity comprising the step of computing a present charging capacity of the battery from the present open circuit voltage computed by the method for computing an open circuit voltage of a battery as described above.

With the construction described above, the present open circuit voltage not including the dispersion due to the difference in the discharge current value or the discharge period of time caused by the voltage fluctuation due to the polarization is used, thereby a present charging capacity of the battery, which has a linear relationship with the open circuit voltage, can be computed without including the influence of the voltage fluctuation due to the polarization.

A method for computing the voltage-current characteristic not including the influence of the polarization of the battery or a method for computing the voltage-current characteristic not including the influence of the polarization of the battery in an equilibrium state thereof is not limited to a specific method. Some examples for such a method will be explained as follows.

As for a first method, on the basis of the terminal voltage and discharge current periodically measured when the battery carries out the constant load discharge with a current value large enough to cancel the charge-side polarization arisen at least just before the discharge, a first approximate curve equation of the voltage-current characteristic indicating a correlation between the terminal voltage and the discharge current of the battery during the increase of the discharge current and a second approximate curve equation of the voltage-current characteristic indicating a correlation between the terminal voltage and the discharge current of the battery during the decrease of the discharge current are computed. Then, a first point is defined on the voltage-current characteristic curve expressed by the first approximate curve equation while a second point is defined on the voltage-current characteristic curve expressed by the second approximate curve. Then, a first imaginary point having the same resistance value as a second combined resistance consisting of a pure resistance of the battery and a second polarization resistance component, which causes a second voltage drop when a second discharge current corresponding to the second point flows, is imaged on the voltage-current characteristic curve expressed by the first approximate curve equation, while a second imaginary point having the same resistance value as a first combined resistance consisting of a pure resistance of the battery and a first polarization resistance component, which causes a first voltage drop when a first discharge current corresponding to the first point flows, is imaged on the voltage-current characteristic curve expressed by the second approximate curve equation. Then, a first gradient of a straight line defined by connecting the second point and the first imaginary point is revised by a quantity corresponding to a voltage drop difference due to the second polarization resistance component arising from the second discharge current and a discharge current at the first imaginary point, thereby a first revised gradient excluding the contribution of the voltage drop due to the second polarization resistance component is computed, while a second gradient of a straight line defined by connecting the first point and the second imaginary point is revised by a quantity corresponding to a voltage drop difference due to the first polarization resistance component arising from the first discharge current and a discharge current at the second imaginary point, thereby a second revised gradient excluding the contribution of the voltage drop due to the first polarization resistance component is computed. Finally, an average gradient is computed by addition-averaging the first and second gradients, thereby the average gradient is computed as the pure resistance of the battery, that is, the voltage-current characteristic not including the influence of the polarization of the battery.

With the first method described above, the pure resistance of the battery can be computed only by processing data of the terminal voltage and discharge current of the battery periodically measured during the constant load discharge with the predetermined large current.

As for a second method, in addition to the first method described above, the first and second points may be set as an optional point in a range where the terminal voltage and the discharge current of the battery, which are measured in order to compute the first and second approximate curve equations, exist.

With the second method described above, at least one point for computing the gradient is based on real data, therefore a point significantly missing the real conditions is prevented from being used.

As for a third method, in addition to the first or second method described above, the first and second points may be set as a point corresponding to the maximum current value of the discharge current of the battery, which is measured in order to compute the first and second approximate curve equations, on the first and second approximate curve equations.

With the third method described above, at least one point for computing the gradient is based on real data, therefore a point significantly missing the real conditions is prevented from being used and in addition, since both points are common, an error is prevented from entering compared to a case, in which the different data are used.

As for a fourth method, in addition to the first, second or third method described above, when the first and second approximate curve equations are computed, the periodically measured terminal voltage and discharge current of the battery may be collected for the newest predetermined period of time and stored.

With the fourth method described above, by using the stored real data, the first and second approximate curve equations can be computed after confirming that the discharge current required to compute the first and second approximate curve equations has flowed.

As shown in FIG. 1, the present invention is also to provide an apparatus for estimating a terminal voltage of a battery executing the steps of: periodically measuring a terminal voltage and a discharge current of a battery 13 that supplies an electric power to loads in a vehicle; calculating a voltage-current characteristic expressing a correlation between the terminal voltage and the discharge current; and estimating an estimated voltage that is an estimated terminal voltage of the battery in a constant load discharging state thereof from the voltage-current characteristic, the apparatus comprising:

first computing means 23A for computing a voltage-current characteristic including an influence of a polarization from a terminal voltage and a discharge current of the battery 13 periodically measured after the discharge current of the battery 13 starts decreasing from a maximum current value, in a constant load discharge that the battery 13 carries out with a current value large enough to cancel a charge-side polarization arisen in the battery 13 at least just before the discharge, second computing means 23B for computing a voltage-current characteristic including an influence of a polarization shifted in the direction of a voltage coordinate axis so that a voltage value at a reference current value lower than the maximum current value in the voltage-current characteristic including the influence of the polarization computed by the first computing means 23A agrees with a reference voltage value at the reference current value in the voltage-current characteristic, which does not include the influence of the polarization but depends only on a pure resistance component of the battery 13, when the first computing means 23A computes the voltage-current characteristic including the influence of the polarization, and estimating means 23C for estimating a voltage value corresponding to a predetermined imaginary current value in the voltage-current characteristic including the influence of the polarization shifted in the direction of a voltage coordinate axis computed by the second computing means 23B is estimated as a present value of the estimated voltage of the battery 13.

With the construction described above, as shown in FIG. 1, once the discharge current of the constant load discharge reaches the current value large enough to cancel the charge-side polarization arisen in the battery 13 at least just before the discharge, even if the voltage drop or rise due to the polarization at the charge or discharge side arisen in the former discharge remains before the start of the discharge, the system is in a state that the polarization of the discharge side corresponding to a discharge current value, which exceeds the residual voltage drop, arises or in a state that the polarization of the discharge side, the magnitude of which corresponds to the discharge current value, newly arises after the residual voltage rise is canceled.

On the other hand, even if the battery 13 in an equilibrium state carries out a constant load discharge with a discharge current value large enough to cancel the charge-side polarization arisen in the battery at least just before the discharge, when the discharge current reaches the discharge current value, the polarization arises, the magnitude of which corresponds to the discharge current value.

Therefore, when the battery 13 carries out a constant load discharge with a discharge current value large enough to cancel the charge-side polarization arisen in the battery 13 at least just before the discharge, not depending upon that the battery 13 was in an equilibrium state before the start of the constant load discharge or that the polarized state at the discharge or charge side arisen in the former discharge is not quite completely canceled, the estimated voltage estimated from the voltage-current characteristic, which is calculated from the discharge current and the terminal voltage of the battery 13 while the discharge current is decreasing from the discharge current value large enough to cancel the charge-side polarization arisen in the battery 13 at least just before the discharge, is the same.

The magnitude of the polarization arisen in the battery 13 during the discharge depends on the discharge current value and the discharge period of time required for the discharge current to reach the maximum value thereof.

Therefore, if the discharge period of time for the discharge current to reach the maximum value thereof after the start of the discharge is long, the voltage drop value of the terminal voltage arisen in the battery 13 due to the polarization due to the discharge becomes larger than that when the discharge period of time is short even if the maximum value of the discharge current is the same. On the other hand, if the maximum value of the discharge current is large, the voltage drop value of the terminal voltage arisen in the battery 13 due to the polarization due to the discharge becomes larger than that when the maximum value of the discharge current is small even if the discharge period of time is the same.

Further, the voltage drop value of the terminal voltage arisen in the battery 13 due to the polarization due to the discharge increases with almost the same pace as that of the discharge current increasing while the discharge current increases, however when the discharge current once reaches the maximum value thereof and starts decreasing, the voltage drop value of the terminal voltage decreases with a pace slower than that of the discharge current decreasing, as a result, the greater part of the voltage drop value of the terminal voltage due to the polarization is not canceled for a while even after the discharge is finished and the discharge current becomes zero accordingly.

Summarizing the characteristics described above, when the voltage-current characteristic including the influence of the polarization, which shows the correlation between the terminal voltage and discharge current, is computed from the terminal voltage and discharge current measured during the discharge, the difference in the voltage drop value depending on the discharge current value and the discharge period of time significantly affects the characteristic during the increase of the discharge current and hardly affects the characteristic during the decrease of the discharge current.

Consequently, out of the voltage-current characteristic including the influence of the polarization, as for the characteristic during the increase of the discharge current, the characteristic itself changes depending on the discharge current value and the discharge period of time. On the other hand, as for the characteristic during the decrease of the discharge current, the characteristic itself hardly changes even when the discharge current value and the discharge period of time change, that is, only a parameter value indicating an intercept on a voltage coordinate in a general equation indicating the characteristic changes and only a terminal voltage value corresponding to a discharge current value changes.

Therefore, after detecting means A for detecting the start of the decrease of the discharge current detects that the discharge current of the battery 13 starts decreasing from the predetermined large current value, as for the voltage-current characteristic including the influence of the polarization, which is computed by the first computing means 23A from the periodically measured terminal voltage and discharge current of the battery 13, the characteristic equation thereof itself does not change even if the discharge current value or the discharge period of time changes.

Therefore, if the second computing means 23B shifts the voltage-current characteristic including the influence of the polarization computed by the first computing means 23A in the direction of a voltage coordinate axis so that a voltage value at a reference current value lower than the maximum current value in the voltage-current characteristic including the influence of the polarization computed by the first computing means 23A agrees with a reference voltage value at the reference current value in the voltage-current characteristic, which does not include the influence of the polarization but depends only on a pure resistance component of the battery 13, when the first computing means 23A computes the voltage-current characteristic including the influence of the polarization, the voltage-current characteristic including the influence of the polarization during the decrease of the discharge current is pumped up (raised up) in the direction of a voltage coordinate axis by a factor of a voltage drop value due to the polarization, the generated amount of which increases due to the increase of the discharge current, as a result, the variable component by the discharge current value and the discharge period of time of the voltage-current characteristic during the increase of the discharge current is removed from the voltage-current characteristic including the influence of the polarization during the decrease of the discharge current.

Preferably, the first computing means 23A computes the voltage-current characteristic including the influence of the polarization as an approximate curve equation.

With the construction described above, the low pace of the decrease in the voltage drop value of the terminal voltage, which is arisen in the battery 13 due to the polarization by the discharge, is more correctly reflected in the voltage-current characteristic including the influence of the polarization computed by the first computing means 23A, thereby the accuracy of the estimated voltage estimated by the estimating means 23C on the basis of the voltage-current characteristic including the influence of the polarization becomes higher.

Preferably, the current value large enough to cancel a charge-side polarization arisen in the battery 13 at least just before the discharge is a predetermined large current value required to drive a maximum power consuming load 5 independently out of the loads in the vehicle, which receive an electric power from the battery 13, and after the discharge current of the battery 13 starts decreasing from the predetermined large current value, while the discharge current of the battery 13 is decreasing up to a target current value that is higher than a maximum discharge current value when the loads in the vehicle except the maximum power consuming load 5 are driven, the first computing means 23A computes the voltage-current characteristic including the influence of the polarization from the periodically measured terminal voltage and discharge current of the battery 13.

With the construction described above, the predetermined large current value required to drive the maximum power consuming load independently out of the loads in the vehicle exceeds each current value used for driving the other load even if a plurality of powers are simultaneously supplied to the other loads. Therefore, the predetermined large current value is set to be a current value large enough to cancel the charge-side polarization arisen in the battery 13 at least just before the discharge, thereby when the discharge current reaches the predetermined large current value, a voltage drop exceeding the voltage drop due to the discharge-side polarization arisen by the former discharge is already arisen in the terminal voltage of the battery 13.

On the other hand, when the discharge current value of the battery 13 decreases from the predetermined large current value and reaches to a target current value not less than a maximum discharge current value when the loads except the maximum power consuming load are driven, a voltage drop component due to the discharge-side polarization arisen by the power supply to the loads in the vehicle except the maximum power consuming load does not seemingly affect the voltage drop due to the discharge-side polarization remaining in the terminal voltage of the battery 13, but a remaining component except a component removed by that the discharge current decreases to the target current value out of the voltage drop due to the discharge-side polarization arisen by the discharge with the predetermined large current value seemingly affects the voltage drop due to the discharge-side polarization remaining in the terminal voltage of the battery 13.

Consequently, the voltage-current characteristic including the influence of the polarization is computed by the first computing means 23A from the terminal voltage and the discharge current periodically measured while the discharge current of the battery 13, which has carried out the constant load discharge with the predetermined large current value, starts decreasing from the predetermined large current value and reaches the target current value. A present estimated voltage estimated by the estimating means 23C on the basis of the voltage-current characteristic including the influence of the polarization purely reflects only the remaining component except the component canceled due to the decrease of the discharge current decreasing up to the target current value out of the voltage drop due to the discharge-side polarization arisen by the discharge with the predetermined large current value, even if the loads in the vehicle except the maximum power consuming load are still driven.

The present invention is also to provide an apparatus for computing an open circuit voltage of a battery 13 executing the steps of: periodically measuring a terminal voltage and a discharge current of a battery 13 that supplies an electric power to loads in a vehicle; calculating a voltage-current characteristic expressing a correlation between the terminal voltage and the discharge current; estimating an estimated voltage that is an estimated terminal voltage of the battery 13 in a constant load discharging state thereof from the voltage-current characteristic; and computing an open circuit voltage of the battery 13 corresponding to a terminal voltage of the battery 13 in an equilibrium state thereof on the basis of the estimated voltage, the apparatus comprising:

storing means 27 for storing a residual voltage drop value due to a residual polarization upon a completion of the discharge when the battery 13 carries out a constant load discharge with a current value large enough to cancel a charge-side polarization arisen in the battery 13 at least just before the discharge;

first computing means 23A for computing the voltage-current characteristic including an influence of a polarization from the periodically measured terminal voltage and discharge current of the battery 13 after the discharge current of the battery starts decreasing from a maximum current value, during the constant load discharge that the battery 13 carries out with a current value large enough to cancel a charge-side polarization arisen in the battery 13 at least just before the discharge;

second computing means 23B for computing a voltage-current characteristic including the influence of the polarization shifted in the direction of a voltage coordinate axis so that a voltage value at a reference current value lower than the maximum current value in the voltage-current characteristic including the influence of the polarization, which is computed by the first computing means 23A, agrees with a reference voltage value at the reference current value in the voltage-current characteristic, which does not include the influence of the polarization but depends only on a pure resistance component of the battery, when the first computing means 23A computes the voltage-current characteristic including the influence of the polarization; and estimating means 23C for estimating a present estimated voltage of the battery 13 on the basis of the voltage-current characteristic including the influence of the polarization shifted in the direction of a voltage coordinate axis computed by the second computing means 23B, wherein the storing means 27 in advance stores a difference value between a value of the estimated voltage in advance estimated on the basis of an in advance computed voltage-current characteristic including the influence of the polarization sifted in the direction of a voltage coordinate axis, which is obtained by shifting the in advance computed voltage-current characteristic including the influence of the polarization in the direction of the voltage coordinate axis, so that a voltage value at the reference current value in the in advance computed voltage-current characteristic including the influence of the polarization agrees with the reference voltage value in the in advance computed voltage-current characteristic not including the influence of the polarization and a value of the open circuit voltage at the current being zero in the in advance computed voltage-current characteristic not including the influence of the polarization, and a present open circuit voltage is computed by adding the residual voltage drop value in advance stored by the storing means to the present estimated voltage value estimated by the estimating means.

With the construction described above, when the discharge current of the constant load discharge of the battery 13 reaches a current value large enough to cancel the charge-side polarization arisen in the battery 13 at least just before the discharge, even if a voltage drop or voltage rise due to the polarization of the discharge-side or the charge-side arisen in the former discharge remains before the discharge starts, the battery 13 becomes in a state that a discharge-side polarization having the magnitude corresponding to the discharge current value arises or in a state that a discharge-side polarization having the magnitude corresponding to the discharge current value newly arises after canceling the residual voltage rise.

On the other hand, even if the battery 13 has carried out the constant load discharge with a current value large enough to cancel the charge-side polarization arisen in the battery 13 at least just before the discharge, when the current value reaches the discharge current value, the battery 13 becomes in a state that a discharge-side polarization having the magnitude corresponding to the discharge current value.

Therefore, when the battery 13 carries out a constant load discharge with a discharge current value large enough to cancel the charge-side polarization arisen in the battery 13 at least just before the discharge, not depending upon that the battery 13 was in an equilibrium state before the start of the constant load discharge or that the polarized state at the discharge or charge side arisen in the former discharge is not quite completely canceled, the estimated voltage estimated from the voltage-current characteristic, which is calculated from the discharge current and the terminal voltage of the battery 13 while the discharge current is decreasing from the discharge current value large enough to cancel the charge-side polarization arisen in the battery at least just before the discharge, is the same.

Then, not depending on whether or not the battery 13 has been in an equilibrium state before the start of the constant load discharge with the discharge current value large enough to cancel the charge-side polarization arisen in the battery 13 at least just before the discharge, the estimated voltage value estimated after the battery 13 starts the constant load discharge is lower than an open circuit voltage corresponding to the terminal voltage of the battery 13 in the equilibrium state thereof when the battery 13 before the start of the constant load discharge has been supposed in an equilibrium state, by a residual voltage drop value in advance calculated and stored by the storing means 27 as the residual voltage drop value due to the residual polarization at the end of the constant load discharge.

The magnitude of the polarization arisen in the battery 13 during the discharge depends on the discharge current value and the discharge period of time required for the discharge current to reach the maximum value thereof.

Therefore, if the discharge period of time for the discharge current to reach the maximum value thereof after the start of the discharge is long, the voltage drop value of the terminal voltage arisen in the battery 13 due to the polarization due to the discharge becomes larger than that when the discharge period of time is short even if the maximum value of the discharge current is the same. On the other hand, if the maximum value of the discharge current is large, the voltage drop value of the terminal voltage arisen in the battery 13 due to the polarization due to the discharge becomes larger than that when the maximum value of the discharge current is small even if the discharge period of time is the same.

Further, the voltage drop value of the terminal voltage arisen in the battery 13 due to the polarization due to the discharge increases with almost the same pace as that of the discharge current increasing while the discharge current increases, however when the discharge current once reaches the maximum value thereof and starts decreasing, the voltage drop value of the terminal voltage decreases with a pace slower than that of the discharge current decreasing, as a result, the greater part of the voltage drop value of the terminal voltage due to the polarization is not canceled for a while even after the discharge is finished and the discharge current becomes zero accordingly.

Summarizing the characteristics described above, when the voltage-current characteristic including the influence of the polarization, which shows the correlation between the terminal voltage and discharge current, is computed from the terminal voltage and discharge current measured during the discharge, the difference in the voltage drop value depending on the discharge current value and the discharge period of time significantly affects the characteristic during the increase of the discharge current and hardly affects the characteristic during the decrease of the discharge current.

Consequently, out of the voltage-current characteristic including the influence of the polarization, as for the characteristic during the increase of the discharge current, the characteristic itself changes depending on the discharge current value and the discharge period of time. On the other hand, as for the characteristic during the decrease of the discharge current, the characteristic itself hardly changes even when the discharge current value and the discharge period of time change, that is, only a parameter value indicating an intercept on a voltage coordinate in a general equation indicating the characteristic changes and only a terminal voltage value corresponding to a discharge current value changes.

Therefore, after detecting means A for detecting the start of the decrease of the discharge current detects that the discharge current of the battery 13 starts decreasing from the predetermined large current value, as for the voltage-current characteristic including the influence of the polarization, which is computed by the first computing means 23A from the periodically measured terminal voltage and discharge current of the battery 13, the characteristic equation thereof itself does not change even if the discharge current value or the discharge period of time changes.

Therefore, if the second computing means 23B shifts the voltage-current characteristic including the influence of the polarization computed by the first computing means 23A in the direction of a voltage coordinate axis so that a voltage value at a reference current value lower than the maximum current value in the voltage-current characteristic including the influence of the polarization computed by the first computing means 23A agrees with a reference voltage value at the reference current value in the voltage-current characteristic, which does not include the influence of the polarization but depends only on a pure resistance component of the battery 13, when the first computing means 23A computes the voltage-current characteristic including the influence of the polarization, the voltage-current characteristic including the influence of the polarization during the decrease of the discharge current is pumped up (raised up) in the direction of a voltage coordinate axis by a factor of a voltage drop value due to the polarization, the generated amount of which increases due to the increase of the discharge current, as a result, the variable component by the discharge current value and the discharge period of time of the voltage-current characteristic during the increase of the discharge current is removed from the voltage-current characteristic including the influence of the polarization during the decrease of the discharge current.

Therefore, a difference value between
- the estimated voltage value for the battery 13 that has been in an equilibrium estimated from the shifted voltage-current characteristic including the influence of the polarization for the battery 13 that has been in an equilibrium, which is stored by the storing means 27 as the residual voltage drop value that is the residual voltage drop quantity due to the residual polarization at the end of the discharge when the battery 13 has carried out the constant load discharge with a current value large enough to cancel the charge-side polarization arisen in the battery 13 at least just before the discharge and
- the open circuit voltage value that is a voltage value when the current is zero in the voltage-current characteristic not including the influence of the polarization for the battery 13 in an equilibrium thereof does not include a variable component of the voltage-current characteristic due to the difference in the discharge current or in the discharge period of time.

In other words, the open circuit voltage value that is a voltage value when the current is zero in the voltage-current characteristic not including the influence of the polarization corresponds to the terminal voltage of the battery 13 in an equilibrium state thereof when supposing that the battery 13 has been in the equilibrium state before the start of the constant load discharge. Therefore, if the voltage-current characteristic including the influence of the polarization is shifted in the direction of a voltage coordinate axis so as to intersect at the reference value on the voltage-current characteristic not including the influence of the polarization, the estimated voltage estimated from the shifted voltage-current characteristic including the influence of the polarization is always lower than the open circuit voltage by the residual voltage drop value.

Preferably, the apparatus for computing an open circuit voltage of a battery further comprises third computing means 23D for computing the voltage-current characteristic not including the influence of the polarization from the periodically measured terminal voltage and discharge current of the battery 13, which carries out a constant load discharge with a current value large enough to cancel a charge-side polarization arisen in the battery 13 at least just before the discharge, wherein the second computing means 23B computes the voltage-current characteristic including the influence of the polarization shifted in the direction of a voltage coordinate axis on the basis of the voltage-current characteristic including the influence of the polarization computed by the first computing means 23A and the voltage-current characteristic not including the influence of the polarization computed by the third computing means 23D.

With the construction described above, after the discharge current of the battery 13 starts decreasing from the current value large enough to cancel the charge-side polarization arisen in the battery 13 at least just before the discharge, when the first computing means 23A computes the voltage-current characteristic including the influence of the polarization from the periodically measured terminal voltage and discharge current of the battery 13, the third computing means 23D computes the voltage-current characteristic not including the influence of the polarization at that time from the terminal voltage and discharge current of the battery 13 periodically measured while the battery 13 carries out the constant load discharge with the current value large enough to cancel the charge-side polarization arisen in the battery 13 at least just before the discharge. Then, the second computing means 23B computes the shifted voltage-current characteristic including the influence of the polarization on the basis of the voltage-current characteristic not including the influence of the polarization computed by the third computing means 23D and the voltage-current characteristic including the influence of the polarization computed by the first computing means 23A.

Preferably, the apparatus for computing an open circuit voltage of a battery further comprises:

judging means 23E for judging whether or not the battery 13 is in an equilibrium state thereof, measuring means A for measuring a terminal voltage of the battery 13 when the battery 13 is judged to be in an equilibrium state thereof by the judging means 23E;

calculating means 23F for calculating the newest residual voltage drop value by subtracting the present estimated voltage value estimated by the estimating means 23C on the basis of the terminal voltage and discharge current of the battery 13, which is judged in an equilibrium state thereof by the judging means 23E, periodically measured while the battery 13 carries out the constant load discharge with a current value large enough to cancel a charge-side polarization arisen in the battery 13 at least just before the discharge from a terminal voltage value of the battery 13 most newly measured by the measuring means A;

renewing means 23G for renewing the residual voltage drop value stored by the storing means 27 to the newest residual voltage drop value calculated by the calculating means 23F; and fourth computing means 23H for computing a newest voltage-current characteristic not including the influence of the polarization on the basis of the terminal voltage and discharge current of the battery 13, which is judged in an equilibrium state thereof by the judging means 23E, periodically measured while the battery 13 carries out the constant load discharge with a current value large enough to cancel a charge-side polarization arisen in the battery 13 at least just before the discharge.

With the construction described above, whenever the judging means 23E judges that the battery 13 is in an equilibrium state, the terminal voltage of the battery 13 is measured by means A for measuring the terminal voltage in the equilibrium state of the battery. Thereafter, the present estimated voltage value estimated by the estimating means from the periodically measured terminal voltage and discharge current is subtracted from the terminal voltage value of the battery 13 in the equilibrium state thereof, which is most newly measured by means A for measuring the terminal voltage in the equilibrium state of the battery, thereby the calculating means 23F calculates the newest residual voltage drop value, then the renewing means 23G renews the residual voltage drop value stored by the storing means 27 to the newest residual voltage drop value calculated by the calculating means 23F.

Further, when the battery, which is judged in the equilibrium state by the judging means 23E, carries out the constant load discharge with the current value large enough to cancel the charge-side polarization arisen in the battery 13 at least just before the discharge, a newest voltage-current characteristic not including the influence of the polarization is computed by the fourth computing means 23H from the terminal voltage and discharge current periodically measured, thereby the voltage-current characteristic not including the influence of the polarization, which is used for computing the residual voltage drop value and the present open circuit voltage, is renewed to a newest characteristic, similarly to the residual voltage drop value renewed to the newest value thereof by the renewing means 23G.

Preferably, the apparatus for computing an open circuit voltage of a battery 13 further comprises:

detecting means 19 for detecting an inside or circumferential temperature of the battery 13; and revising means 23J for revising the residual voltage drop value stored by the storing means 27 in response to an inside or circumferential temperature of the battery 13 detected by the detecting means 19 when the estimating means 23C estimates the present estimated voltage and another inside or circumferential temperature of the battery 13 detected by the detecting means 19 when the renewing means 23G renews the residual voltage drop value stored by the storing means 27 to the newest residual voltage drop value calculated by the calculating means 23F, wherein the present open circuit voltage is computed by adding the residual voltage drop value revised by the revising means 23J to the estimated voltage value estimated by the estimating means 23C.

With the construction described above, since when the inside or circumferential temperature of the battery 13 changes the battery capacity changes and terminal voltage also changes, therefore if the inside or circumferential temperature of the battery 13 detected by the detecting means 19 is different from each other between when the renewing means 23G renews the residual voltage drop value stored by the storing means 27 to the newest residual voltage drop value and when the estimating means 23C estimates the present estimated voltage of the battery 13, a terminal voltage component reflected in the residual voltage drop value in response to the inside or circumferential temperature of the battery 13 is different from a terminal voltage component reflected in the estimated voltage in response to the inside or circumferential temperature of the battery 13.

However, if the revising means 23J revises the residual voltage drop value stored by the storing means 27 in response to the inside or circumferential temperature of the battery 13 when the residual voltage drop value is renewed to the newest residual voltage drop value and the inside or circumferential temperature of the battery 13 when the present estimated voltage of the battery 13 is estimated, since the terminal voltage component corresponding to the inside or circumferential temperature of the battery 13 is reflected in the residual voltage drop value and the estimated voltage under the same condition, the present open circuit voltage can be computed in a condition that the variable component of the terminal voltage due to the difference of the inside or circumferential temperature of the battery 13 is removed by using the revised residual voltage drop value.

Preferably, the first computing means 23A computes the voltage-current characteristic including the influence of the polarization as an approximate curve equation.

With the construction described above, the low pace of the decrease in the voltage drop value of the terminal voltage, which is arisen in the battery 13 due to the polarization by the discharge, is more correctly reflected in the voltage-current characteristic including the influence of the polarization computed by the first computing means 23A, thereby the accuracy of the estimated voltage estimated by the estimating means 23C on the basis of the voltage-current characteristic including the influence of the polarization and the accuracy of the open circuit voltage computed by using the estimated voltage become higher.

Preferably, the current value large enough to cancel a charge-side polarization arisen in the battery 13 at least just before the discharge is a predetermined large current value required to drive a maximum power consuming load 5 independently out of the loads in the vehicle, which receive an electric power from the battery 13, and after the discharge current of the battery 13 starts decreasing from the predetermined large current value, while the discharge current of the battery 13 is decreasing up to a target current value that is higher than a maximum discharge current value when the loads in the vehicle except the maximum power consuming load 5 are driven, the first computing means 23A computes the voltage-current characteristic including the influence of the polarization from the periodically measured terminal voltage and discharge current of the battery 13.

With the construction described above, the predetermined large current value required to drive the maximum power consuming load independently out of the loads in the vehicle exceeds each current value used for driving the other load even if a plurality of powers are simultaneously supplied to the other loads. Therefore, the predetermined large current value is set to be a current value large enough to cancel the charge-side polarization arisen in the battery 13 at least just before the discharge, thereby when the discharge current reaches the predetermined large current value, a voltage drop exceeding the voltage drop due to the discharge-side polarization arisen by the former discharge is already arisen in the terminal voltage of the battery 13.

On the other hand, when the discharge current value of the battery 13 decreases from the predetermined large current value and reaches to a target current value not less than a maximum discharge current value when the loads except the maximum power consuming load 5 are driven, a voltage drop component due to the discharge-side polarization arisen by the power supply to the loads in the vehicle except the maximum power consuming load 5 does not seemingly affect the voltage drop due to the discharge-side polarization remaining in the terminal voltage of the battery 13, but a remaining component except a component removed by that the discharge current decreases to the target current value out of the voltage drop due to the discharge-side polarization arisen by the discharge with the predetermined large current value seemingly affects the voltage drop due to the discharge-side polarization remaining in the terminal voltage of the battery 13.

Consequently, the voltage-current characteristic including the influence of the polarization is computed by the first computing means 23A from the terminal voltage and the discharge current periodically measured while the discharge current of the battery 13, which has carried out the constant load discharge with the predetermined large current value, starts decreasing from the predetermined large current value and reaches the target current value. A present estimated voltage estimated by the estimating means 23C on the basis of the voltage-current characteristic including the influence of the polarization purely reflects only the remaining component except the component canceled due to the decrease of the discharge current decreasing up to the target current value out of the voltage drop due to the discharge-side polarization arisen by the discharge with the predetermined large current value, even if the loads in the vehicle except the maximum power consuming load 5 are still driven.

The present invention is also to provide an apparatus for computing a battery 13 capacity comprising the apparatus for computing an open circuit voltage of a battery 13 as described above, wherein a present charging capacity of the battery 13 is computed from the present open circuit voltage computed by the apparatus for computing an open circuit voltage of a battery 13.

With the construction described above, the present open circuit voltage not including the dispersion due to the difference in the discharge current value or the discharge period of time caused by the voltage fluctuation due to the polarization is used, thereby a present charging capacity of the battery 13, which has a linear relationship with the open circuit voltage, can be computed without including the influence of the voltage fluctuation due to the polarization.

An apparatus for computing the voltage-current characteristic not including the influence of the polarization of the battery or an apparatus for computing the voltage-current characteristic not including the influence of the polarization of the battery in an equilibrium state thereof is not limited to a specific apparatus. Some examples for such an apparatus will be explained as follows.

As for a first apparatus, as shown in FIG. 2, on the basis of the terminal voltage and discharge current periodically measured when the battery 13 carries out the constant load discharge with a current value large enough to cancel the charge-side polarization arisen at least just before the discharge, a first approximate curve equation of the voltage-current characteristic indicating a correlation between the terminal voltage and the discharge current of the battery 13 during the increase of the discharge current and a second approximate curve equation of the voltage-current characteristic indicating a correlation between the terminal voltage and the discharge current of the battery 13 during the decrease of the discharge current are computed by means 23K for calculating the approximate curve equation. Then, a first point is defined on the voltage-current characteristic curve expressed by the first approximate curve equation while a second point is defined on the voltage-current characteristic curve expressed by the second approximate curve. Then, a first imaginary point having the same resistance value as a second combined resistance consisting of a pure resistance of the battery 13 and a second polarization resistance component, which causes a second voltage drop when a second discharge current corresponding to the second point flows, is imaged on the voltage-current characteristic curve expressed by the first approximate curve equation, while a second imaginary point having the same resistance value as a first combined resistance consisting of a pure resistance of the battery 13 and a first polarization resistance component, which causes a first voltage drop when a first discharge current corresponding to the first point flows, is imaged on the voltage-current characteristic curve expressed by the second approximate curve equation. Then, a first gradient of a straight line defined by connecting the second point and the first imaginary point is revised by a quantity corresponding to a voltage drop difference due to the second polarization resistance component arising from the second discharge current and a discharge current at the first imaginary point, thereby a first revised gradient excluding the contribution of the voltage drop due to the second polarization resistance component is computed, while a second gradient of a straight line defined by connecting the first point and the second imaginary point is revised by a quantity corresponding to a voltage drop difference due to the first polarization resistance component arising from the first discharge current and a discharge current at the second imaginary point, thereby a second revised gradient excluding the contribution of the voltage drop due to the first polarization resistance component is computed. Finally, an average gradient is computed by means 23L for computing by addition-averaging the first and second gradients, thereby the average gradient computed by the means 23L for computing is computed as the pure resistance of the battery 13, that is, the voltage-current characteristic not including the influence of the polarization of the battery 13.

With the first apparatus described above, the pure resistance of the battery 13 can be computed only by processing data, obtained by the means 23K for calculating the approximate curve equation, of the terminal voltage and discharge current of the battery 13 periodically measured during the constant load discharge with the predetermined large current.

As for a second apparatus, in addition to the construction of the first apparatus described above, a construction may be employed, in which the first and second points are set as an optional point in a range where the terminal voltage and the discharge current of the battery, which are measured in order to compute the first and second approximate curve equations, exist.

With the second apparatus described above, at least one point for computing the gradient is based on real data, therefore a point significantly missing the real conditions is prevented from being used.

As for a third apparatus, in addition to the construction of the first or second apparatus described above, a construction may be employed, in which the first and second points are set as a point corresponding to the maximum current value of the discharge current of the battery, which is measured in order to compute the first and second approximate curve equations, on the first and second approximate curve equations.

With the third apparatus described above, at least one point for computing the gradient is based on real data, therefore a point significantly missing the real conditions is prevented from being used and in addition, since both points are common, an error is prevented from entering compared to a case, in which the different data are used.

As for a fourth apparatus, in addition to the construction of the first, second or third apparatus described above, a construction may be employed, in which when the first and second approximate curve equations are computed, the periodically measured terminal voltage and discharge current of the battery may be collected for the newest predetermined period of time and stored.

With the fourth apparatus described above, by using the stored real data, the first and second approximate curve equations can be computed after confirming that the discharge current required to compute the first and second approximate curve equations has flowed.

DESCRIPTION OF THE PREFERRED EMBODIMENTS

In the following, a characteristic of a battery itself will be explained and then, the preferred embodiments of the present invention will be explained with reference to the attached drawings.

Figure 3:
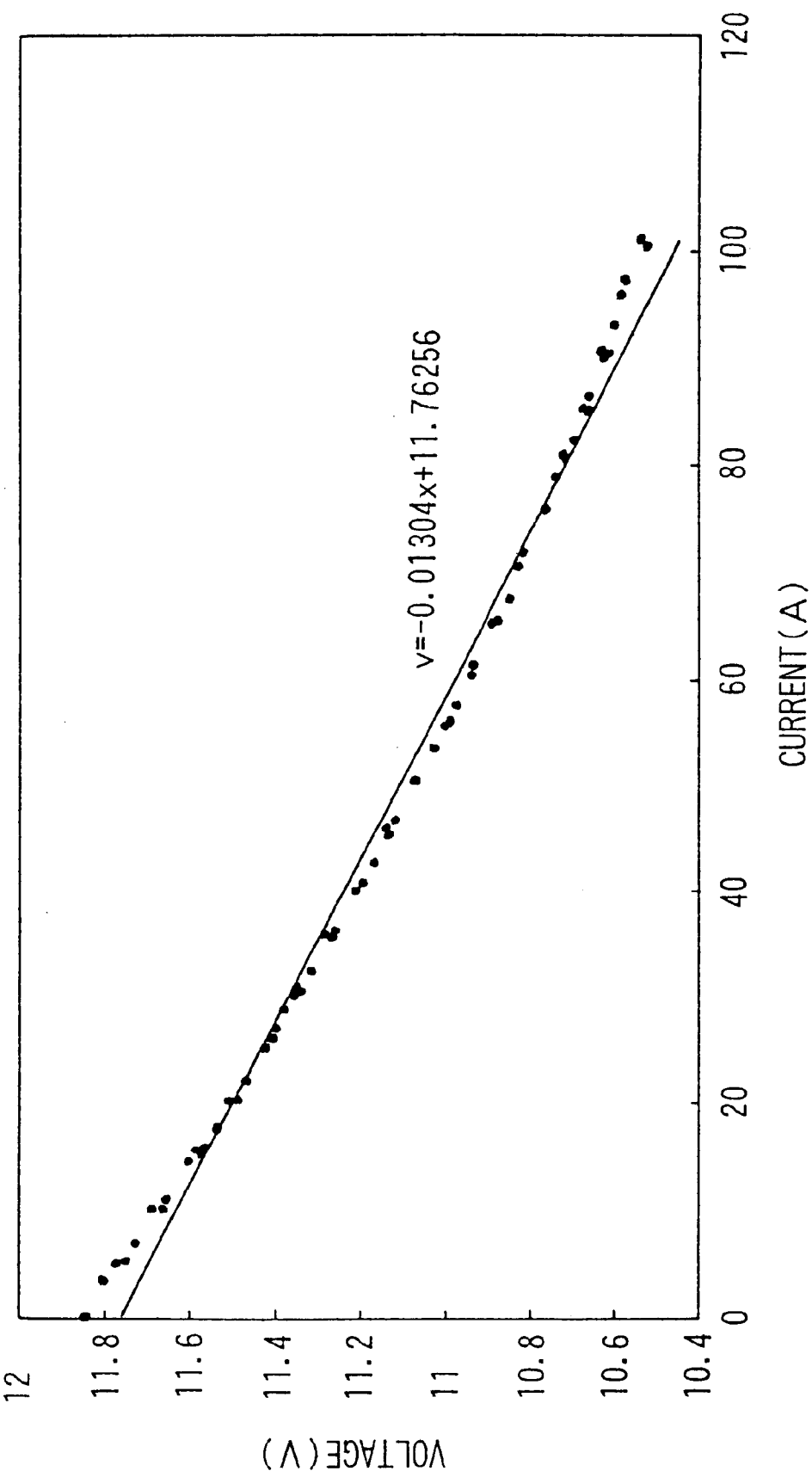
FIG. 3 is a graph illustrating an example of a voltage-current characteristic of a battery, which is expressed by a linear approximate equation.
Figure 4:
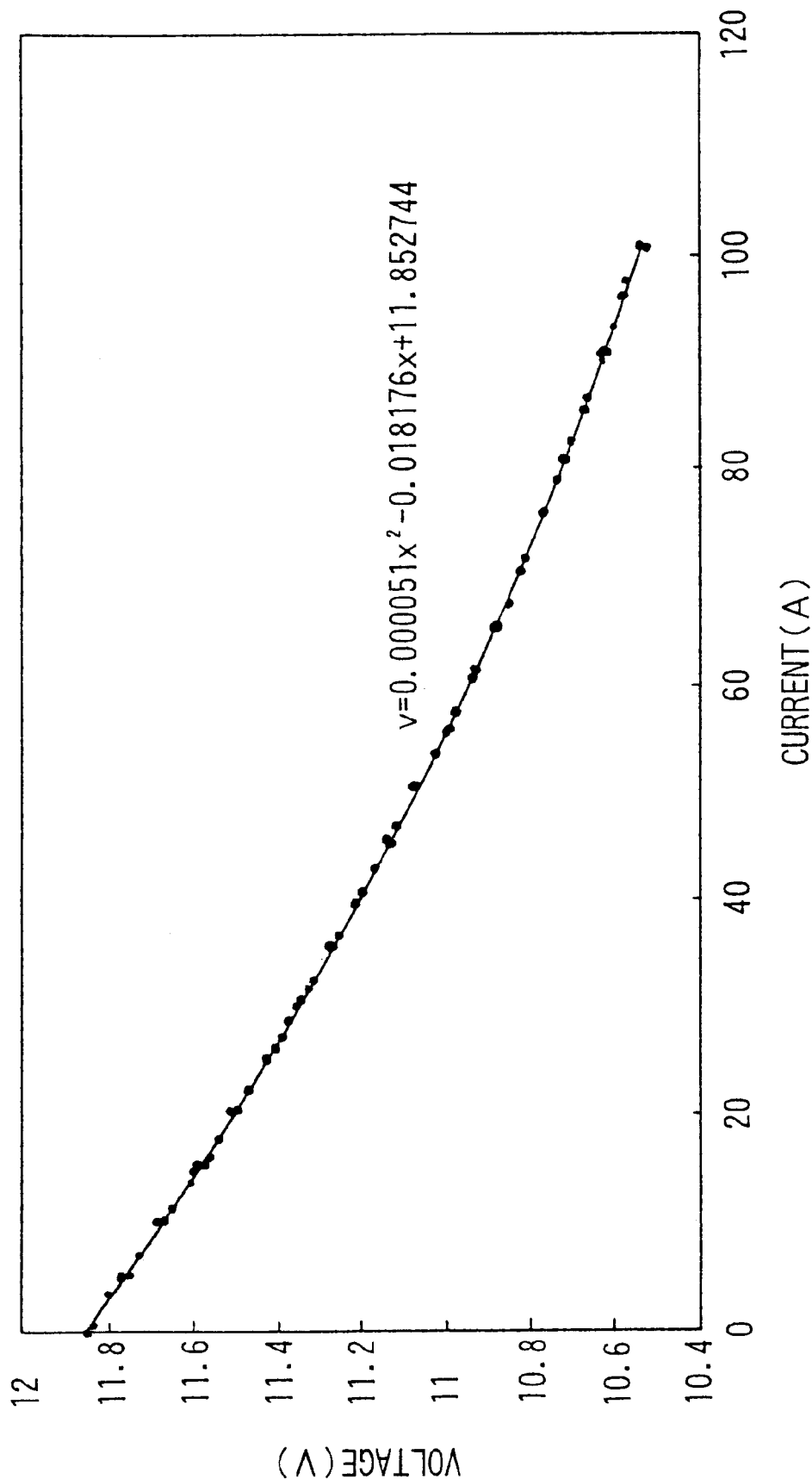
FIG. 4 is a graph illustrating an example of a voltage-current characteristic of a battery, which is expressed by a quadratic approximate equation.

A load requiring a large current such as a starter motor, motor generator and motor for traveling is mounted on a 12V-vehicle, 42V-vehicle, EV vehicle and HEV vehicle. FIGS. 3 and 4 show an example of a voltage-current characteristic (V-I characteristic) of a battery, which supplies an electric power to these loads.

Figure 5:
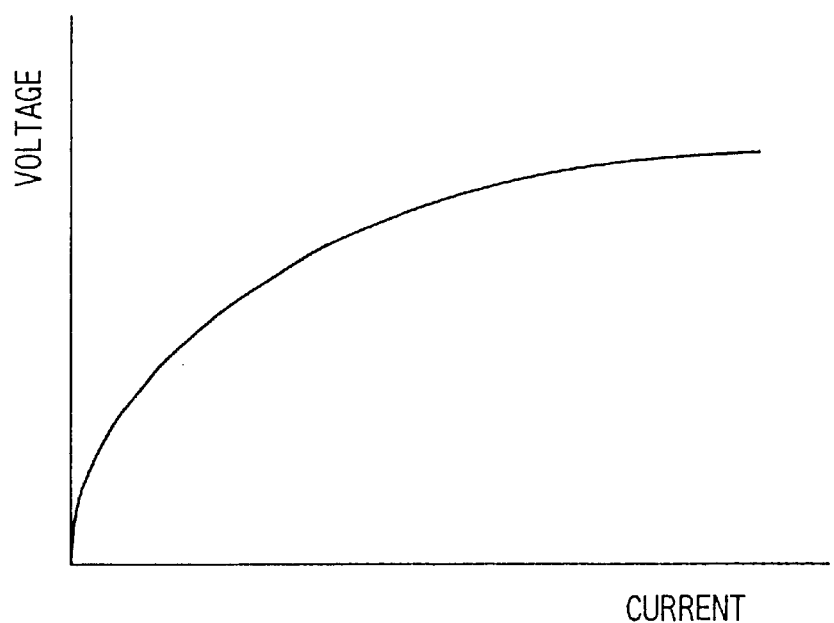
FIG. 5 is a graph illustrating an example of a change in the polarization relatively to current.

As shown in FIG. 3, the V-I characteristic can be approximated by using a linear equation $V=aI+b$. However, taking an influence of non-linear characteristic of a polarization resistance component shown in FIG. 5 into consideration, when an approximate V-I characteristic due to a pure resistance of the battery in the preferred embodiment is computed, as shown in FIG. 4 an approximate curve equation of a quadratic equation $V=aI^2+bI+c$ is calculated by using a least square method in order to improve a performance of the approximation.

Figure 6:
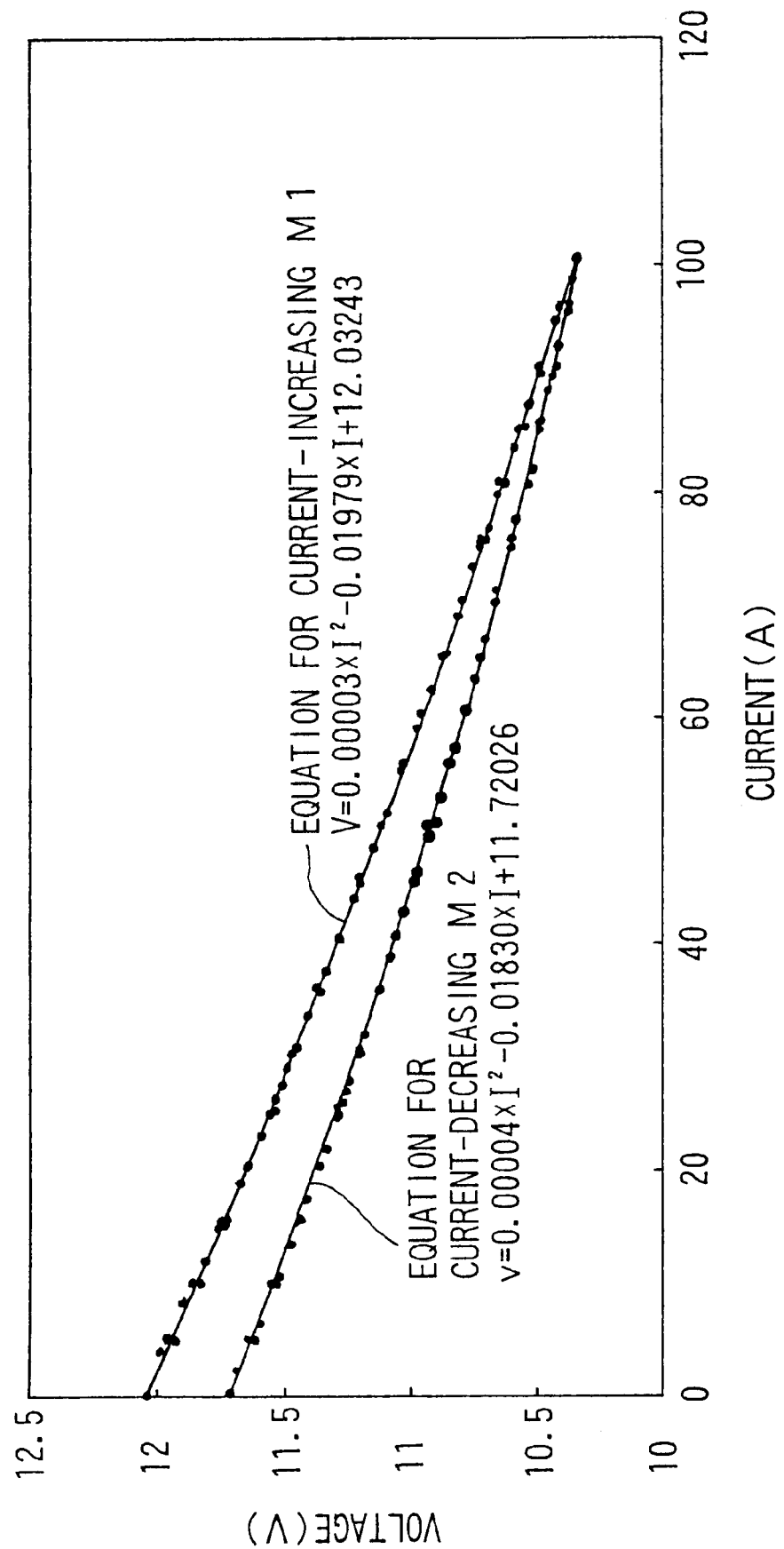
FIG. 6 is a graph illustrating an example of an approximate characteristic curve expressed by two quadratic approximate curve equations, which can be obtained by one discharge.

When the load requiring a large current described above is driven, a constant load discharge is carried out with a predetermined large current value corresponding to the maximum value of electric power supplied to the load. A terminal voltage and a discharge current of the battery during the constant load discharge are periodically measured, then on the basis of real data indicating a correlation between the terminal voltage and the discharge current, as shown in FIG. 6, obtained are a first approximate curve equation M1 for the V-I characteristic of the battery during the increase of the discharge current and a second approximate curve equation M2 for the V-I characteristic of the battery during the decrease of the discharge current. Equations described in FIG. 6 are examples of such an approximate curve equation obtained from the real data. The difference between the approximate curve equations M1 and M2 will be analyzed in the following.

As for the approximate curve equation M1, taking the polarization resistance component at the start of the discharge as a reference, when the discharge starts and the current increases, the polarization resistance component gradually increases. Thereafter, when the current reaches the maximum value thereof, the polarization resistance component is assumed to reach its peak and to decrease with the decreases of the current. However, practically, since the reaction in the battery is delayed, therefore the polarization resistance component does not simply decrease in proportion to the decrease of the current. That is, as for the approximate curve equation M2, the V-I characteristic of M2 is not the same as that of M1 and a voltage drop larger than that observed during the increases of the current is arisen. That is why the two different approximate curve equations M1 and M2 are obtained during the increase and decrease of the current, respectively.

In the following, a method for measuring the pure resistance R of the battery on the basis of the approximate curves expressed by the two approximate curve equations M1 and M2 for the V-I characteristic described above will be explained with reference to FIGS. 7, 9.

Figure 7:
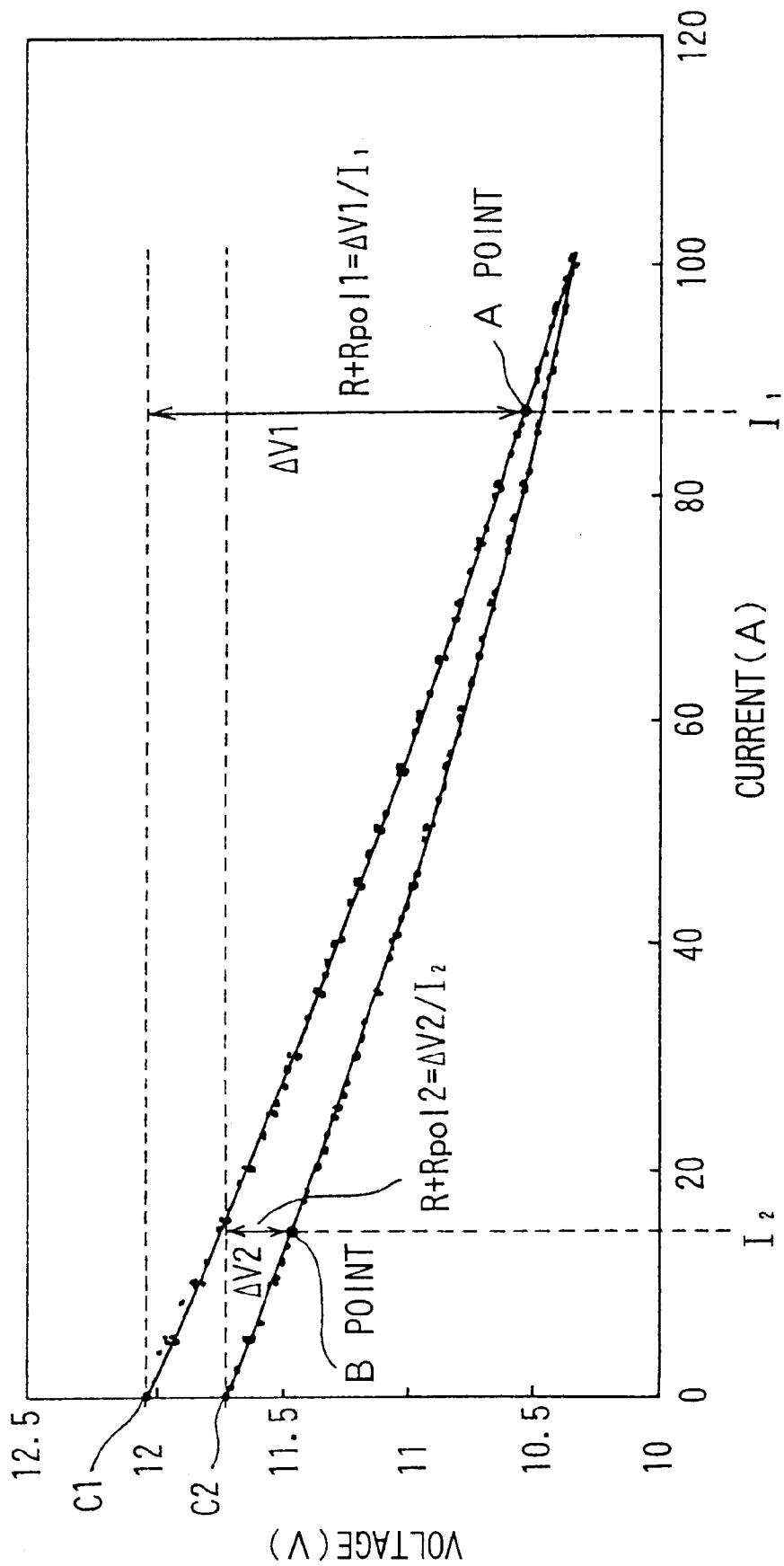
FIG. 7 is a graph illustrating how to define two optional points on the two approximate characteristic curves.

First as shown in FIG. 7, an optional point A is selected within the range of the real data on the approximate curve expressed by M1 and a voltage drop $\Delta V1$ from a intercept C1 of the approximate curve expressed by M1 on the voltage coordinate axis to the point A on the approximate curve is calculated. A value of $\Delta V1$ divided by the current I1 at the point A is a combined resistance consisting of the pure resistance R and a value Rpol1, which is a value of the polarization resistance component that is the other resistance component except the pure resistance R at that time. That is, $$R+\text{Rpol1}=\Delta V1 I1.$$

Similarly, as shown in FIG. 7, an optional point B is selected within the range of the real data on the approximate curve expressed by M2 and a voltage drop $\Delta V2$ from a intercept C2 of the approximate curve expressed by M2 on the voltage coordinate axis to the point B on the approximate curve is calculated. A value of $\Delta V2$ divided by the current I2 at the point B is a combined resistance consisting of the pure resistance R and a value Rpol2, which is a value of the polarization resistance component that is the other resistance component except the pure resistance R at that time. That is, $$R+\text{Rpol2}=\Delta V2 I2.$$

A difference $\Delta R$ between the values of the combined resistance at the points A and B is expressed by $$\Delta R = R+\text{Rpol1}-(R+\text{Rpol2})=\text{Rpol1}\text{Rpol2},$$

And is a difference in the polarization resistance component between the points A and B, which is obvious since the pure resistance R does not change during one discharge.

Figure 8:
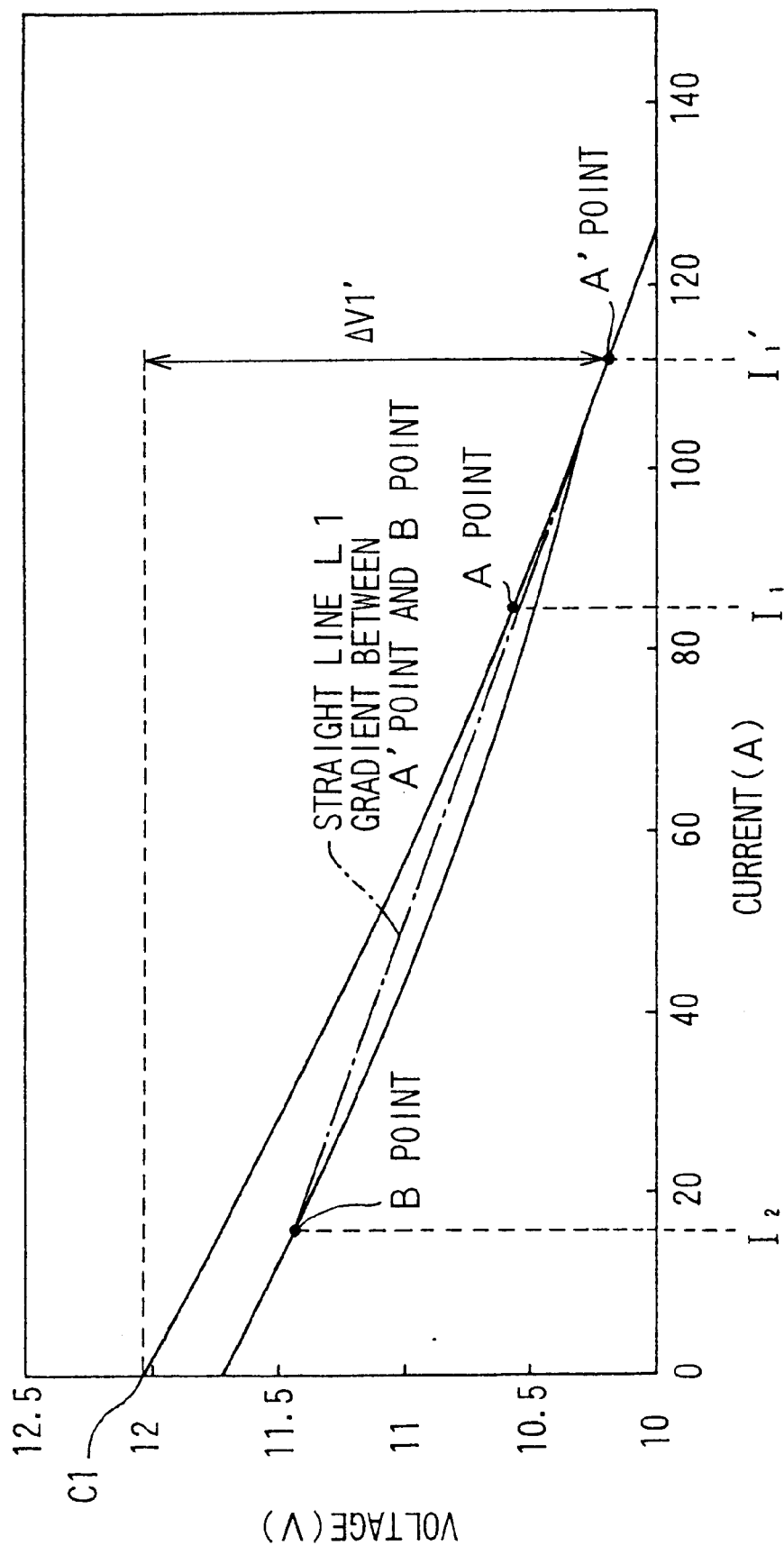
FIG. 8 is a graph illustrating how to define an assumed point relative to a point defined on one approximate characteristic curve and how to correct the gradient between the two points.
Figure 9:
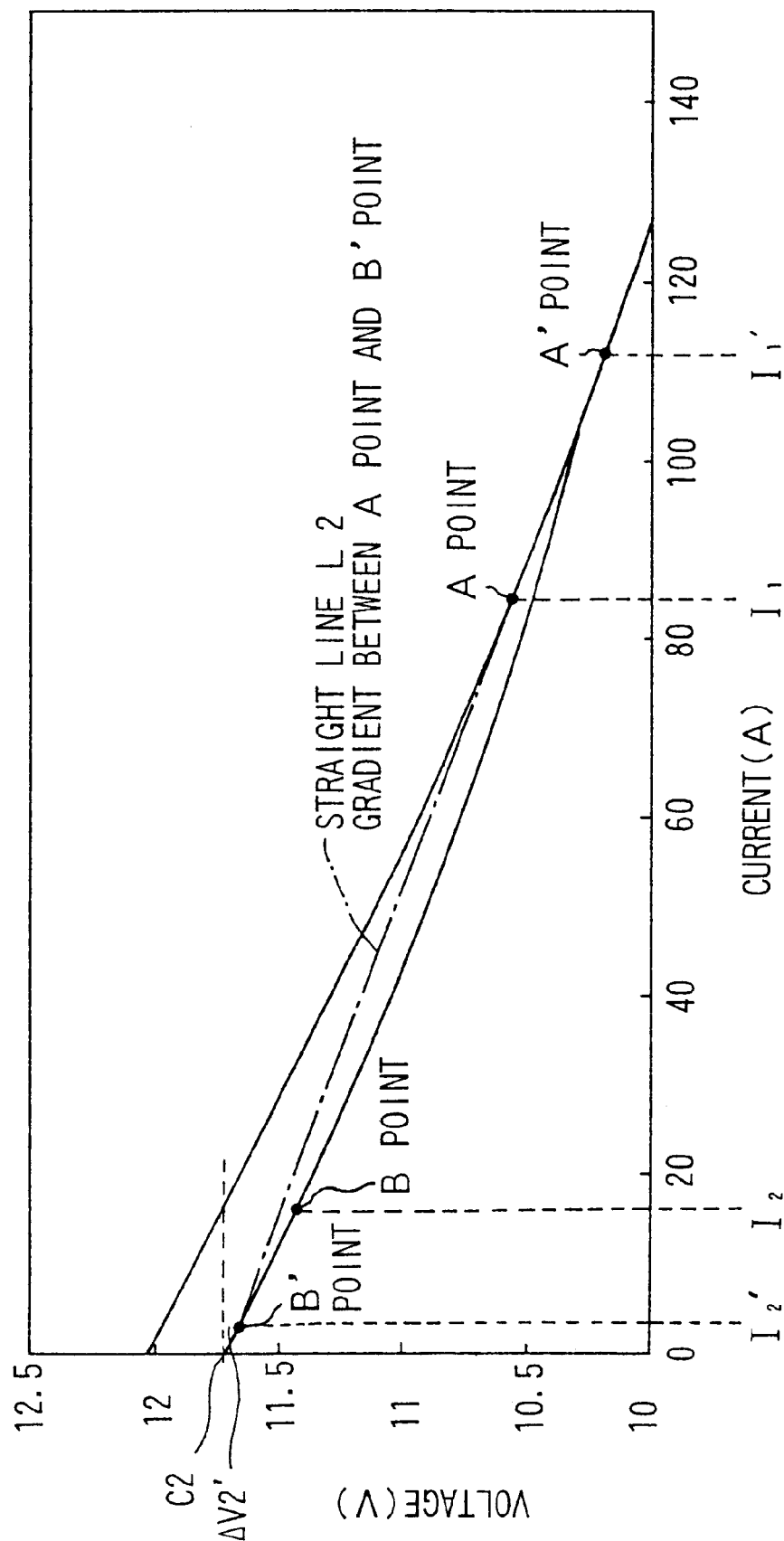
FIG. 9 is a graph illustrating how to define an assumed point relative to a point defined on another approximate characteristic curve and how to correct the gradient between the two points.

As shown in FIG. 8, on the approximate curve expressed by M1 there is a point A having a value (R+Rpol1 equal to the combined resistance (R+Rpol2) at the optional point B selected on the approximate curve expressed by M2. Similarly, As shown in FIG. 9, on the approximate curve expressed by M2 there is a point B having a value (R+Rpol2 equal to the combined resistance (R+Rpol1) at the optional point A selected on the approximate curve expressed by M1. That is, there is the point A that satisfies $$R+Rpol1=R+Rpol2$$

on the approximate curve expressed by M1, while there is the point B that satisfies $$R+Rpol1=R+Rpol2 \text{ on the approximate curve expressed by M2.}$$

In short, assuming that the current and voltage at the point A is I1 and V1 respectively and that the current and voltage at the point B is I2 and V2 respectively, the value of the polarization resistance component at the coordinate (I1 V1 of the point A is equal to that at the coordinate (I2, V2) of the point B while the value of the polarization resistance component at the coordinate (I1, V1) of the point A is equal to that at the coordinate (I2 V2 of the point B In the following, taking the point B as a reference, a method for calculating the current I1 and voltage V1 at the point A having the same value as the combined resistance value (R+Rpol2) at the point B will be explained.

Assuming that the voltage drop from the intercept C1 of the approximate curve expressed by M1 at the voltage coordinate axis to the point A' is $\Delta V1'$, it is expressed by $$\Delta V1'=C1-(a1I1'^2+b1I1'+C1)=(R+Rpol2)I1'$$

and it brings about $$-(a1I1'+b1)=R+Rpol2$$

then the current I1' at the point A is expressed by $$I1'=-(b1+R+Rpol2)a1.$$

Since
$$R+Rpol2(=R+Rpol1')=\Delta V2I2(=\Delta V1' \ I1'),$$

then $$I1' = -[b1 + (\Delta V2I2)]a1$$
$$= -[b1 + (\Delta V1'I1')]a1.$$

Since the voltage V1' at the point A' is obviously expressed by $$V1'=a1I1'^2+b1I1'+C1,$$

therefore, the coordinate (I1', V1') of the point A' can be defined from the known values.

Similarly, taking the point A as a reference, the current I2 and voltage V2 at the point B having the same value as the combined resistance value (R+Rpol1) at the point A can be calculated from the known values by using the equations $$I2 = -[b2 + (\Delta V1I1)]a2$$
$$= -[b2 + (\Delta V2'I2')]a2$$

and $$V2' = a2I2'^2 + b2I2' + C2.$$

Here, $\Delta V2'$ is the voltage drop from the intercept C2 of the approximate curve expressed by M2 at the voltage coordinate axis to the point B'.

When the coordinate (I1', V1 of the point A is determined, as shown in FIG. 8 the combined resistance value R1 can be calculated by calculating the gradient of the straight line L1 defined by connecting the coordinate (I1 V1 of the point A and the coordinate (I2, V2) of the point B. The combined resistance value R1 can be calculated by dividing the voltage drop difference (V1 V2) arisen due to the combined resistance consisting of the pure resistance R of the battery and the polarization resistance component Rpol2 by the difference in the current (I1'-I2) between the two points. That is, $$R1=(V1'-V2)(I1'-I2).$$

Similarly, when the coordinate (I2', V2') of the point B' is determined, as shown in FIG. 9 the combined resistance value R2 can be calculated by calculating the gradient of the straight line L2 defined by connecting the coordinate (I2 V2 of the point B and the coordinate (I1, V1) of the point A. The combined resistance value R2 can be calculated by dividing the voltage drop difference (V1 V2 arisen due to the combined resistance consisting of the pure resistance R of the battery and the polarization resistance component Rpol1 by the difference in the current (I1 I2 between the two points. That is, $$R2=(V1V2)(I1-I2').$$

However, the combined resistance values R1 and R2 calculated as described above are computed by dividing the voltage drop difference arisen due to the combined resistance component consisting of the pure resistance and the polarization rsistance component by the difference in the current between the two points, therefore they do not agree with the pure resistance. In order to agree the gradient between the two points with the pure resistance, the voltage drop difference, in which the contribution of the voltage drop arisen due to the polarization resistance component is excluded, is divided by the current difference as explained in the following.

When the point B is taken as a reference, assuming that the combined resistance value R1 is expressed by $$R1=R1+Rpol2=R1+Rpol1$$

the voltage drop arisen from a fact that the current corresponding to the difference between the current I1 at the point A and the current I2 at the point B flows into the resistance R1 can be revised by pumping up (raising up) the voltage value at the point A by a factor of the voltage drop component arisen from a fact that the current corresponding to the difference between the current I1 at the point A and the current I2 at the point B flows into the polarization resistance component Rpol1' (or Rpol2), that is, $$R1'(I1'-I2)=[V1'+Rpol1'(I1'-I2)]-V2.$$

The above equation is rewritten as follows:

$$R1'(I1'-I2)=(V1'-V2)+Rpol1'(I1'-I2).$$

Then, since $Rpol1'=\Delta V1' \ I1'-R1'$, $$R1'(I1'-I2)=(V1'-V2)+(\Delta V1'I1'-R1')(I1'-I2),$$

that is, $$2R1'(I1'-I2)=(V1'-V2)+\Delta V1'I1'(I1'-I2),$$

as a result, the following equation can be obtained:

$$R1'=[(V1'-V2)+(\Delta V1'I1')(I1'-I2)]2(I1'-I2).$$

Here, ($\Delta V1'I1'$) can be replaced by ($\Delta V2$ $I2$).

Similarly, when the point A is taken as a reference, assuming that the combined resistance value R2 is expressed by $$R2R2'+Rpol1=R2'+Rpol2',$$

the voltage drop arisen from a fact that the current corresponding to the difference between the current I1 at the point A and the current I2 at the point B flows into the resistance R2 can be revised by cutting down (subtracting) the voltage value at the point B by a factor of the voltage drop component arisen from a fact that the current corresponding to the difference between the current I1 at the point A and the current I2 at the point B flows into the polarization resistance component Rpol2 (or Rpol1), that is, $$R2I1I2=V1[V2Rpol2I1-I2')].$$

The above equation is rewritten as follows:

$$R2'(I1-I2')=(V1-V2')+Rpol2'(I1-I2').$$

Then, since $Rpol2'=\Delta V2'$ $I2'-R2'$, $$R2'(I1-I2')=(V1-V2')+(\Delta V2'I2'-R2')(I1-I2'),$$

that is, $$2R2'(I1-I2')=(V1-V2')+\Delta V2'I2'(I1-I2'),$$

as a result, the following equation can be obtained:

$$R2'=[(V1-V2')+(\Delta V2'I2')(I1-I2')]2(I1-I2').$$

Here, ($\Delta V2'$ $I2'$) can be replaced by ($\Delta V1$ $I1$).

The two values R1' and R2' calculated as described above cannot be a real pure resistance R, because the two points A and B are taken as a reference, the different polarization resistance components (Rpol1'=Rpol2) and (Rpol1=Rpol2') are used, and the two values R1' and R2' are calculated from the voltage drop $\Delta V1$ dropped from the intercept C1 and the voltage drop $\Delta V2$ dropped from the intercept C2 that is different from the intercept C1. Consequently, the real pure resistance R can be calculated by taking an addition-average of the two, that is, $$R=(R1'+R2')2.$$

In the following, a method for calculating the pure resistance of the battery will be first explained with reference to FIGS. 7, 9. When a load requiring a large current such as a starter motor, motor generator and motor for traveling is driven, the battery carries out a constant load discharge with a predetermined large current value corresponding to the maximum value of electric power supplied to the load. The terminal voltage and discharge current of the battery during the constant load discharge are measured periodically, for example, once per 1 millisecond (ms), thereby a large number of data for a pair of the terminal voltage and discharge current of the battery are obtained.

The newest pairs of the terminal voltage and discharge current of the battery thus obtained for a predetermined period of time are stored in a memory as rewritable storing means such as a RAM. On the basis of the data of these pairs stored, by using a method of least squares, computed are the voltage-current characteristic indicating the correlation between the terminal voltage and discharge current of the battery during the increase of the discharge current, that is, the first approximate curve equation M1 expressed by, for example, a quadratic equation $V1(I)=a1I^2+b1I+C1$ and the voltage-current characteristic indicating the correlation between the terminal voltage and discharge current of the battery during the decrease of the discharge current, that is, the second approximate curve equation M2 expressed by, for example, a quadratic equation $V2(I)=a2I^2+b2I+C2$.

Thereafter, a first point A is defined on the voltage-current characteristic curve expressed by the first approximate curve equation M1 while a second point B is defined on the voltage-current characteristic curve expressed by the second approximate curve equation M2. At this time, preferably, these points A and B are defined in a range where the real data of the terminal voltage and discharge current used when each approximate curve equation is computed exist, thereby when each imaginary point corresponding to the respective points A and B is imaginarily set thereafter, the imaginary point is prevented from being imaginarily set at a position significantly missing a target. Further, preferably, the points A and B are defined at both sides of a point having the maximum polarization resistance component, thereby the imaginary points are defined at both sides of the point having the maximum polarization resistance component and the accuracy of the pure resistance of the battery computed thereafter is improved.

Then, a first imaginary point A having the same resistance value as the second combined resistance R2 consisting of the pure resistance of the battery and the second polarization resistance component Rpol2, which causes the second voltage drop $\Delta V2$ when the second discharge current I2 corresponding to the second point B flows, is imaginarily set on the first approximate curve equation M1, while a second imaginary point B' having the same resistance value as the first combined resistance R1 consisting of the pure resistance of the battery and the first polarization resistance component Rpol1, which causes the first voltage drop $\Delta V1$ when the first discharge current I1 corresponding to the first point A flows, is imaginarily set on the second approximate curve equation M2.

Thereafter, the first gradient R1 of the straight line L1 formed by connecting the second point B and the first imaginary point A is revised by a factor corresponding to the voltage drop difference Rpol2 (I1 I2) due to the second polarization resistance component Rpol2, which is arisen by the second discharge current I2 and the discharge current I1 at the first imaginary point A and the first revised gradient R1 which excludes the contribution of the voltage drop due to the second polarization resistance component Rpol2, is computed, while the second gradient R2 of the straight line L2 formed by connecting the first point A and the second imaginary point B is revised by a factor corresponding to the voltage drop difference Rpol1 (I1 I2 due to the first polarization resistance component Rpol1, which is arisen by the first discharge current I1 and the discharge current I2 at the second imaginary point B and the second revised gradient R2 which excludes the contribution of the voltage drop due to the first polarization resistance component Rpol1, is computed.

By addition-averaging thus computed first revised gradient R1 and second revised gradient R2 an average gradient thereof is obtained as the pure resistance of the battery.

An apparatus for implementing the method for computing the pure resistance of the battery as described above is included in a preferred embodiment of the apparatus for computing a battery capacity of the present invention, which will be explained in the following.

Figure 10:
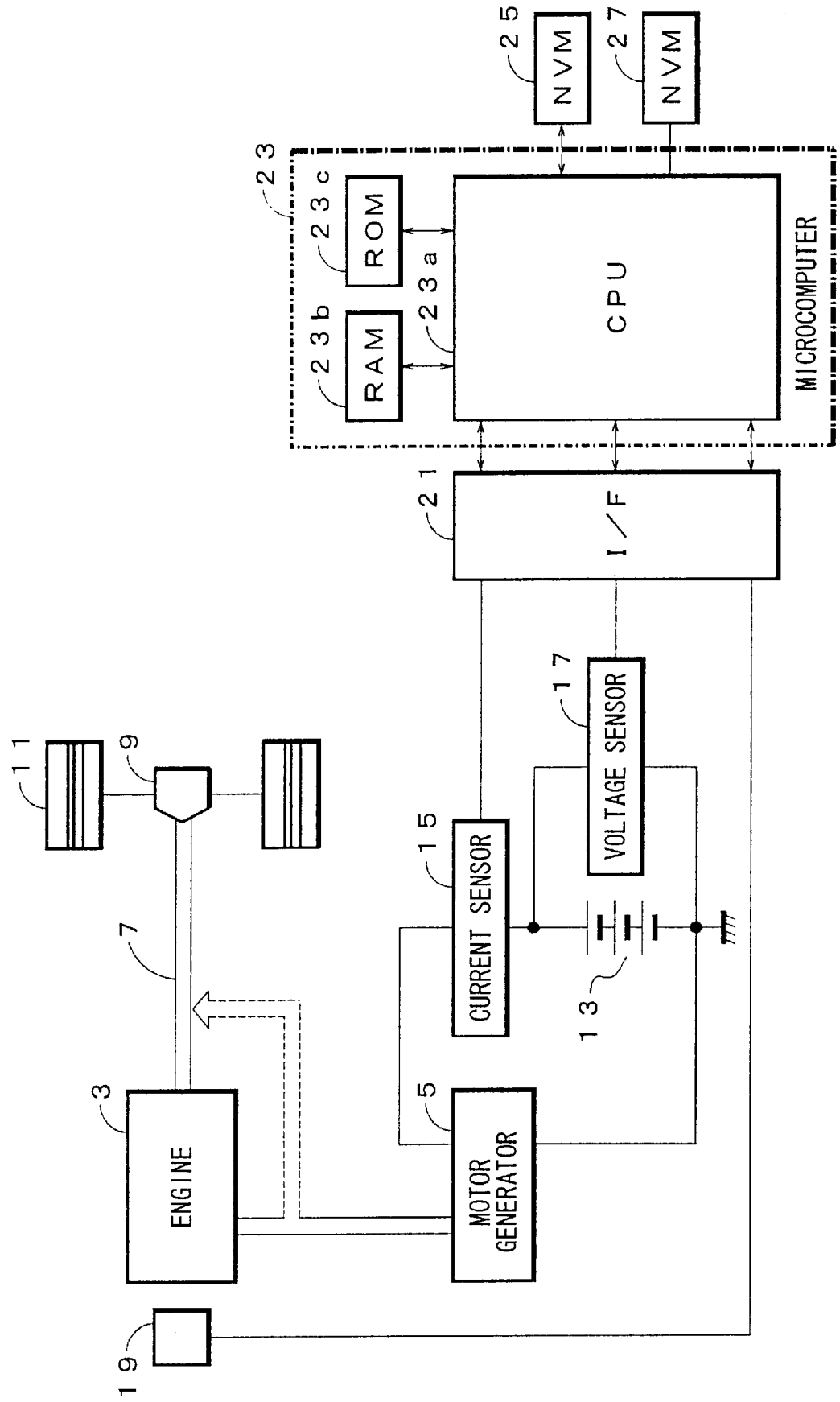
FIG. 10 illustrates a basic constitution of an apparatus for computing a battery capacity according to a preferred embodiment, which employs a method for estimating a terminal voltage of a battery, a method for computing an open circuit voltage, and a method for computing a battery capacity according to the present invention.

FIG. 10 illustrates a basic constitution of an apparatus for computing a battery capacity according to a preferred embodiment, which employs a method for estimating a terminal voltage of a battery, a method for computing an open circuit voltage, and a method for computing a battery capacity according to the present invention. The apparatus 1 for computing a battery capacity according to the preferred embodiment is mounted on a hybrid vehicle having an engine 3 and a motor generator 5 (corresponding to the maximum power-consuming load).

In the hybrid vehicle, during an ordinary operation thereof only a power of the engine 3 is transmitted to a wheel 11 by way of a drive shaft 7 and a differential case 9, while during a heavy load operation a power from the battery 13 makes the motor generator 5 functions as a motor and an output power from the motor generator 5 in addition to an output from the engine 3 is transmitted from the drive shaft 7 to the wheel 11, thereby an assist traveling is carried out.

Further, in the hybrid vehicle, the motor generator 5 is made function as a generator (dynamo) upon decelerating or braking to convert the kinetic energy into the electric energy, thereby the battery 13 is charged.

The motor generator 5 is also used as a starter motor for forcedly rotating a flywheel of the engine 3 when an operation of the engine 3 is started in response to a switching-on of a starter switch (not shown). In this case, the motor generator 5 independently consumes a power higher than a power, which the other plurality of loads mounted on the vehicle simultaneously consume.

In the hybrid vehicle of the preferred embodiment, when a key (not shown) inserted into a key cylinder is turned up to the first stage thereof, an accessory switch (not shown), which has been in the off-state thereof, is set on, electric parts such as an air-conditioner, audio equipment, power window, head lump and an interior lump (not shown) are set in their operational states.

When the key inserted into the key cylinder is turned up to the second stage thereof, the accessory switch is kept in its on-state while a ignition switch, which has been in the off-state thereof, is set on, thereby instruments such as a meter and indicator are in their operation.

When the key inserted into the key cylinder is turned up to the third stage thereof, the accessory switch and the ignition switch are kept in their on-state while a starter switch, which has been in the off-state thereof, is set on.

When a hand of the driver is detached from the key turned up to the third stage thereof, the key returns to the second stage thereof to make the starter switch be in an off-state, however as long as the key is not turned into the reverse direction the key keeps staying at the same position, thereby the accessory switch and the ignition switch keep their on-state. Similarly, at the first stage, as long as the key is not turned into the reverse direction the key keeps staying at the same position, thereby the accessory switch keeps its switching-on state.

In the hybrid vehicle of the preferred embodiment, a discharge current flowing from the battery 13 to the instrument in the on-state of the ignition switch or a discharge current flowing from the battery 13 to the electric parts (i.e. loads) except the motor generator 5 upon switching-on of such electric parts in the on-state of the accessory switch is less than 35 A (ampere) at the most.

To the contrary, after the accessory switch is set on and the starter switch is also set on, when the motor generator 5 is driven as a starter motor to start the engine 3, a discharge current as large as about 250 A instantaneously flows from the battery 13 even if no other electric part is in operation.

Consequently, in the apparatus 1 for computing a battery capacity according to the preferred embodiment, whether or not the discharge current of the battery 13 lies in the range from the target current value of 35 A (lower limit) to the maximum current value of 250 A (upper limit) is a criterion to judge whether or not the battery carries out the constant load discharge to make the motor generator 5 operate as a starter motor.

The apparatus 1 for computing a battery capacity according to the preferred embodiment computes the charging state of the battery 13. The apparatus 1 includes a current sensor 15 for detecting the discharge current I of the battery 13 with respect to the electric parts such as a motor for assist traveling and the motor generator 5 functioning as a starter motor or the charge current from the motor generator 5 functioning as a generator to the battery 13, a voltage sensor 17 having a infinite resistance connected in parallel to the battery 13 for detecting the terminal voltage of the battery 13, and a temperature sensor 19 (corresponding to the detecting means) for detecting a temperature h in an engine room (not shown), in which the engine 3 is arranged.

The current sensor 15 and the voltage sensor 17 are arranged on an electric circuit, which is made in the closed circuit state thereof by the switching-on state of the ignition switch.

The apparatus 1 further includes a microcomputer 23, into which outputs from the current sensor 15, voltage sensor 17 and temperature sensor 19 are taken after an analog digital conversion (A D conversion) thereof in an interface circuit (hereinafter, I F) 21, and nonvolatile memories (hereinafter, NVM) 25 and 27 connected to the microcomputer 23.

The microcomputer 23 has a CPU 23a, RAM 23b and ROM 23c, wherein the CPU 23a is connected to the RAM 23b, ROM 23c, the I F 21 and the NVM 25 and 27. Signals indicating the on and off-states of the ignition switch (not shown) as described above are input into the CPU 23a.

The RAM 23b has a data area for storing various data and a work area for use in various processes. The ROM 23c stores: control programs for making the CPU 23a implement various processes; and revision data for revising the value of the residual voltage drop value $e_0$ stored in the NVM 27 in response to the temperature $h_1$ of or around the battery 13 when the open circuit voltage OCV of the battery 13 is stored in the NVM 25 and the temperature $h_2$ of or around the battery 13 when the estimated voltage Vn, which is estimated by the process as described later on and is the estimated terminal voltage V in the constant load discharge state of the battery 13, is estimated.

Figure 11:
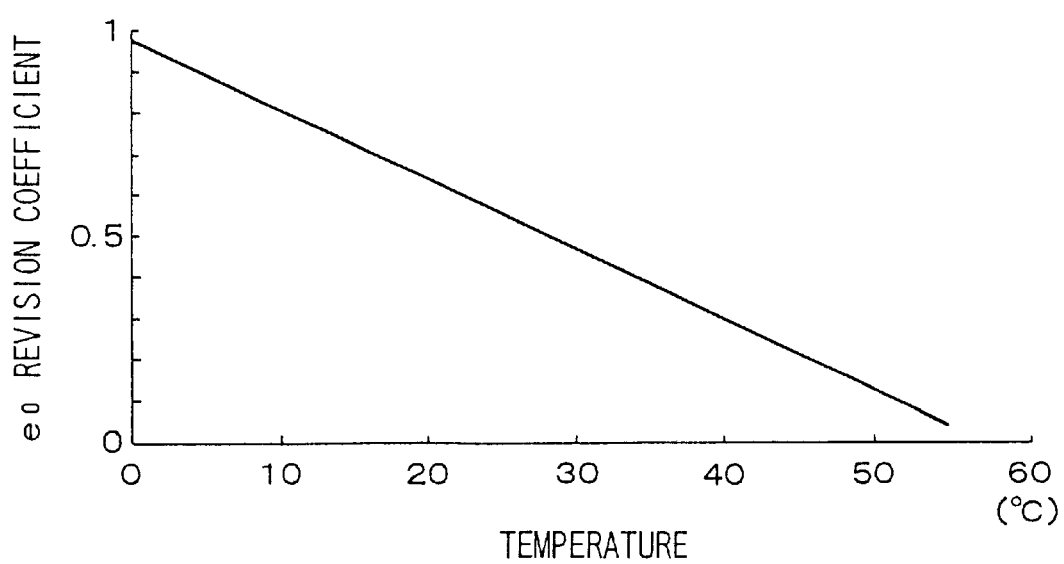
FIG. 11 is a graph illustrating an example of a correction data of a residual voltage drop value stored in a ROM of a microcomputer in FIG. 10.

In this connection, as shown in FIG. 11, the revision data of the residual voltage drop value $e_0$ stored in the ROM 23c is a temperature vs. revision coefficient relationship, in which each revision coefficient at the corresponding temperature between 0 to 55 is shown assuming that the revision coefficient at 0 is set to be "1".

When the ignition switch (not shown) is in an off-state thereof, the microcomputer 23 is in a sleep mode thereof, in which only minimum necessary processes required are carried out by dark current supplied from the battery 13, and the microcomputer 23 is woken up by switching-on of the ignition switch to be in a normal active mode thereof.

In the NVM 25, the terminal voltage V in an equilibrium state of the battery 13 that changes in response to the change in the charging capacity, that is, the state in which the voltage rise or drop is completely canceled out and does not remain, is stored and memorized as the open circuit voltage OCV of the battery 13, and the temperature in the engine room, which is detected by the temperature sensor 19 upon the storage, is also stored as the temperature $h_1$ of or around the battery 13.

When the hybrid vehicle is manufactured, the terminal voltage V of the battery 13, which is independently measured upon the mounting, is stored in the NVM 25 in advance as the open circuit voltage OCV.

In the NVM 27 (corresponding to the storing means), a value of the residual voltage drop $e_0$ that is a residual voltage drop due to the residual polarization at the end of the discharge of the battery 13 is stored. Here, the value of the residual voltage drop $e_0$ is obtained by subtracting the estimated voltage Vn from the open circuit voltage OCV of the battery 13 stored in the NVM 25. The estimated voltage Vn, which is an estimated terminal voltage V in the constant load discharging state of the battery 13, is estimated by the process as described later on the basis of a correlation between the terminal voltage V of the battery 13 detected by the voltage sensor 17 and the discharge current I detected by the current sensor 15 when the battery 13 instantaneously implements the constant load discharge in order to start the engine 3 by the motor generator 5 in response to the switching on of the ignition switch. A temperature in the engine room detected by the temperature sensor 19 when the residual voltage drop value $e_0$ is stored is stored in the NVM 27 as the temperature $h_1$ of or around the battery 13.

The outputs from the current sensor 15, voltage sensor 17 and temperature sensor 19 are always taken into the CPU 23a of the microcomputer 23 through the I F 21 while the ignition switch is set on. Among them, the current value and voltage value, which are the outputs from the current sensor 15 and voltage sensor 17, respectively, are collected with a high speed and with a short period of time and always taken into the CPU 23a of the microcomputer 23 through the I F 21. The current value and voltage value taken are stored in a data area (corresponding to the storing means 23bA) of the RAM 23b with respect to from those before a predetermined period of time to those of the newest. The real data thus stored are used to compute the quadratic approximate curve equation of the voltage-current characteristic of the battery 13.

Next, the process that the CPU 23a carries out in accordance with a control program installed in the ROM 23c will be explained with reference to flow charts shown in FIGS. 12 15.

Figure 12:
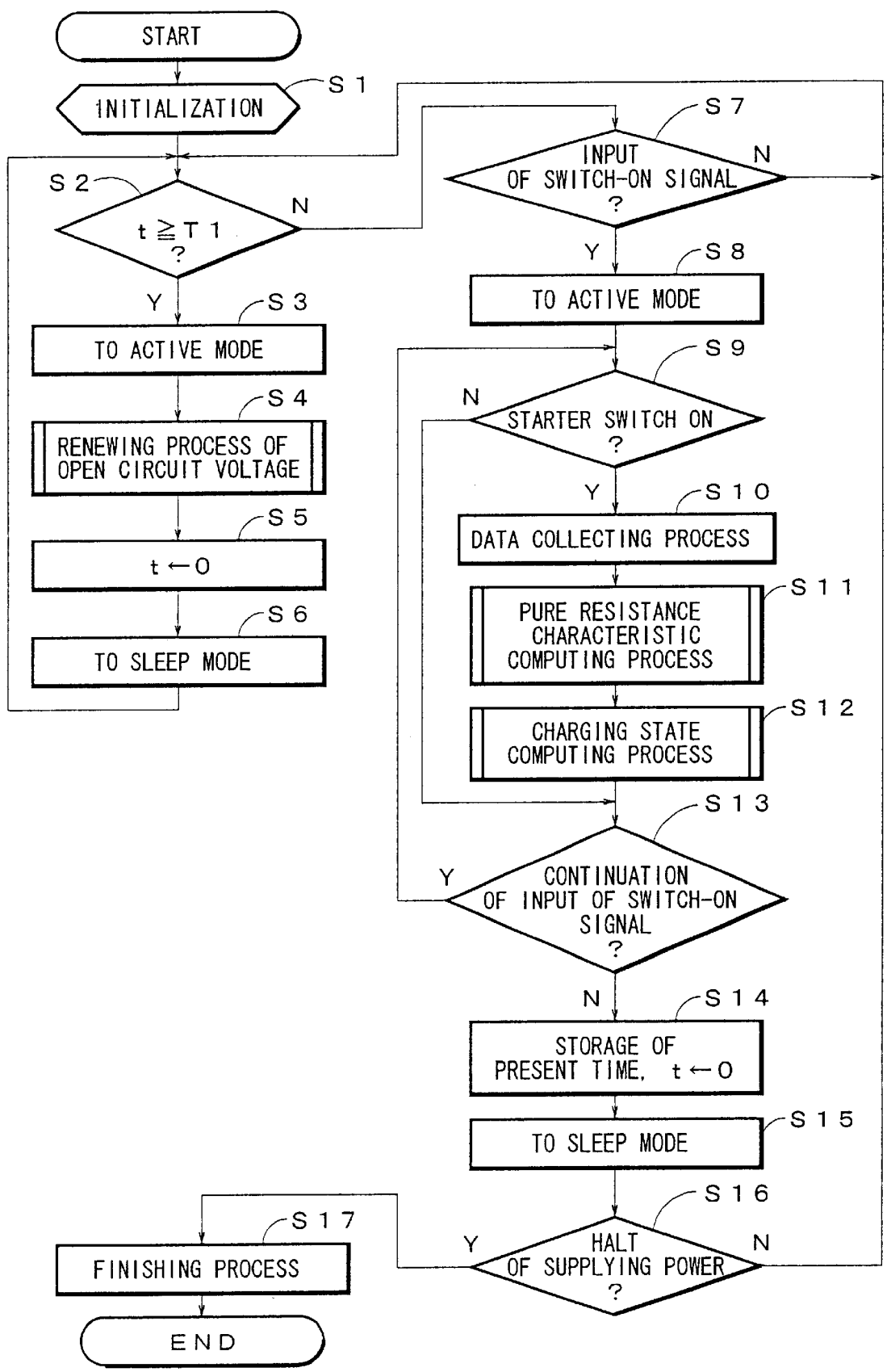
FIG. 12 is a flow chart illustrating a main routine of a process that a CPU carries out in accordance with a control program stored in a ROM of a microcomputer in FIG. 11.

When the microcomputer 23 starts operating with receiving the power supply from the battery 13, as shown in a flow chart of a main routine in FIG. 12, the CPU 23a first makes the operation mode of the microcomputer 23 be in sleep mode thereof, carries out an initialization such as a reset of flags in a flag area provided in the work area of the RAM 23b and a clearance of stored values in a timer area (step S1), and thereafter confirms whether or not a measurement period of time in the wake-up timer therein reaches a wake-up period of time T1 (step S2).

If the measurement period of time does not reach the wake-up period of time T1 (N at step S2), the processing advances to step S7 (explained later on), on the other hand if reaches (Y at step s2), the operation mode of the microcomputer 23 is changed to the active mode thereof (step S3) and then an open circuit voltage renewal process is carried out (step S4).

Figure 1:
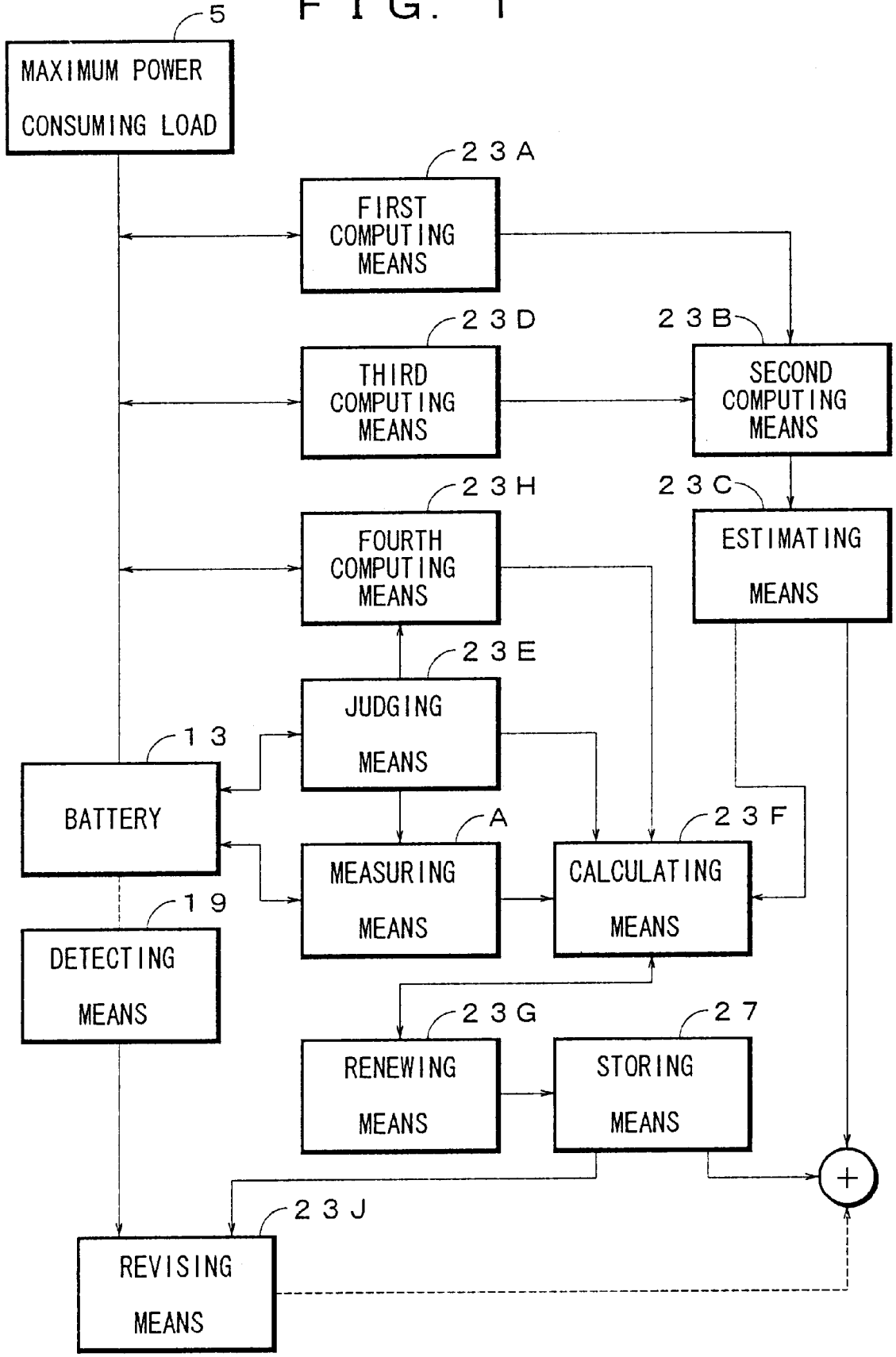
FIG. 1 is a basic constitution of an apparatus for estimating a terminal voltage of a battery, an apparatus for computing an open circuit voltage, and an apparatus for computing a battery capacity according to the present invention.
Figure 2:
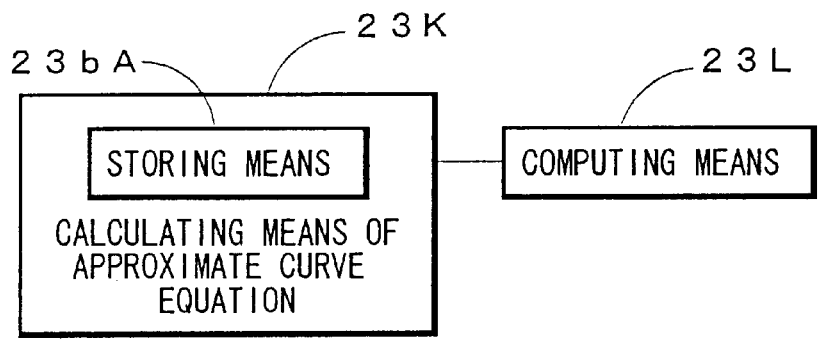
FIG. 2 is a basic constitution of an apparatus for computing a voltage-current characteristic not including the influence of the polarization of the battery in its equilibrium or non-equilibrium state as a pure resistance of the battery, which can be employed as an example in an apparatus for estimating a terminal voltage of a battery, an apparatus for computing an open circuit voltage, and an apparatus for computing a battery capacity according to the present invention.
Figure 13:
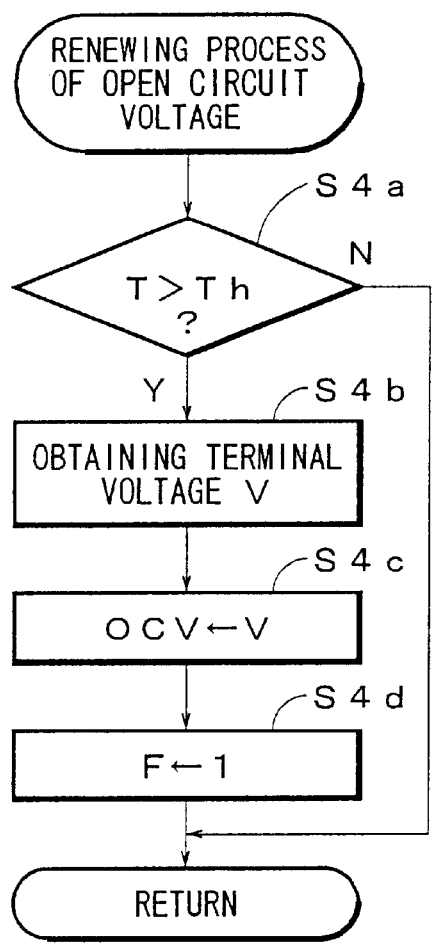
FIG. 13 is a flow chart of a subroutine illustrating the updating process of the open circuit voltage shown in FIG. 12.

In the open circuit voltage renewal process at step S4, as shown by a flow chart of a sub-routine in FIG. 13, it is judged whether or not a continuous electric power non-conducting period of time T, which is shown by a difference value between a time stored into a sleep-switching time area in the RAM 23b and a present time measured in a time counter therein, exceeds a predetermined period of time Th required to cancel the polarization from a state, in which the maximum polarization takes place (step S4a).

If T does not exceed Th (N at step S4a), the processing finishes the open circuit voltage renewal process and returns to the main routine shown in FIG. 12, on the other hand if exceeds (Y at step S4a), an A D converted value of the terminal voltage of the battery 13 detected by the voltage sensor 17 is obtained from the I F 21 (step S4b).

Thereafter, the open circuit voltage OCV of the battery 13 stored in the NVM 25 is renewed to the A D converted value of the terminal voltage of the battery 13 obtained at step S4b, then a flag F1 in an equilibrium state flag area of the RAM 23b is set up to be "1" (step S4d) and then, the processing finishes the open circuit voltage renewal process and returns to the main routine in FIG. 12.

When the open circuit voltage renewal process at step S4 is finished, a measurement period of time t in the wake-up timer is reset (step S5), then the operation mode of the microcomputer 23 is returned to the sleep mode thereof (step S6) and then, the processing returns to step S2.

On the other hand, at step S7, to which the processing advances if the measurement period of time t does not reach the wake-up period of time T1 (N) at step S2, as shown in FIG. 12, the processing makes the ignition switch be on-state or waits for an input of the switch-on signal arisen by switching-on of the electric part in a state that the accessory switch is set on.

If the switch-on signal is not input (N at step S7), the processing returns to step S2, on the other hand if input (Y at step S7), the operation mode of the microcomputer 23 is switched to the active mode thereof (step S8), then it is confirmed whether or not the starter switch is set on (step S9).

If the starter switch is not set on (N at step S9), the processing advance to step S13 (explained later on). On the other hand, if set on (Y at step S9), a pair of the A D converted value of the discharge current I of the battery 13 detected by the current sensor 15 and the A D converted value of the terminal voltage V of the battery 13 detected by the voltage sensor 17 is collected through the I F 21, said both detection being carried out while the discharge current I increases to reach the peak value thereof and decreases to return to be zero after the starter switch is set on, and a real data collecting process, in which thus collected real data are stored in the data area of the RAM 23b, is carried out (step S10), and thereafter a pure resistance characteristic computing process is carried out (step S11).

Figure 14:
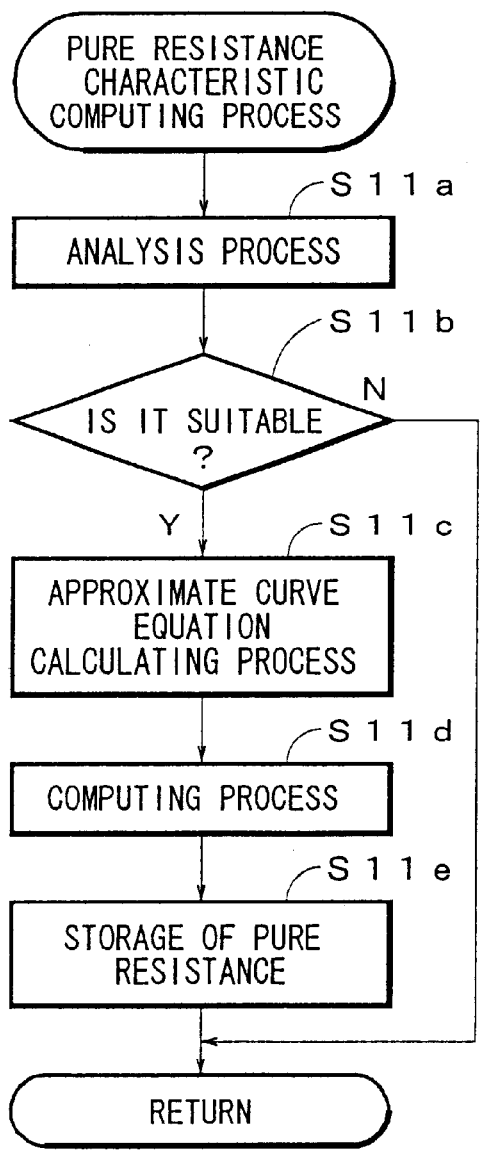
FIG. 14 is a flow chart of a subroutine illustrating the computing process of the pure resistance characteristic shown in FIG. 12.

In the pure resistance characteristic computing process at step S11, as shown in a flow chart of a sub-routine in FIG. 14, the real data of the discharge current I and the terminal voltage V collected at step 10 for the newest predetermined period of time are analyzed, that is, carried out is an analysis process (step S11a), in which by using a least squares method whether the real data is suitable or not for computing the quadratic approximate curve equation of the voltage-current characteristic is judged by a point whether the constant load discharge with the predetermined large current value is carried out or not in the battery 13.

Thereafter, as a result of the analysis at step S11a, it is confirmed whether or not the suitable data for computing the quadratic approximate curve equation of the voltage-current characteristic are collected (step S11b). If not collected (N), the pure resistance characteristic computing process is finished and the processing returns to the main routine in FIG. 12. On the other hand, if collected (Y), a process for calculating the approximate curve equation is carried out (step S11c), in which computed are the first approximate curve equation M1 of the voltage-current characteristic of the battery 13 during the increase of the discharge current expressed by, for example, the quadratic equation of $V1(I)=a1I^2+b1I+C1$ and second approximate curve equation M2 of the voltage-current characteristic of the battery 13 during the decrease of the discharge current expressed by, for example, the quadratic equation of $V2(I)=a2I^2+b2I+C2$.

Thereafter, a computing process for computing the pure resistance of the battery 13 is carried out (step S11d), in which a first imaginary point having the same resistance value as the combined resistance consisting of the pure resistance of the battery 13 and the first polarization resistance component, which causes the voltage drop when the discharge current corresponding to the point defined on the voltage-current characteristic expressed by the approximate curve equation M2 flows, is imaginarily set on the voltage-current characteristic expressed by the first approximate curve equation M1, while a second imaginary point having the same resistance value as the combined resistance consisting of the pure resistance of the battery 13 and the second polarization resistance component, which causes the voltage drop when the discharge current corresponding to the point defined on the voltage-current characteristic expressed by the approximate curve equation M1 flows, is imaginarily set on the voltage-current characteristic expressed by the second approximate curve equation M2.

In the computing process at step S11d, the first gradient of the straight line formed by connecting the point defined on the voltage-current characteristic expressed by the second approximate curve equation and the first imaginary point is revised by a factor of the difference in the voltage drop due to the second polarization resistance component, which arises due to the discharge current corresponding to the point defined on the voltage-current characteristic expressed by the second approximate curve equation and the discharge current at the second imaginary point, and a first revised gradient that excludes the contribution of the voltage drop due to the second polarization resistance component is computed.

Further, in the computing process at step S11d, the second gradient of the straight line formed by connecting the point defined on the voltage-current characteristic expressed by the first approximate curve equation and the second imaginary point is revised by a factor of the difference in the voltage drop due to the first polarization resistance component, which arises due to the discharge current corresponding to the point defined on the voltage-current characteristic expressed by the first approximate curve equation and the discharge current at the first imaginary point, and a second revised gradient that excludes the contribution of the voltage drop due to the first polarization resistance component is computed.

Then, these first and second revised gradients are averaged by an addition-average to compute the average gradient as the pure resistance of the battery 13 and thus computed pure resistance is stored in the data area of the RAM 23b in order to be used for various purposes (step S11e).

When the computing process at step S11d is finished, the pure resistance value of the battery 13 computed there is multiplied by the discharge current I in the real data for the newest predetermined period of time collected at step S10, thereby the terminal voltage V during the discharge of the battery 13 due to the pure resistance is computed (step S11f), then a least squares method is applied to data of pairs of the terminal voltage V and the discharge current I collected at step S10, thereby computing a linear equation of the voltage-current characteristic $V_R=a_R I_R+b_R$ (step S11g), which does not include the influence of the polarization and depends only on the pure resistance of the battery, and thereafter the processing finishes the pure resistance characteristic computing process and returns to the main routine in FIG. 12.

When the pure resistance characteristic computing process at step S11 is finished, thereafter the charging state computing process is carried out (step S12).

Figure 15:
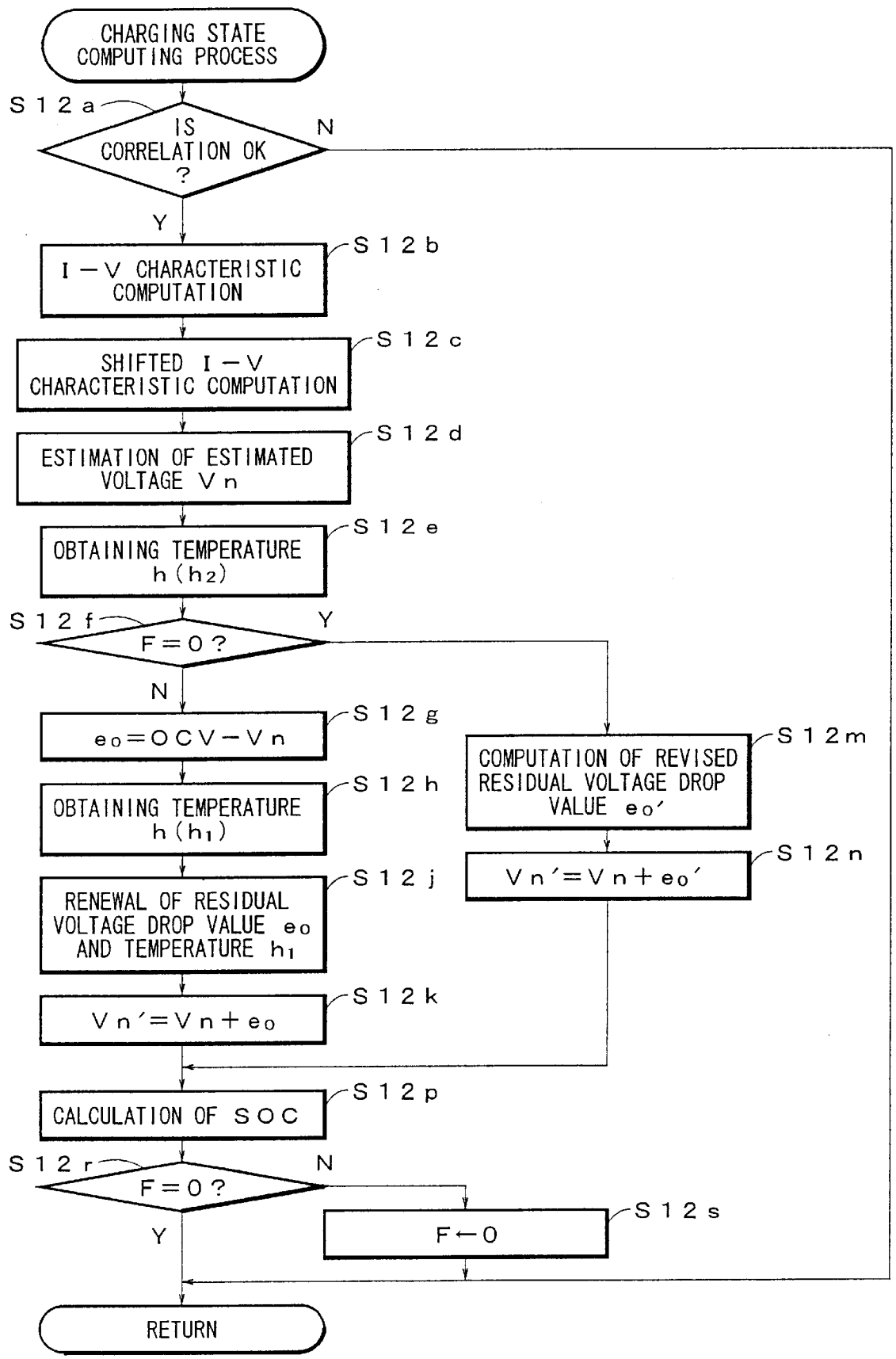
FIG. 15 is a flow chart of a subroutine illustrating the computing process of the charging state shown in FIG. 12.
Figure 16:
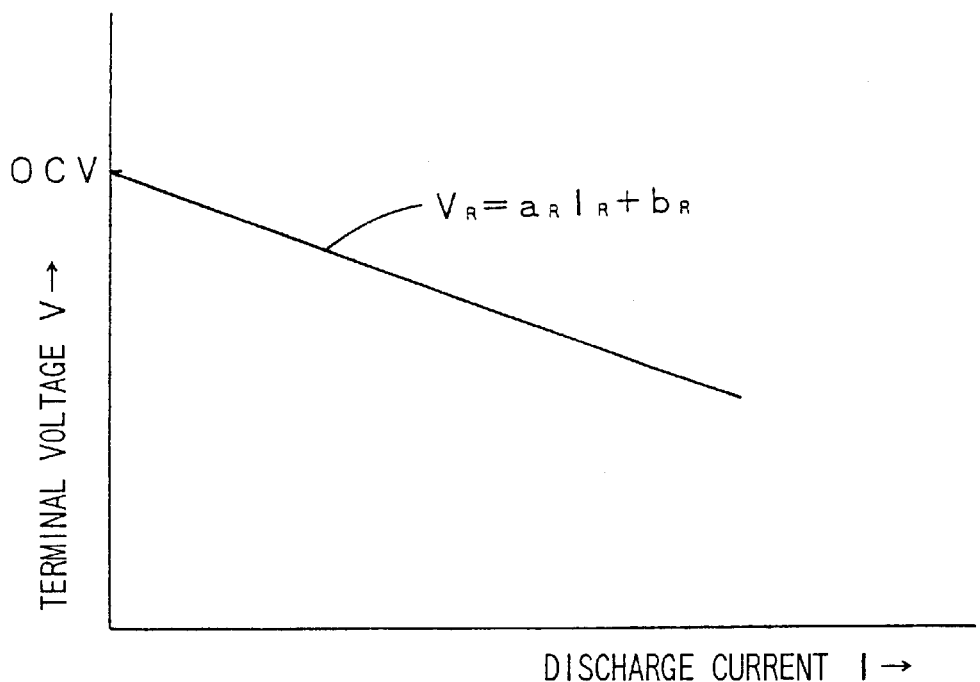
FIG. 16 is a graph illustrating a voltage-current characteristic, which depends only on a pure resistance component of the battery in FIG. 10 and does not include the influence of the polarization.

As shown in a flow chart of a sub-routine in FIG. 15, in the charging state computing process in step S12, for the real data while the discharge current decreases from the peak value of 250 A (ampere) up to 35 A out of the real data collected at step S10, a correlation coefficient r for confirming the correlation of the data is calculated, then it is confirmed whether or not the value of r lies in a permissible range of −0.9 r−1.0 (step S12a).

If r does not lie in the permissible range and the correlation is not OK (N at step S12a), the processing finishes the charging state computing process and returns to the main routine in FIG. 12. On the other hand, if r lies in the permissible range and the correlation is OK (Y at step S12a), a least squares method is applied to the real data collected at step S10, thereby a linear equation of the voltage-current characteristic of $V=aI+b$ is computed (step S12b).

Thereafter, a shifted voltage-current characteristic equation of $V=aI+b$ is computed (step S12c), wherein the voltage-current characteristic of $V=aI+b$ computed at step S12b is shifted in the direction of the voltage axis so that the voltage-current characteristic of $V=aI+b$ passes through a coordinate value of (V1, I1), wherein the current value I1 is a current lower than the maximum current vale=250 A and higher than the target current value=35 A and certainly flows when the motor generator 5 is operated as a starter motor, and the voltage value V1 corresponds to the current value I1, and the voltage value V1 and the current value I1 are on the linear equation of the voltage-current characteristic $VR=aRIR+bR$ computed in the pure resistance characteristic computing process at step S11, which does not include the influence of the polarization and depends only on the pure resistance of the battery.

Thereafter, an imaginary current vale Is=−10 A (ampere), at which the estimated voltage Vn during the constant current discharge exhibits a linear characteristic relatively to the capacity of the battery 13, is substituted into the shifted voltage-current characteristic equation of $V'=aI+b'$ computed at step S12c, thereby estimating the estimated voltage Vn (step S12d).

Then, the A D converted value of temperature h in the engine room detected by the temperature sensor 19 is obtained from the I F21 as a temperature $h_2$ of or around the battery 13 upon the estimation of the estimated voltage Vn (step S12e), thereafter it is confirmed whether or not the flag F1 in the equilibrium state flag area is (step S12f).

If F1 is (Y at step S12f), the processing advance to step S12m (explained later on). On the other hand, if F1 is not (N at step S12f), the residual voltage drop value e0 is computed (step S12g) by subtracting the estimated voltage Vn estimated at step S12d from the open circuit voltage OCV stored in the NVM 25, and the A D converted value of temperature h in the engine room detected by the temperature sensor 19 is obtained from the I F21 as a temperature $h_1$ of or around the battery 13 upon the renewal of the residual voltage drop value $e_0$ (step S12h).

Thereafter, the residual voltage drop value $e_0$ stored in the NVM and the temperature $h_1$ of or around the battery 13 upon the storage of the residual voltage drop value $e_0$ are renewed to the residual voltage drop value $e_0$ computed at step S12g and the A D converted value of the temperature h in the engine room obtained at step S12h, respectively (step S12j), then the estimated voltage Vn estimated at step 12d is added to the renewed residual voltage drop value $e_0$ in the NVM 27, thereby the revised estimated voltage Vn is computed (step S12k) and then, the processing advances to step S12p (explained later on).

At step S12m, to which the processing advances if the flag F1 in the equilibrium state flag area is at step 12f, on the basis of the temperature h2 of or around the battery 13 upon the estimation of the estimated voltage Vn obtained at step S12d and the temperature h1 of or around the battery 13 upon the renewal of the renewed residual voltage drop value e0 stored in the NVM 27, the residual voltage drop value e0 stored in the NVM 27 is revised by the coefficient of the revised data stored in the ROM 23c, thereby the revised residual voltage drop value e0 is computed, then revised residual voltage drop value e0 is added to the estimated voltage Vn obtained at step S12d, thereby the revised estimated voltage Vn is computed and then, the processing advances to step S12p.

At step S12p, to which the processing advances after computing the revised estimated voltage Vn at step S12k or step S12n, the revised estimated voltage Vn is substituted into either an equation based on the voltage ratio SOC={(Vn Ve) (Vs−Ve)}×100 (%), or an equation based on the electric power ratio $$SOC = \{[Vn' + Ve)2] \times [(Vn' - Ve)(Vs - Ve)] \times Ah\}$$
$$\{[(Vs + Ve)2] \times Ah\} \times 100 \ (\%)$$
$$= \{(Vn'^2 - Ve^2)(Vs^2 - Ve^2)\} \times 100 \ (\%),$$

wherein Vs is the open circuit voltage upon the fully charged state and Ve is the open circuit voltage at the end of the discharge, thereby calculating the state of charge SOC of the battery 13.

Thereafter, whether or not the flag F1 in the equilibrium state flag area is is confirmed (step S12r). If it is (Y at step S12r), the processing finishes the charging state computing process and returns to the main routine in FIG. 12, then advances to step S13.

At step S13, to which the processing advances when the starter switch is not set on at step S9 or after the charging state computing process at step S12 is finished, as shown in FIG. 12, whether or not the input of the switch-on signal is continued is confirmed (step S13). If continued (Y at step S13), the processing returns to step S9. On the other hand, if not continued (N at step S13), the present time counted in the inside time counter is stored in an area of electricity-conducting finish time of the RAM 23b, the measuring time t in the inside wake-up timer is reset (step S14), the operation mode of the microcomputer 23 is set to be the sleep mode (step S15), then whether or not the power-supplying from the battery 13 is cut is confirmed (step S16).

If the power supplying is not cut (N at step S16), the processing returns to step S2, on the other hand if cut (Y at step S16), the finishing process is carried out (step S17), thereby a series of processes is completed.

As is clear from the above explanation, in the battery capacity computing apparatus 1 of the preferred embodiment, the step S12b in the flow chart in FIG. 15 denotes a process corresponding to the first computing means 23A described in the claims, the step S12c in FIG. 15 denotes a process corresponding to the second computing means 23B in the claims, and the step S12d in FIG. 15 denotes a process corresponding to the estimating means 23C in the claims.

Further, in the battery capacity computing apparatus 1 of the preferred embodiment, the step S4a in the flow chart in FIG. 13 denotes a process corresponding to the judging means 23E described in the claims, the step S11 in the flow chart in FIG. 12 denotes a process corresponding to the third computing means 23D described in the claims, and the step S11 in FIG. 12 and the step S12f in FIG. 15 denote a process corresponding to the fourth computing means 23H described in the claims.

Further, in the battery capacity computing apparatus 1 of the preferred embodiment, the step S11f and the step S11g in FIG. 15 denote a process corresponding to the calculating means 23F described in the claims, and the step S11j in FIG. 15 denote a process corresponding to the renewing means 23G described in the claims.

Further, in the battery capacity computing apparatus 1 of the preferred embodiment, the step S11m in FIG. 15 denote a process corresponding to the revising means 23J described in the claims, and the voltage sensor 17 and the step S4b in FIG. 13 constitute the measuring means A described in the claims.

In the following, an operation (action) of the battery capacity computing apparatus 1 constructed as described above will be explained.

In such a state that the electric parts (loads) except the motor generator 5 in the hybrid vehicle operates or the motor generator is operated so as to function as a motor thereby the battery 13 is carrying out a discharge or that the motor generator 5 is operated so as to function as a generator thereby the battery 13 is carrying out a charge, none of a renewal of the open circuit voltage OCV stored in the NVM 25, a renewal of the residual voltage drop value $e_0$ stored in the NVM 27 and a renewal of the temperature $h_1$ of or around the battery 13 when the residual voltage drop value $e_0$ is stored in the NVM 27 is carried out. Further, neither the estimation of the estimated voltage Vn nor the computation and renewal of the charging state SOC on the basis of the estimated voltage Vn is carried out.

When the starter switch is set on, accordingly the motor generator 5 in the hybrid vehicle is operated so as to function as a starter motor, and accordingly the battery 13 carries out a constant load discharge with a predetermined large current value exceeding 250 A (ampere), a pair of the discharge current I of the battery 13 during the discharge and the terminal voltage V of the battery 13 is periodically collected, the real data of thus collected discharge current I and terminal voltage V for the newest predetermined period of time are analyzed, and by using a least squares method whether or not the real data are suitable for computing a quadratic approximate curve equation of the voltage-current characteristic is judged.

If judged suitable, from the collected real data for the newest predetermined period of time, computed are the first approximate curve equation M1 expressed by, for example, V1(I)=a1I$^2$+b1I+C1 for the voltage-current characteristic of the battery 13 during the increase of the discharge current and the second approximate curve equation M2 expressed by, for example, V2(I)=a2I$^2$+b2I+C2 for the voltage-current characteristic of the battery 13 during the decrease of the discharge current.

Further, the first and second revised gradients are computed from M1 and M2 and the first and second imaginary points corresponding to M1 and M2, respectively. The pure resistance of the battery 13 is computed by addition-averaging the first and second gradients, then on the basis of the pure resistance and the discharge current I periodically measured during the constant load discharge with the predetermined large current value, the linear equation of the voltage-current characteristic $V_R = a_R I_R + b_R$, which does not include the influence of the polarization and depends only on the pure resistance of the battery, is computed.

Figure 17:
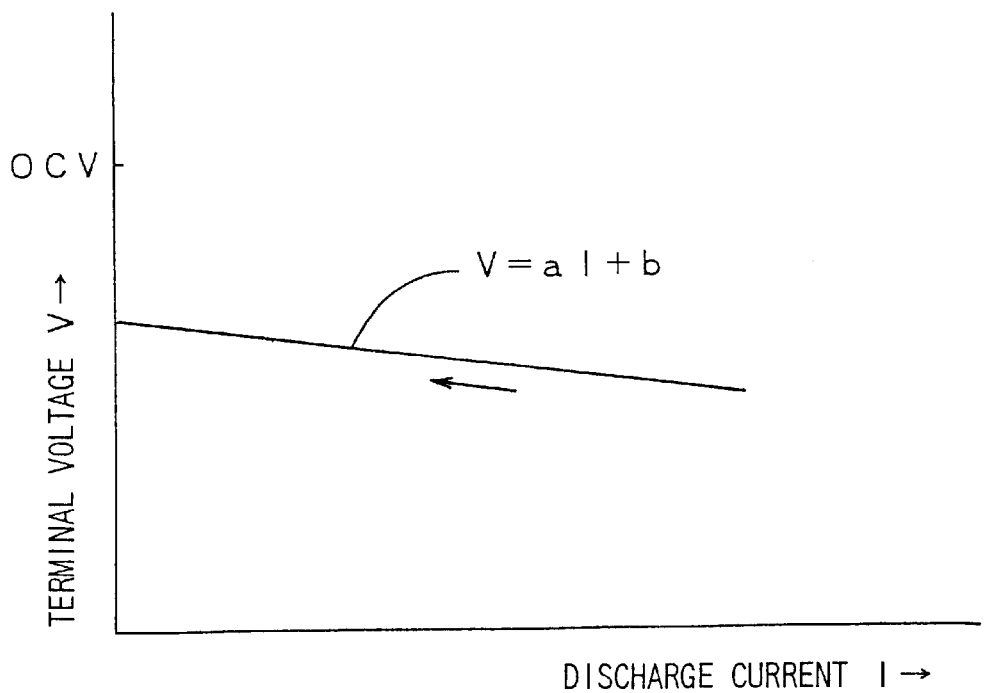
FIG. 17 is a graph illustrating a voltage-current characteristic, which includes the influence of the polarization during the decrease in the discharge current of the battery in FIG. 10.

When the starter switch is set on, accordingly the motor generator 5 in the hybrid vehicle is operated so as to function as a starter motor, and accordingly the battery 13 carries out a constant load discharge with a predetermined large current value exceeding 250 A (ampere), while the discharge current I of the battery 13 during the discharge decreases to the target current value of 35 A, a pair of the discharge current I and terminal voltage V of the battery 13, which are detected by the current sensor 15 and voltage sensor 17, respectively, are periodically collected. If these data comply with a specific correlation, by applying a least squares method thereto, a linear voltage-current characteristic equation V=aI+b for the battery 13 as shown with a graph in FIG. 17, which includes the influence of the polarization, is computed.

Figure 18:
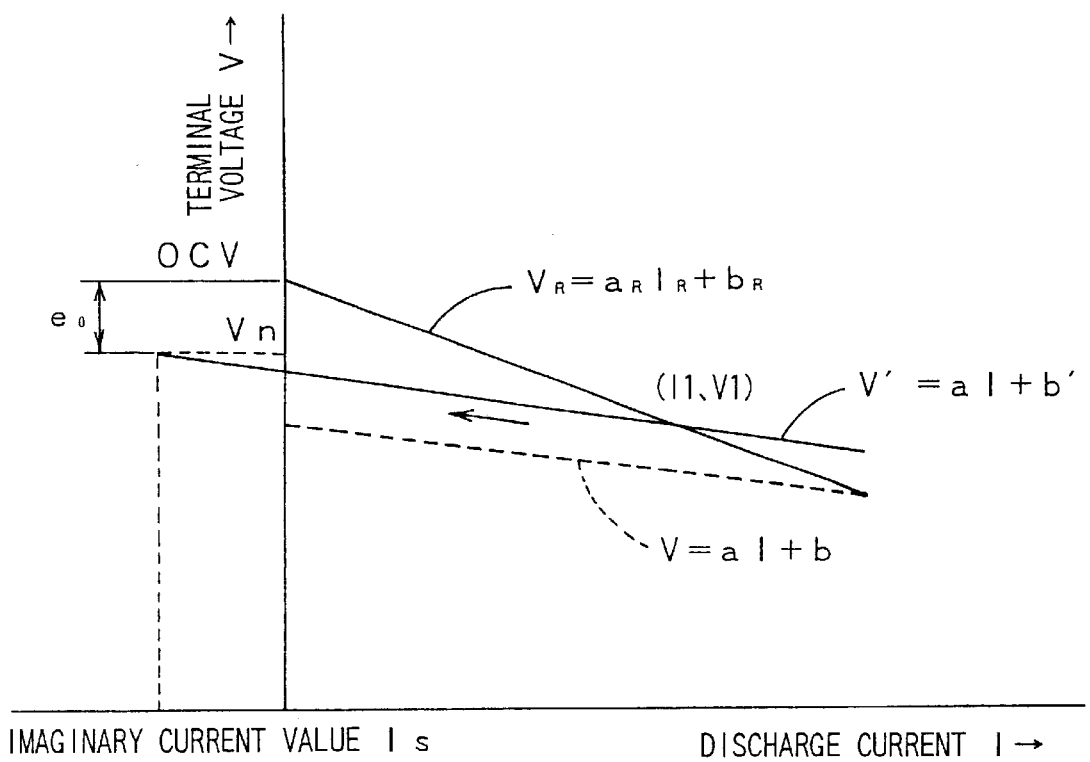
FIG. 18 is a graph illustrating a voltage-current characteristic including the influence of the polarization, in which the voltage-current characteristic of FIG. 17 is shifted in the direction of the voltage axis so as to overlap with the voltage-current characteristic of FIG. 16.
Figure 23:
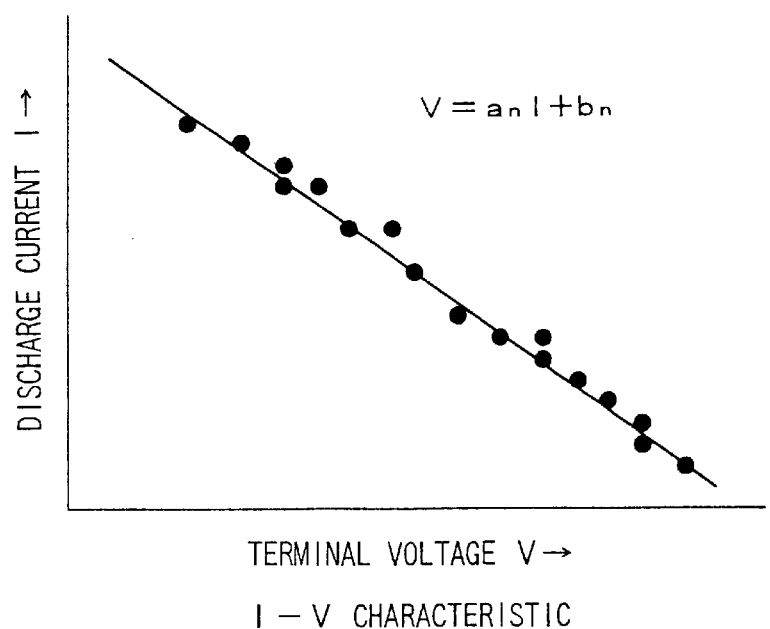
FIG. 23 is shows a graph schematically illustrating a relation between the sampled sets of the terminal voltage and the discharge current, which are sampled in a process of the constant current discharge of the battery, and the linear voltage-current characteristic equation, which is obtained from the sets by using the method of least squares.

Then, as shown with a graph in FIG. 18, a shifted voltage-current characteristic equation of V=aI+b is computed, wherein the voltage-current characteristic equation of V=aI+b is shifted in the direction of the voltage axis so that the voltage-current characteristic equation of V=aI+b passes through a coordinate value of (V1, I1), wherein the current value I1 is a current lower than the maximum current vale and higher than the target current value and certainly flows when the motor generator 5 is operated as a starter motor, and the voltage value V1 corresponds to the current value I1, and the voltage value V1 and the current value I1 are on the linear equation of the voltage-current characteristic VR=aRIR+bR, which does not include the influence of the polarization and depends only on the pure resistance of the battery.

From a graph shown in FIG. 18, the shifted voltage-current characteristic equation of V=aI+b indicates that the terminal voltage V, which decreases to V1 with being affected only by the voltage drop due to the pure resistance of the battery 13 during the increase of the discharge current I, increases with the decrease of the discharge current I having the influence of the voltage drop due to the polarization in addition to the influence of the voltage drop due to the pure resistance of the battery 13 after the discharge current I reaches I1 and starts decreasing.

Consequently, the voltage drop component of the terminal voltage V during the increase of the discharge current I, the quantity of which varies depending on the discharge current value and the discharge period of time, is not included in the shifted voltage-current characteristic equation of V=aI+b Moreover, the linear equation of the voltage-current characteristic $V_R=a_R I_R+b_R$ shown in FIG. 18, which does not include the influence of the polarization, includes neither the voltage drop component due to the polarization of the battery 13 nor the voltage drop component due to the pure resistance of the battery. Since the voltage value at the current=zero on the linear equation of the voltage-current characteristic $V_R=a_R I_R+b_R$ is nothing but the open circuit voltage OCV of the battery 13, therefore the linear equation of the voltage-current characteristic $V_R=a_R I_R+b_R$, which does not include the influence of the polarization, is nothing but a voltage-current characteristic, which totally excludes the influence of the voltage drop due to the polarization when the battery 13 that has been in an equilibrium carries out the constant load discharge with the predetermined large current value.

Consequently, the shifted voltage-current characteristic equation of V=aI+b which is obtained by shifting the voltage-current characteristic equation of V=aI+b including the influence of the polarization in the direction of the voltage axis so that the voltage-current characteristic equation of V=aI+b intersects with the linear equation of the voltage-current characteristic VR=aRIR+bR at the coordinate value of (V1, I1), corresponds to a voltage-current characteristic during the decrease of the discharge current I when the battery 13 that has been in an equilibrium carries out the constant load discharge with the predetermined large current value.

Therefore, the computed shifted voltage-current characteristic equation of V=aI+b is always the same not depending on whether or not the discharge current I and terminal voltage V of the battery 13 are those during the discharge of the battery 13 that has been in an equilibrium, wherein I and V are used for computing the equation of V=aI+b and the equation of VR=aRIR+bR.

When the shifted voltage-current characteristic equation of V=aI+b which does not include the influence of the difference of the voltage drop quantity of the terminal voltage during the increase of the discharge current I depending on the discharge current value and the discharge period of time and does not varied depending on whether or not the battery 13 before the start of the discharge has been in an equilibrium state, is computed as described above, the estimated voltage Vn is estimated by substituting an imaginary current value Is=−10 A (ampere), at which the estimated voltage Vn during the constant current discharge exhibits a linear characteristic relatively to the capacity of the battery 13, into the equation of V=aI+b Then, the residual voltage drop value $e_0$ stored in the NVM 27 is revised for temperature compensation on the basis of the temperatures $h_1$ and $h_2$. Thus revised residual voltage drop value $e_0$ is added to the estimated voltage Vn previously estimated, thereby the revised estimated voltage Vn is computed, then the revised estimated voltage Vn is substituted into either an equation based on the voltage ratio or that based on the electric power ratio, thereby the charging state SOC of the battery 13 is computed, and the result is provided as the data for the display or capacity control.

The pair of discharge current I and terminal voltage V periodically measured for computing the shifted voltage-current characteristic equation of V=aI+b of the battery 13, which is used to estimate the estimated voltage Vn, is collected during the discharge with 250 A for the motor generator 5, which is made to function as a starter motor that is the maximum load in a hybrid vehicle and collected in a state that the discharge current I exceeding 35 A, to which a current cannot reach even when the power of the battery 13 is simultaneously supplied to the other loads, flows.

Therefore, even when the power of the battery 13 is simultaneously supplied to the other loads except the motor generator 5 and the voltage drop due to the discharge-side polarization has already arisen thereby, the residual voltage drop value $e_0$ computed as a residual voltage drop quantity due to the influence of the residual polarization at the end of the discharge for the motor generator 5 is added to the estimated voltage Vn estimated, thereby the open circuit voltage OCV of the battery 13 can be accurately computed and further the charging state SOC can be accurately computed.

In the battery capacity computing apparatus 1 of the preferred embodiment, as is described above, the shifted voltage-current characteristic equation of V=aI+b is computed, wherein the voltage-current characteristic of V=aI+b, which is computed from the pair of the discharge current I and terminal voltage V during the decrease of the discharge current I of the constant load discharge with the predetermined large current value and includes the influence of the polarization during the decrease of the discharge current I, is shifted in the direction of the voltage axis so that the voltage-current characteristic of V=aI+b passes through a coordinate value of (V1, I1), wherein the voltage value V1 corresponds to the current value I1, and the voltage value V1 and the current value I1 are on the linear equation of the voltage-current characteristic VR=aRIR+bR, which does not include the influence of the polarization and depends only on the pure resistance of the battery, thereafter an imaginary current vale Is=−10 A (ampere) is substituted into the shifted voltage-current characteristic equation of V=aI+b thereby estimating the estimated voltage Vn.

Consequently, the estimated voltage Vn can be accurately estimated neither depending on whether or not the battery 13 before the discharge has been in an equilibrium state nor depending on what kind of the discharge current value and the discharge period of time the battery 13 uses during the discharge, and a single value of the residual voltage drop $e_0$ is added to the estimated voltage Vn estimated, thereby the open circuit voltage OCV of the battery 13 can be accurately computed and further the charging state SOC always can be accurately computed.

Further, in the battery capacity computing apparatus 1 of the preferred embodiment, when the starter switch is set on and accordingly the battery 13 carries out the constant load discharge with a current value exceeding 250 A, if the battery 13 has not carried out the charge or discharge for a period of time exceeding a predetermined period of time Th required to cancel the polarization from the maximum polarization state before the start of the discharge, the open circuit voltage OCV of the battery 13 stored in the NVM 25 is renewed to the terminal voltage V of the battery 13 detected before the start of the constant load discharge, assuming that a voltage variation (voltage rise or voltage drop) due to the polarization arisen when the battery 13 previously carried out a charge or discharge is completely canceled, that is, that the battery 13 reaches in an equilibrium state.

Then, when the battery 13 in an equilibrium carries out the constant load discharge with a predetermined large current value just after the open circuit voltage OCV is renewed to the newest value thereof, the residual voltage drop value $e_0$ stored in the NVM 27 is renewed to the newest residual voltage drop value $e_0$, which is a value obtained by subtracting the estimated voltage Vn estimated after the discharge from the open circuit voltage OCV in the NVM 25 renewed before the start of the discharge.

Therefore, even if the open circuit voltage OCV varies due to the change in the capacity of the battery 13, whenever the battery 13 reaches into an equilibrium, the open circuit voltage OCV stored in the NVM 25 is renewed to the newest value thereof, then during the constant load discharge of the battery 13 with a predetermined large current value which is carried out immediately thereafter, the residual voltage drop value $e_0$ corresponding to the present capacity of the battery 13 is newly computed from the renewed open circuit voltage OCV so as to accurately compute the open circuit voltage OCV of the battery 13 after the variation in the open circuit voltage OCV, thereby the accuracy of the computation of the charging state SOC can be maintained high.

Furthermore, in the battery capacity computing apparatus 1 of the preferred embodiment, if the temperature $h_1$ is different from the temperature $h_2$, the residual voltage drop value $e_0$ is subjected to the revision for temperature compensation in response to the difference, and since the revised residual voltage drop value $e_0$ is used for computing the charging state SOC of the battery 13 by adding to the estimated voltage Vn, therefore even if a change in the temperature h, which causes a change in the residual voltage drop value e0 or in the value of the open circuit voltage OCV of the battery 13, takes place for or around the battery 13, the change in the temperature h being a difference thereof between when the residual voltage drop value e0 is computed and when the charging state SOC of the battery 13 is computed by adding the residual voltage drop value e0 to the estimated voltage Vn, the charging state SOC of the battery 13 can be accurately computed taking it into consideration.

In this connection, the whole or a part of the construction for the temperature compensation of the residual voltage drop value $e_0$ or that for the revision of the open circuit voltage and/or the residual voltage drop value $e_0$ may be omitted, provided that there is no problem in terms of the relation with the accuracy required.

Further, a period of time for periodically collecting a pair of the discharge current I and terminal voltage V of the battery 13, which is used to compute the voltage-current characteristic equation V=aI+b of the battery 13 for estimating the estimated voltage Vn, may not be limited to the period of time from the time when the discharge current I starts to decrease from 250 A to the time when it reaches 35 A while the battery 13 carries out the constant load discharge with a current value exceeding 250 A like the battery capacity computing apparatus 1 of the preferred embodiment.

Further, a method for computing the equation of the voltage-current characteristic equation $V_R=a_RI_R+b_R$ of the battery 13, which does not include the influence of the polarization, or for computing the pure resistance of the battery 13 is not limited to the method explained in the preferred embodiment as described above and instead, may be an optional method, for example, for computing that by collecting the behavior of the discharge current I and terminal voltage V of the battery 13 for a very short specific period of time during the discharge.

Further, in the preferred embodiment, a voltage-current characteristic including the influence of the polarization during the decrease of the discharge current I, which is computed from a pair of the discharge current I and terminal voltage V periodically measured while the discharge current I decreases during the constant load discharge with the predetermined large current value, is set to be the linear voltage-current characteristic equation V=aI+b. Instead, the second approximate curve equation M2, that is, the quadratic equation expressed by $V2(I)=a2I^2+b2I++C2$ to be used for computing the pure resistance of the battery 13 may be computed from a pair of the discharge current I and terminal voltage V measured while the discharge current I decreases during the constant load discharge with the predetermined large current value.

In such a case described just above, the equation M2 is shifted in the direction of the voltage coordinate axis so that the equation M2 passes through the coordinate value $(V_1, I_1)$ on the linear equation of the voltage-current characteristic $V_R=a_RI_R+b_R$, which does not include the influence of the polarization and depends only on the pure resistance of the battery, thereby the shifted voltage-current characteristic equation of V2I)=a2I2+b2I+C2 is computed, then the imaginary current value Is=−10 A is substituted into the equation V2I)=a2I2+b2I+C2 thereby the estimated voltage Vn is estimated, then the newest residual voltage drop value e0 is computed from the estimated voltage Vn so as to renew it and then, the newest residual voltage drop value e0 is added to the estimated voltage Vn, thereby the open circuit voltage OCV of the battery 13 is computed.

Thus, if a voltage-current characteristic including the influence of the polarization during the decrease of the discharge current is set to be the second approximate curve equation M2, the slow pace of the decrease in the voltage drop quantity of the terminal voltage V arisen in the battery 13 due to the polarization by the discharge is more accurately reflected in the equation M2 compared to the case of the liner equation of V=aI+b, thereby the accuracy of the estimated voltage Vn or of the open circuit voltage OCV can be improved further.

Further, in the preferred embodiment, the voltage-current characteristic equation V=aI+b including the influence of the polarization is computed on the basis of the discharge current I and terminal voltage V of the battery 13 measured during the constant load discharge with a current value exceeding 250 A while the motor generator 5, which independently consumes the maximum electric power is in operation. Instead, the equation V=aI+b including the influence of the polarization or the equations M1 and M2 may be computed on the basis of the discharge current I and terminal voltage V of the battery 13 with respect to the operation of the loads except the motor generator 5, wherein the maximum discharge current value is far less than 250 A, provided that the current value is large enough to cancel the charge-side polarization, which has arisen in the battery 13 at least just before the discharge.

Further, in the preferred embodiment, the charging state SOC is computed from the open circuit voltage OCV of the battery 13, which is computed by adding the residual voltage drop value $e_0$ to the estimated voltage Vn, instead, the open circuit voltage OCV of the battery 13 may be computed for the purpose of computing a value except the charging state SOC and similarly, the estimated voltage Vn may be estimated for the purpose of computing a value except the charging state SOC or the open circuit voltage OCV.

Further, in the preferred embodiment, when the pure resistance of the battery 13 is measured, optional points A and B are selected within the range where the real data exist on the approximate curves expressed by the two approximate curve equations M1 and M2 of the voltage-current characteristic, instead, these points A and B can be selected as point P corresponding to the maximum discharge current value of the battery, which is measured in order to compute the equations M1 and M2, wherein the point P is on the equations M1 and M2, thereby both points A and B can be specified by using a common data and the error is prevented from entering. This matter will be explained with reference to FIGS. 19 21 in the following.

Figure 19:
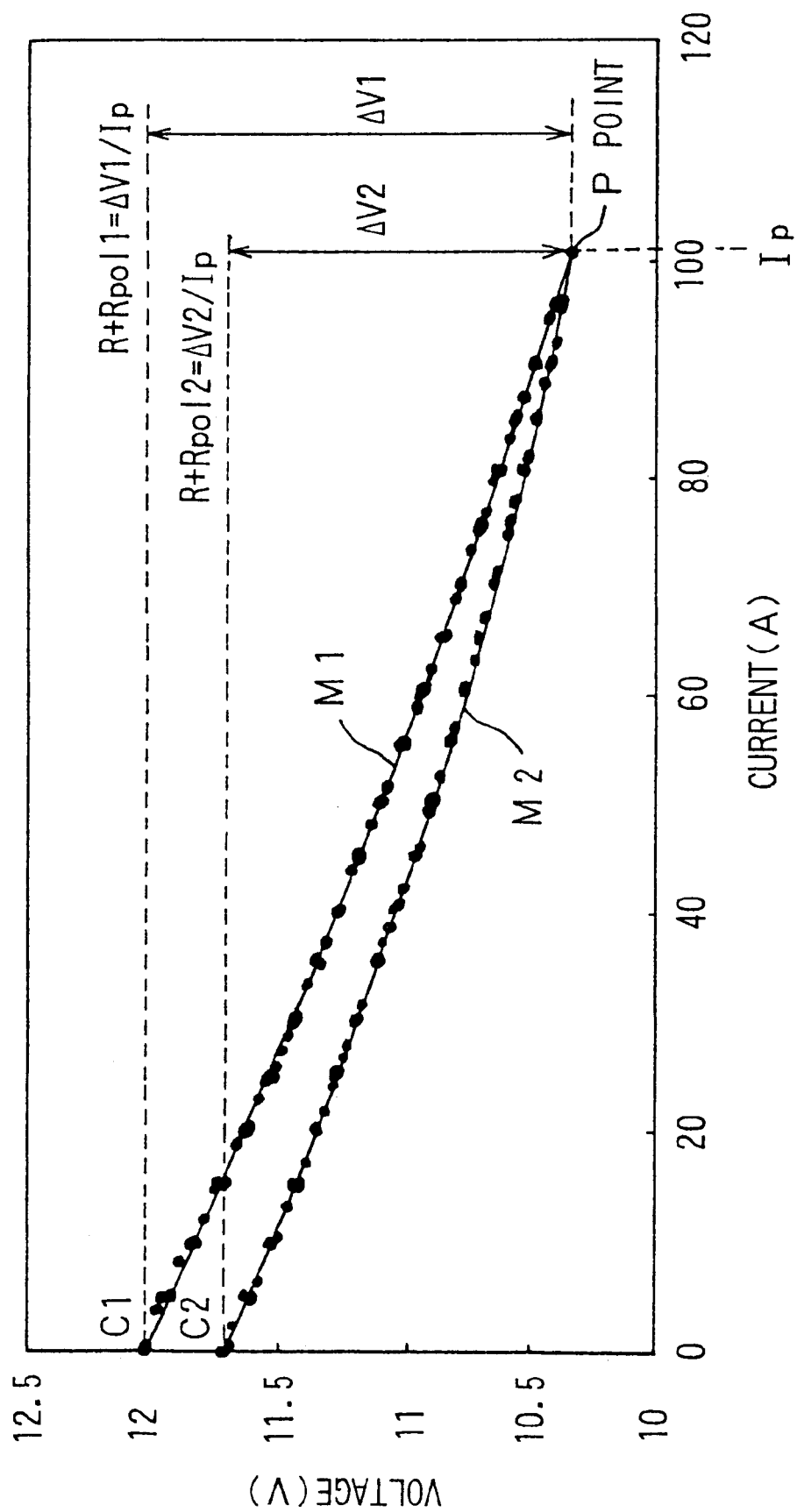
FIG. 19 is a graph illustrating how to define two points on two approximate characteristic curves in another procedure for measuring a pure resistance of the battery.

As shown in FIG. 19, first, a point P corresponding to the maximum discharge current value of the battery is selected on the two approximate curve equations M1 and M2. Then, a voltage drop ΔV1 from the intercept C1 of the approximate curve expressed by M1 relative to the longitudinal axis to the point P on the approximate curve is computed. A value of ΔV1 divided by the current value Ip at the point P is a combined resistance, which is obtained by adding the value of Rpol1 to the pure resistance R, wherein Rpol1 is a value of the polarization resistance component at that time, which is the other resistance component except the pure resistance R. That is, R+Rpol1=ΔV1Ip.

Then, as shown in FIG. 19, a voltage drop ΔV2 from the intercept C2 of the approximate curve expressed by M2 relative to the longitudinal axis to the point P on the approximate curve is computed. A value of ΔV2 divided by the current value Ip at the point P is a combined resistance, which is obtained by adding the value of Rpol2 to the pure resistance R, wherein Rpol2 is a value of the polarization resistance component at that time, which is the other resistance component except the pure resistance R. That is, R+Rpol2=ΔV2Ip.

The difference ΔR between the values of the combined resistance at the point P on the curve expressed by M1 and the point P on the curve expressed by M2 is expressed by ΔR=R+Rpol1−(R+Rpol2)=Rpol1−Rpol2, and is a difference between the two polarization resistance component values at the point P on the respective two different approximate curves. This is obvious from the fact that the pure resistance R does not vary during a single discharge.

Figure 20:
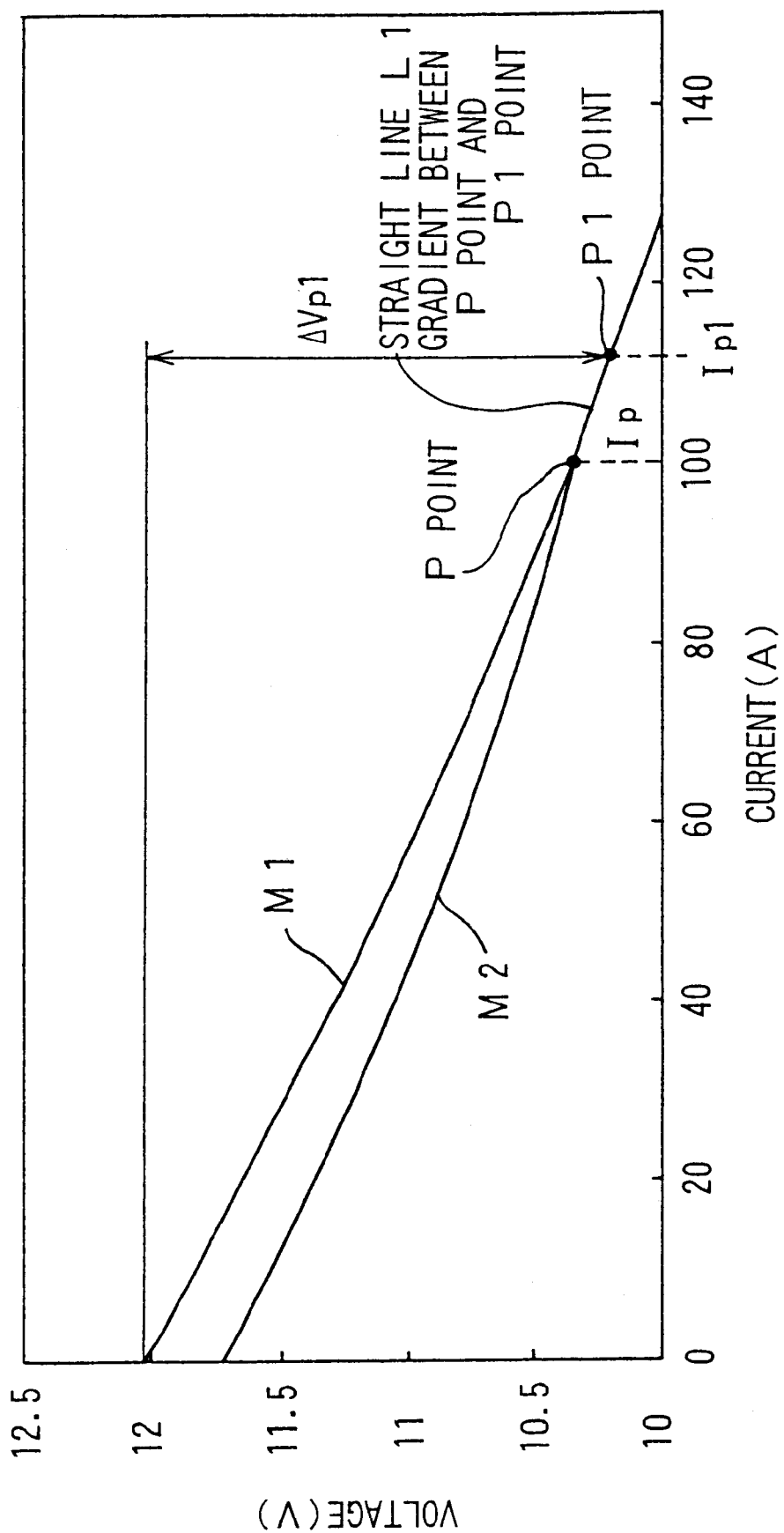
FIG. 20 is a graph illustrating how to define an assumed point relative to a point defined on one approximate characteristic curve and how to correct the gradient between the two points in another procedure for measuring a pure resistance of the battery.

In this connection, as shown in FIG. 20, on the approximate curve expressed by the equation M1 there is a point P1 having a value (R+Rpol1 that is equal to the combined resistance (R+Rpol2) at the optional point P selected on the approximate curve expressed by the equation M2. Similarly, on the approximate curve expressed by the equation M2 there is a point P2 having a value (R+Rpol2 that is equal to the combined resistance (R+Rpol1) at the optional point P selected on the approximate curve expressed by the equation M1. That is, the point P1 conforming to the relation of R+Rpol1=R+Rpol2 exists on the approximate curve expressed by the equation M1, while the point P2 conforming to the relation of R+Rpol1=R+Rpol2 exists on the approximate curve expressed by the equation M2.

In short, if the current and voltage at the point P1 are set to be Ip1 and Vp1, respectively, and the current and voltage at the point P2 are set to be Ip2 and Vp2, respectively, the polarization resistance component value at the coordinate (Ip1, Vp1) of the point P1 and that at the coordinate (Ip, Vp) of the point P are the same with each other, and similarly, the polarization resistance component value at the coordinate (Ip, Vp) of the point P and that at the coordinate (Ip2, Vp2) of the point P2 are the same with each other.

First, taking the point P on the approximate curve expressed by the equation M2 as a reference, a method for computing the current Ip1 and the voltage Vp1 at the point P1 having the value (R+Rpol1 equal to the value (R+Rpol2) of the combined resistance at the point P will be explained in the following.

Now, if the voltage drop from the intercept C1 of the approximate curve expressed by the equation M1 relative to the longitudinal axis to the point P1 is set to be ΔVp1, ΔVp1 is expressed by ΔVp1=C1−(a1Ip1²+b1Ip1+C1)=(R+Rpol2)Ip1, and it gives −(a1Ip1+b1)=R+Rpol2.

The current Ip1 at the point P1 is expressed by

Ip1=−(b1+R+Rpol2)a1.

Since R+Rpol2 (=R+Rpol1')=ΔVp Ip (=ΔVp1 Ip1), $$Ip1 = -[b1 + (\Delta Vp Ip)]a1$$
$$= -[b1 + (\Delta Vp1 Ip1)]a1.$$

As is obvious from the above equation, the voltage Vp1 at the point P1 is expressed by $$Vp1 = a1Ip1^2 + b1Ip1 + C1,$$

therefore, the coordinate (Ip1, Vp1) of the point P1 can be computed from known values.

Similarly, taking the point P on the approximate curve expressed by the equation M1 as a reference, the current Ip2 and the voltage Vp2 at the point P2 having the value (R+Rpol2) equal to the value (R+Rpol1) of the combined resistance at the point P can be computed from known values by equations $$Ip2 = -[b2 + (\Delta VpIp)]a2$$

$$= -[b2 + (\Delta Vp2Ip2)]a2$$

and $$Vp2 = a2Ip2^2 + b2Ip2 + C2,$$

wherein, $\Delta Vp2$ is the voltage drop from the intercept C2 of the approximate curve expressed by the equation M2 relative to the longitudinal axis to the point P2.

When the coordinate (Ip1, Vp1) of the point P1 is computed as described above, as shown in FIG. 20, the combined resistance value R1 is computed by calculating the gradient of the straight line L1 formed by connecting the coordinate (Ip1, Vp1) of the point P1 and the coordinate (Ip, Vp) of the point P. The combined resistance value R1 is computed by dividing the difference (Vp1 Vp) in the voltage drop arisen due to the combined resistance consisting of the pure resistance and the polarization resistance component Rpol2 by the difference (Ip1−Ip) in the current values flowing at the respective points. That is, $$R1 = (Vp1 - Vp)(Ip1 - Ip).$$

Figure 21:
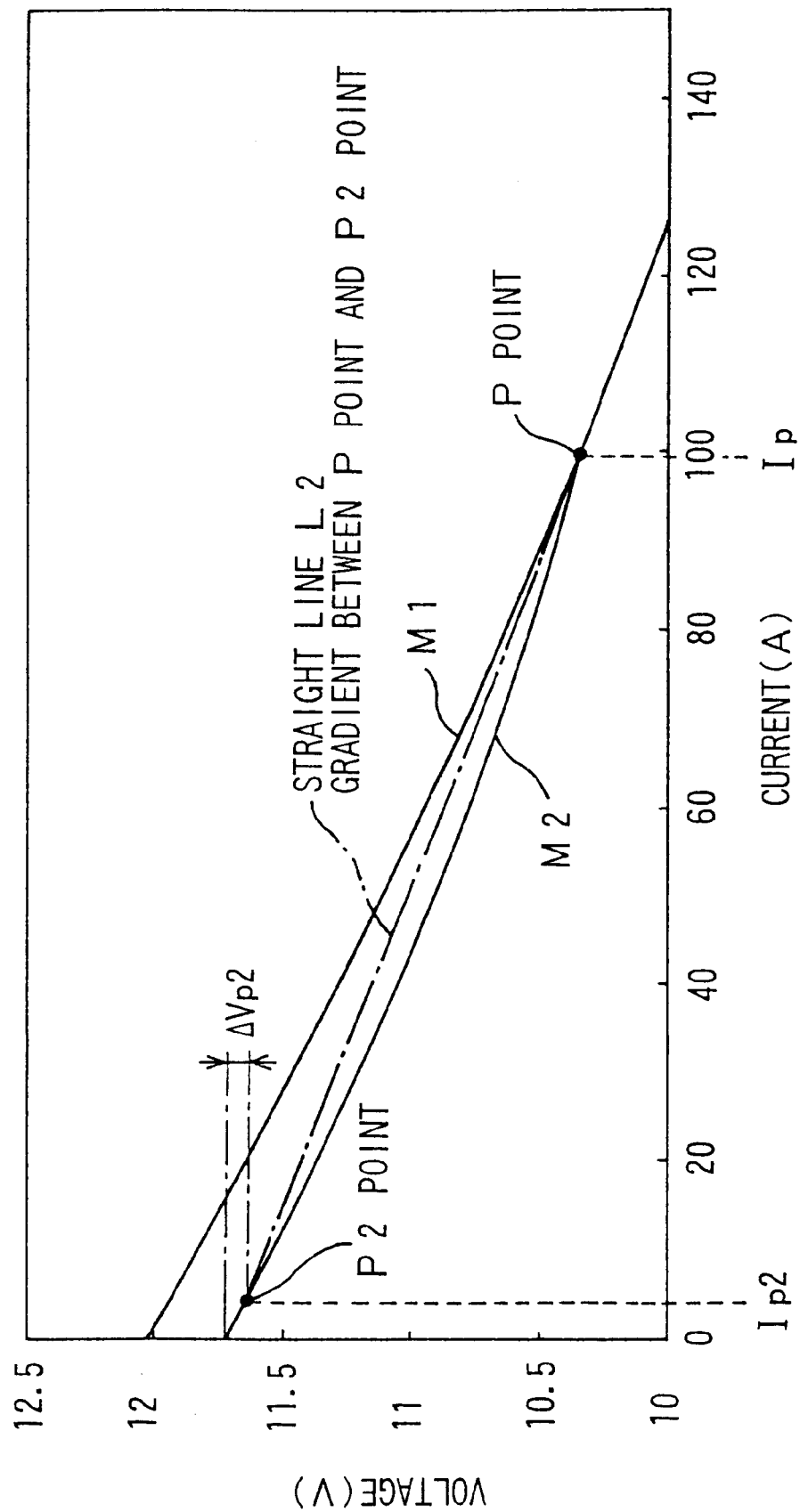
FIG. 21 is a graph illustrating how to define an assumed point relative to a point defined on another approximate characteristic curve and how to correct the gradient between the two points in another procedure for measuring a pure resistance of the battery.
Figure 22:
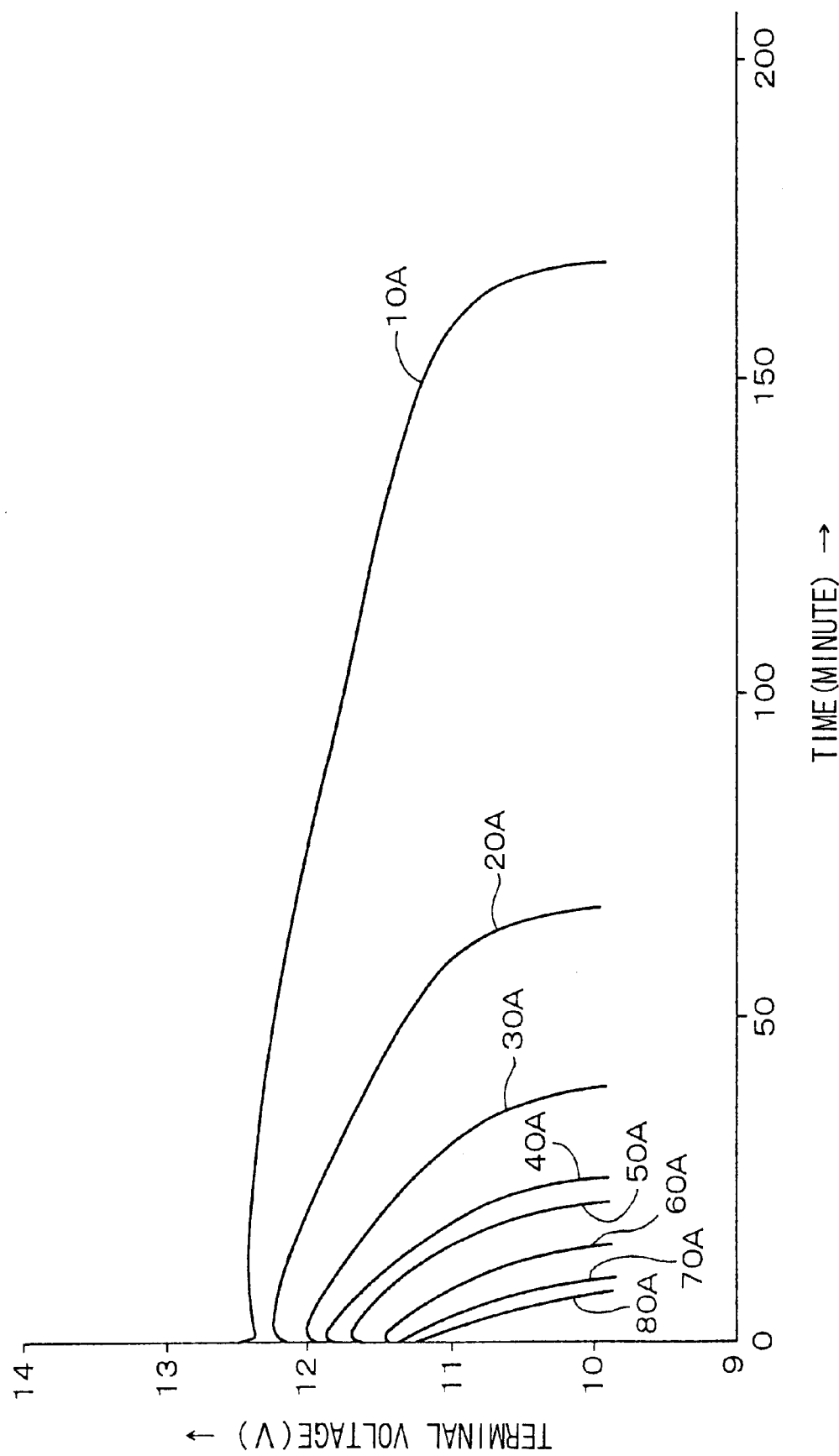
FIG. 22 is a graph illustrating a correlation between the terminal voltage and the discharge time in a constant current discharge process of the battery.
Figure 24:
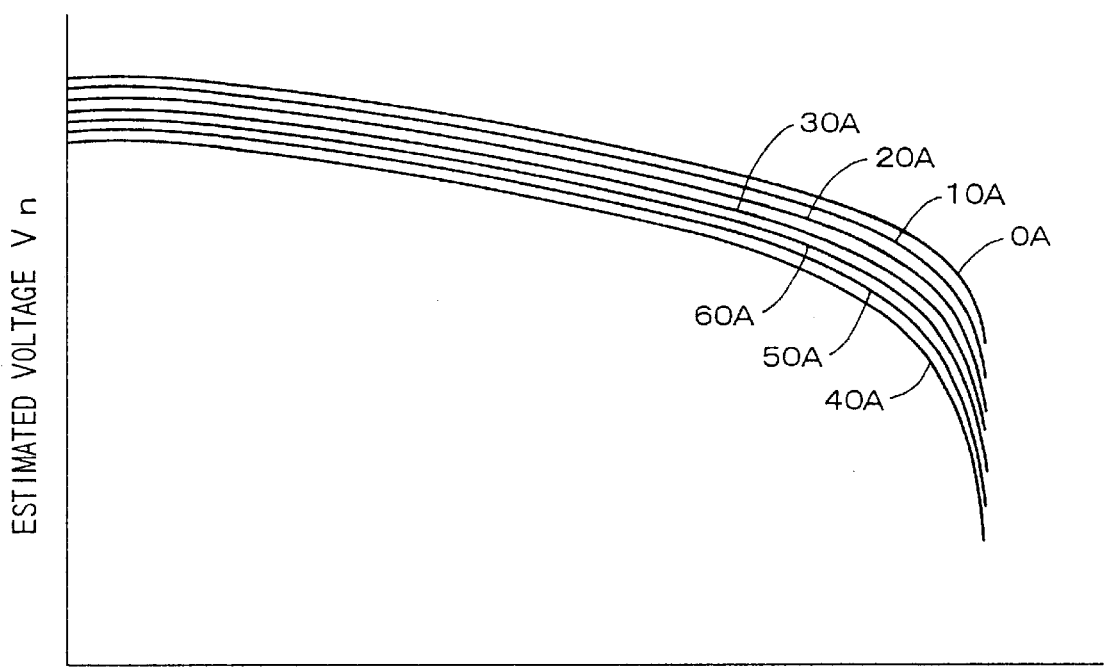
FIG. 24 shows graphs illustrating a plurality of constant current discharge characteristics obtained from the estimated voltage, which is estimated from the voltage-current characteristic shown in FIG. 23.
Figure 25:
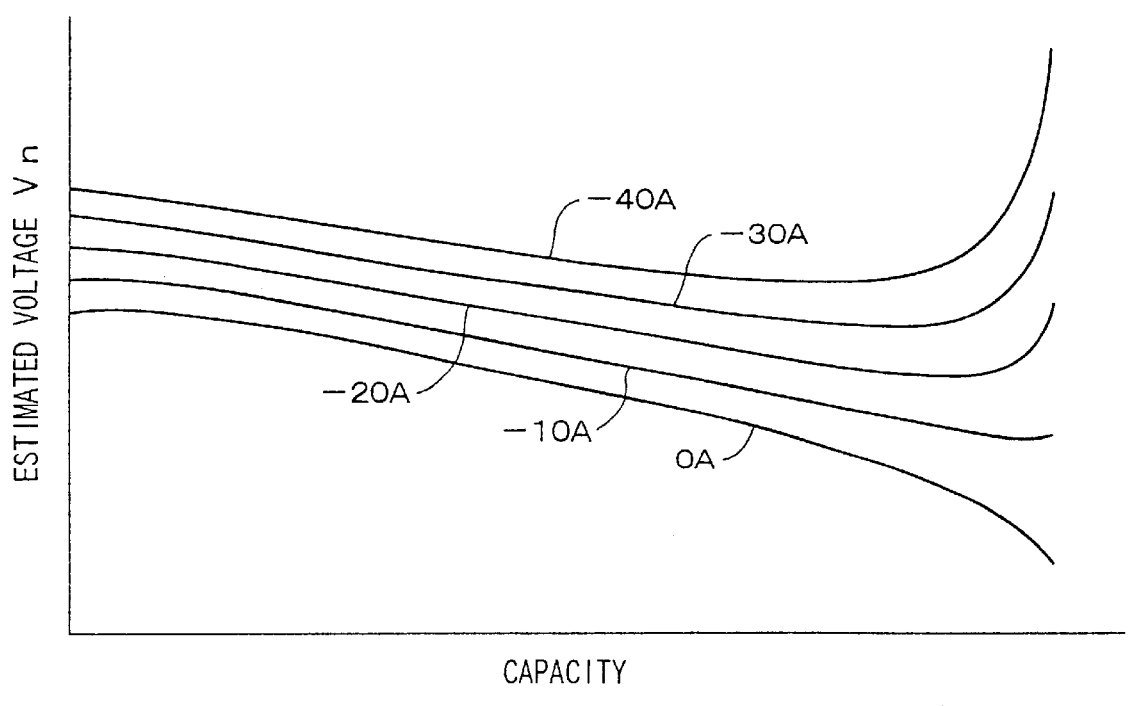
FIG. 25 shows graphs illustrating a plurality of imaginary constant current discharge characteristics obtained from the estimated voltage, which is estimated from the voltage-current characteristic shown in FIG. 23.
Figure 26:
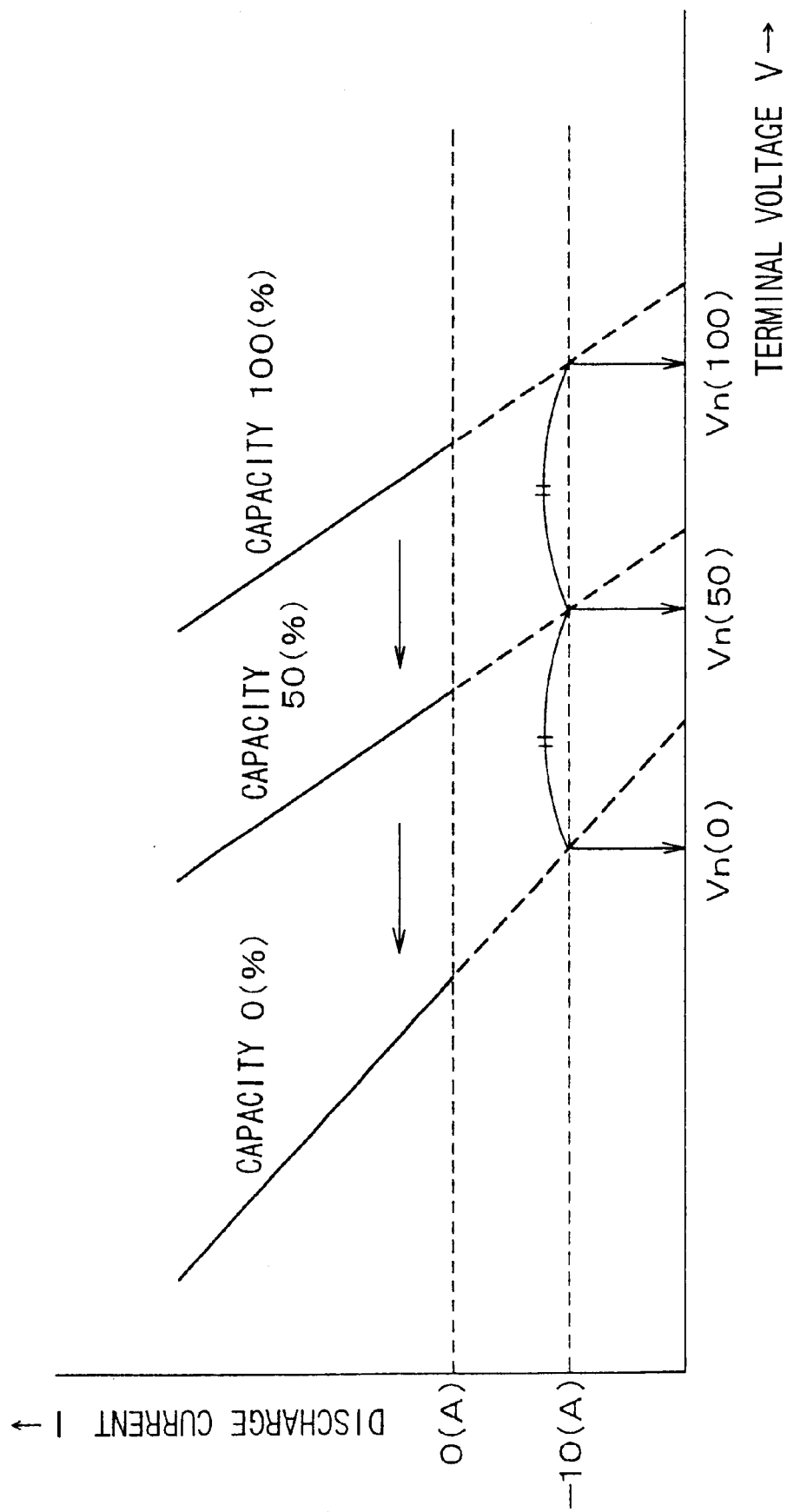
FIG. 26 shows graphs drawn in the same plane illustrating each voltage-current characteristic of the battery corresponding to the respective capacities.
Figure 27:
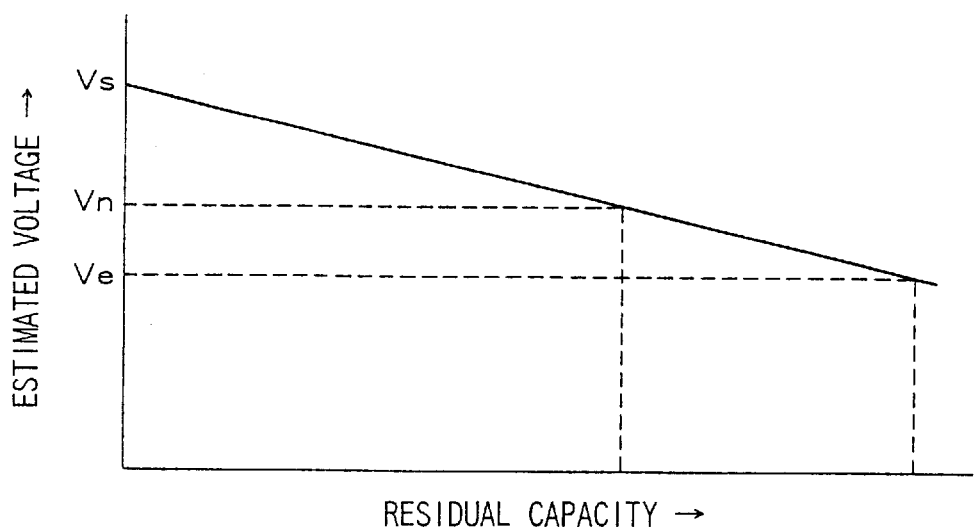
FIG. 27 shows a graph illustrating a relationship between the battery capacity at the imaginary discharge current value that shows a linear characteristic in the graph shown in FIG. 25 and the estimated voltage estimated from the voltage-current characteristic shown in FIG. 23.
Figure 28:
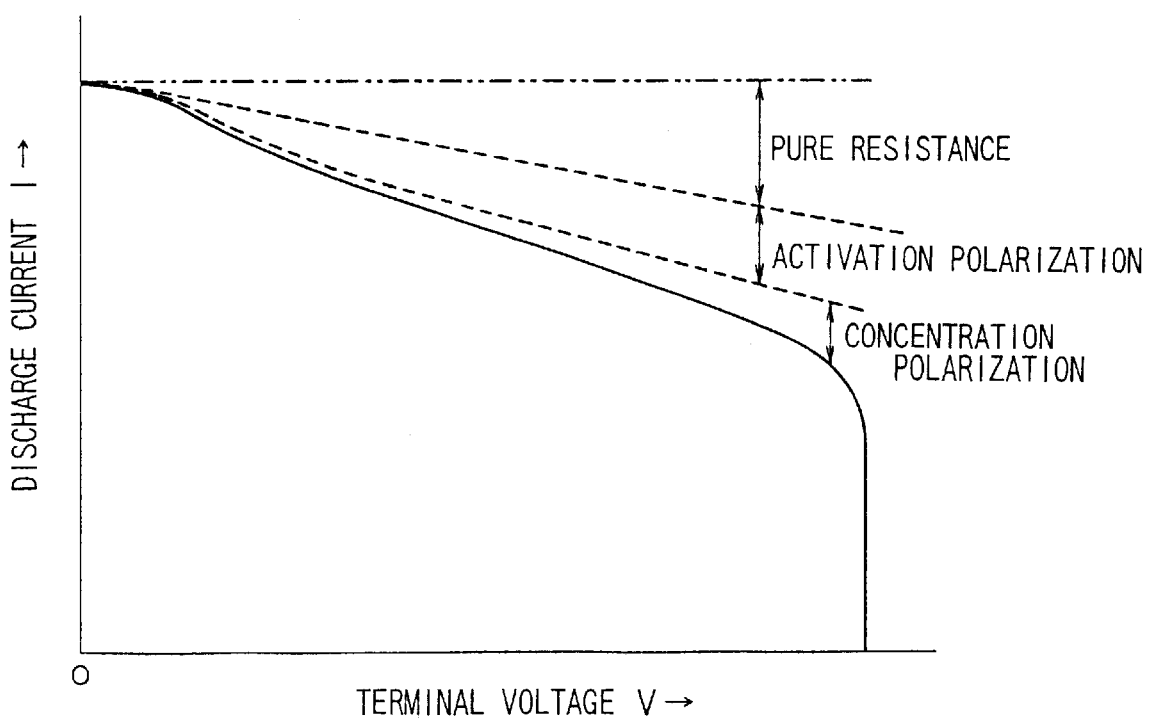
FIG. 28 shows a graph illustrating the voltage drop occurring during the discharge process of the battery.

Similarly, when the coordinate (Ip2, Vp2) of the point P2 is computed, as shown in FIG. 21, the combined resistance value R2 is computed by calculating the gradient of the straight line L2 formed by connecting the coordinate (Ip2, Vp2) of the point P2 and the coordinate (Ip, Vp) of the point P. The combined resistance value R2 is computed by dividing the difference (Vp Vp2) in the voltage drop arisen due to the combined resistance consisting of the pure resistance and the polarization resistance component Rpol1 by the difference (Ip Ip2) in the current values flowing at the respective points. That is, $$R2 = (Vp - Vp2)(Ip - Ip2).$$

However, since the combined resistance value R1 or R2 computed as described above is computed by dividing the difference in the voltage drop arisen due to the combined resistance consisting of the pure resistance and the polarization resistance component by the difference in the current values flowing at the respective points, therefore it does not agree with the pure resistance. In order to make the gradient between the two points agree with the pure resistance, the difference in the voltage drop, in which the contribution of the voltage drop due to the polarization resistance component is excluded, is divided by the difference in the current values, as will be explained in the following.

When the point P on the approximate curve expressed by the equation M2 is taken as a reference, if the combined resistance value R1 is expressed by $$R1 = R1 + Rpol2 = R1 + Rpol1$$

a voltage drop arisen due to that a current, corresponding to the difference between the current Ip1 at the point P1 and the current Ip at the point P, flows into the resistance R1 can be revised by pumping up (raising up) the voltage at the point P1 by a factor of the contribution of the voltage drop arisen due to that a current, corresponding to the difference between the current Ip1 at the point P1 and the current Ip at the point P, flows into the polarization resistance component Rpol1 (or Rpol2), that is, $$R1Ip1Ip) = [Vp1 + Rpol1Ip1Ip)]Vp.$$

The above equation is also expressed by $$R1Ip1Ip) = (Vp1Vp) + Rpol1Ip1Ip).$$

Since Rpol1=$\Delta Vp1$ Ip1−R1', $$R1'(Ip1-Ip) = (Vp1-Vp) + (\Delta Vp1Ip1-R1')(Ip1-Ip),$$

that is, $$2R1'(Ip1-Ip) = (Vp1-Vp) + \Delta Vp1Ip1(Ip1-Ip),$$

then as a result, obtained is an equation expressed by $$R1' = [(Vp1-Vp) + (\Delta Vp1Ip1)(Ip1-Ip)]2(Ip1-Ip).$$

Here, ($\Delta Vp1$ Ip1) can be replaced by ($\Delta Vp$ Ip).

Similarly, when the point P on the approximate curve expressed by the equation M1 is taken as a reference, if the combined resistance value R2 is expressed by $$R2 = R2' + Rpol1 = R2' + Rpol2',$$

a voltage drop arisen due to that a current, corresponding to the difference between the current Ip at the point P and the current Ip2 at the point P2, flows into the resistance R2 can be revised by pumping up (raising up) the voltage at the point P2 by a factor of the contribution of the voltage drop arisen due to that a current, corresponding to the difference between the current Ip at the point P and the current Ip2 at the point P2, flows into the polarization resistance component Rpol2 (or Rpol1), that is, $$R2'(Ip-Ip2) = Vp - [Vp2 - Rpol2'(Ip-Ip2)].$$

The above equation is also expressed by $$R2'(Ip-Ip2) = (Vp-Vp2) + Rpol2'(Ip-Ip2).$$

Since Rpol2'=$\Delta Vp2$ Ip2−R2', $$R2'(Ip-Ip2) = (Vp-Vp2) + (\Delta Vb2Ip2-R2')(Ip-Ip2),$$

that is, $$2R2'(Ip-Ip2) = (Vp-Vp2) + \Delta Vp2Ib2(Ip-Ip2),$$

then as a result, obtained is an equation expressed by $$R2' = [(Vp-Vp2) + (\Delta Vp2Ip2)(Ip-Ip2)]2(Ip-Ip2).$$

Here, ($\Delta Vp2$ Ip2) can be replaced by ($\Delta Vp$ Ip).

Since the two values R1' and R2' computed as described above take the reference points A and B, uses the polarization resistance components (Rpol1'=Rpol2) and (Rpol1= Rpol2'), which are different from each other, and also uses the voltage drop $\Delta Vp1$ ($\Delta Vp$) from the intercept C1 and the voltage drop $\Delta Vp2$ ($\Delta Vp$) from the intercept C2, wherein $\Delta Vp1$ ($\Delta Vp$) is different from $\Delta Vp2$ ($\Delta Vp$), therefore the values R1' and R2' cannot be the real pure resistance R. The real pure resistance R is obtained by addition-averaging these two values, that is, $$R=(R1'+R2')2.$$

In the method for measuring the pure resistance of the battery explained with reference to FIGS. 19–21, since each point P is defined as a point corresponding to the maximum discharge current value of the battery on the respective approximate curve equation M1 or M2, that is, the common data are used, therefore an error is significantly prevented from entering into the value to be computed.

Then, the first imaginary point P1 having the same resistance value as the second combined resistance R2 consisting of the pure resistance of the battery and the second polarization resistance component Rpol2, which causes the second voltage drop ΔV2 when the discharge current Ip corresponding to the point P that is on the curve expressed by the second approximate curve equation M2 flows, is imaginarily set on the first approximate curve equation M1, while the second imaginary point P2 having the same resistance value as the first combined resistance R1 consisting of the pure resistance of the battery and the first polarization resistance component Rpol1, which causes the first voltage drop ΔV1 when the discharge current Ip corresponding to the point P that is on the curve expressed by the first approximate curve equation M1 flows, is imaginarily set on the second approximate curve equation M2.

Thereafter, the first gradient R1 of the straight line L1 formed by connecting the point P and the first imaginary point P1 is revised by a factor corresponding to the voltage drop difference Rpol2 (Ip1 Ip) due to the second polarization resistance component Rpol2, which is arisen by the discharge current Ip and the discharge current Ip1 at the first imaginary point P1, then the first revised gradient R1 which excludes the contribution of the voltage drop due to the second polarization resistance component Rpol2, is computed, while the second gradient R2 of the straight line L2 formed by connecting the point P and the second imaginary point P2 is revised by a factor corresponding to the voltage drop difference Rpol1 (Ip Ip2) due to the first polarization resistance component Rpol1, which is arisen by the discharge current Ip and the discharge current Ip2 at the second imaginary point P2, then the second revised gradient R2 which excludes the contribution of the voltage drop due to the first polarization resistance component Rpol1, is computed.

The average gradient is obtained by addition-averaging thus computed first revised gradient R1 and second revised gradient R2 The obtained average gradient is measured as the pure resistance of the battery.

A detailed sequence for measuring the pure resistance of the battery is the same as the sequence for measuring the pure resistance explained with reference to FIGS. 7 9. The measurement thereof can be carried out through processes, which are almost the same as those shown in the flow chart in FIG. 14.

In the preferred embodiments described above, when the approximated V-I characteristic due to the pure resistance of the battery is computed, the approximate curve equation of the quadratic equation $V=aI^2+bI+c$ is used in order to improve the performance of the approximation. Instead, an approximate curve equation of a logarithmic equation can also be used.

In the preferred embodiments described above, the temperature in the engine room, which is detected by the temperature sensor upon the storage, is stored as the temperature of or around the battery for convenience. Instead, a real inside temperature of the battery of course can be used as the temperature of or around the battery.

What is claimed is:

1. A method for estimating a terminal voltage of a battery comprising the steps of:

periodically measuring a terminal voltage and a discharge current of a battery that supplies an electric power to loads in a vehicle;

calculating a voltage-current characteristic expressing a correlation between the terminal voltage and the discharge current; and estimating an estimated voltage that is an estimated terminal voltage of the battery in a constant load discharging state thereof from the voltage-current characteristic, wherein when the battery carries out a constant load discharge with a current value large enough to cancel a charge-side polarization arisen in the battery at least just before the discharge, the voltage-current characteristic including an influence of a polarization is calculated from the terminal voltage and the discharge current of the battery, which are periodically measured while the discharge current of the constant load discharge decreases from the maximum current value, the voltage-current characteristic including the influence of the polarization is shifted in the direction of a voltage coordinate axis so that a voltage value at a reference current value lower than the maximum current value in the voltage-current characteristic including the influence of the polarization agrees with a reference voltage value at the reference current value in the voltage-current characteristic, which does not include the influence of the polarization but depends only on a pure resistance component of the battery, and a voltage value corresponding to a predetermined imaginary current value in the voltage-current characteristic including the influence of the polarization shifted in the direction of the voltage coordinate axis is estimated as a value of the estimated voltage.

2. The method for estimating a terminal voltage of a battery according to claim 1, wherein the voltage-current characteristic including the influence of the polarization is expressed by an approximate curve equation.

3. The method for estimating a terminal voltage of a battery according to claim 1 or 2, wherein the current value large enough to cancel a charge-side polarization arisen in the battery at least just before the discharge is set to be a predetermined large current value required to drive a maximum power consuming load independently out of the loads in the vehicle, which receive an electric power from the battery, and after the discharge current of the battery starts decreasing from the predetermined large current value, while the discharge current of the battery is lower than the predetermined large current value and is decreasing up to a target current value that is higher than a maximum discharge current value when the loads in the vehicle except the maximum power consuming load are driven, a voltage-current characteristic including an influence of a polarization for the battery in an equilibrium state thereof and the voltage-current characteristic including the influence of the polarization are calculated from the periodically measured terminal voltage and discharge current of the battery.

4. A method for computing an open circuit voltage of a battery comprising the steps of:

periodically measuring a terminal voltage and a discharge current of a battery that supplies an electric power to loads in a vehicle;

calculating a voltage-current characteristic expressing a correlation between the terminal voltage and the discharge current;

estimating an estimated voltage that is an estimated terminal voltage of the battery in a constant load discharging state thereof from the voltage-current characteristic; and computing an open circuit voltage of the battery corresponding to a terminal voltage of the battery in an equilibrium state thereof on the basis of the estimated voltage, wherein when the battery carries out a constant load discharge with a current value large enough to cancel a charge-side polarization arisen in the battery at least just before the discharge, the voltage-current characteristic including an influence of a polarization is calculated from the terminal voltage and the discharge current of the battery, which are periodically measured while the discharge current of the constant load discharge decreases from the maximum current value, the voltage-current characteristic including the influence of the polarization is shifted in the direction of a voltage coordinate axis so that a voltage value at a reference current value lower than the maximum current value in the voltage-current characteristic including the influence of the polarization agrees with a reference voltage value at the reference current value in the voltage-current characteristic, which does not include the influence of the polarization but depends only on a pure resistance component of the battery, a difference value between the open circuit voltage value at the current being zero in the voltage-current characteristic not including the influence of the polarization and the estimated voltage value estimated on the basis of the voltage-current characteristic including the influence of the polarization shifted in the direction of the voltage coordinate axis is in advance calculated as a residual voltage drop value due to an influence of a residual polarization upon a completion of the discharge of the battery, thereafter, whenever the battery carries out a constant load discharge with a current value large enough to cancel a charge-side polarization arisen in the battery at least just before the discharge, the voltage-current characteristic including the influence of the polarization is newly calculated from the terminal voltage and the discharge current of the battery periodically measured during the constant load discharge, the newly calculated voltage-current characteristic including the influence of the polarization is shifted in the direction of a voltage coordinate axis so that a voltage value at the reference current value in the newly calculated voltage-current characteristic including the influence of the polarization agrees with the reference voltage value in the voltage-current characteristic not including the influence of the polarization when the voltage-current characteristic including the influence of the polarization is newly calculated, a present estimated voltage is estimated on the basis of the newly calculated voltage-current characteristic including the influence of the polarization shifted in the direction of the voltage coordinate axis, and a present open circuit voltage is computed by adding the residual voltage drop value to the present estimated voltage value.

5. The method for computing an open circuit voltage of a battery according to claim 4, wherein after the residual voltage drop value is calculated, whenever the battery carries out a constant load discharge with a current value large enough to cancel a charge-side polarization arisen in the battery at least just before the discharge, the voltage-current characteristic not including the influence of the polarization is calculated when the voltage-current characteristic including the influence of the polarization is newly calculated from the terminal voltage and the discharge current of the battery periodically measured during the constant load discharge.

6. The method for computing an open circuit voltage of a battery according to claim 4 or 5, wherein whenever the battery becomes in an equilibrium state thereof, the terminal voltage value of the battery measured in the equilibrium state thereof is obtained as a present open circuit voltage value, a newest voltage-current characteristic not including the influence of the polarization is calculated from the terminal voltage and the discharge current of the battery, which are periodically measured when the battery carries out a constant load discharge with a current value large enough to cancel a charge-side polarization arisen in the battery at least just before the discharge starting from the equilibrium state, a newest voltage-current characteristic including the influence of the polarization is calculated from the terminal voltage and the discharge current of the battery periodically measured while a discharge current of the constant load discharge, which the battery carries out with a current value large enough to cancel a charge-side polarization arisen in the battery at least just before the discharge starting from the equilibrium state, is decreasing from a predetermined large current value, a newest residual voltage drop value is calculated on the basis of the obtained terminal voltage value and the newest voltage-current characteristic including the influence of the polarization, and thereafter, the present open circuit voltage is computed on the basis of the newest residual voltage drop value and the newest voltage-current characteristic not including the influence of the polarization.

7. The method for computing an open circuit voltage of a battery according to claim 4 or 5, wherein the voltage-current characteristic including the influence of the polarization is expressed by an approximate curve equation.

8. The method for computing an open circuit voltage of a battery according to claim 4 or 5, wherein the current value large enough to cancel a charge-side polarization arisen in the battery at least just before the discharge is set to be a predetermined large current value required to drive a maximum power consuming load independently out of the loads in the vehicle, which receive an electric power from the battery, and after the discharge current of the battery starts decreasing from the predetermined large current value, while the discharge current of the battery is lower than the predetermined large current value and is decreasing up to a target current value that is higher than a maximum discharge current value when the loads in the vehicle except the maximum power consuming load are driven, a voltage-current characteristic including an influence of a polarization for the battery in an equilibrium state thereof and the voltage-current characteristic including the influence of the polarization are calculated from the periodically measured terminal voltage and discharge current of the battery.

9. The method for computing an open circuit voltage of a battery according to claim 4 or 5, wherein whenever a present estimated voltage of the battery is estimated on the basis of the voltage-current characteristic including the influence of the polarization shifted in the direction of the voltage coordinate axis, the residual voltage drop value is revised in response to an inside or circumferential temperature of the battery upon the estimation and another inside or circumferential temperature of the battery when the voltage-current characteristic not including the influence of the polarization for the battery in the equilibrium state thereof is obtained, and the present open circuit voltage is computed from the revised residual voltage drop value.

10. A method for computing a battery capacity comprising the step of computing a present charging capacity of the battery from the present open circuit voltage computed by a method for computing an open circuit voltage of a battery according to claim 4 or 5.

11. An apparatus for estimating a terminal voltage of a battery executing the steps of: periodically measuring a terminal voltage and a discharge current of a battery that supplies an electric power to loads in a vehicle; calculating a voltage-current characteristic expressing a correlation between the terminal voltage and the discharge current; and estimating an estimated voltage that is an estimated terminal voltage of the battery in a constant load discharging state thereof from the voltage-current characteristic, the apparatus comprising:
first computing means for computing a voltage-current characteristic including an influence of a polarization from a terminal voltage and a discharge current of the battery periodically measured after the discharge current of the battery starts decreasing from a maximum current value, in a constant load discharge that the battery carries out with a current value large enough to cancel a charge-side polarization arisen in the battery at least just before the discharge, second computing means for computing a voltage-current characteristic including an influence of a polarization shifted in the direction of a voltage coordinate axis so that a voltage value at a reference current value lower than the maximum current value in the voltage-current characteristic including the influence of the polarization computed by the first computing means agrees with a reference voltage value at the reference current value in the voltage-current characteristic, which does not include the influence of the polarization but depends only on a pure resistance component of the battery, when the first computing means computes the voltage-current characteristic including the influence of the polarization, and estimating means for estimating a voltage value corresponding to a predetermined imaginary current value in the voltage-current characteristic including the influence of the polarization shifted in the direction of the voltage coordinate axis computed by the second computing means is estimated as a present value of the estimated voltage of the battery.

12. The apparatus for estimating a terminal voltage of a battery according to claim 11, wherein the first computing means computes the voltage-current characteristic including the influence of the polarization as an approximate curve equation.

13. The apparatus for estimating a terminal voltage of a battery according to claim 11 or 12, wherein the current value large enough to cancel a charge-side polarization arisen in the battery at least just before the discharge is a predetermined large current value required to drive a maximum power consuming load independently out of the loads in the vehicle, which receive an electric power from the battery, and after the discharge current of the battery starts decreasing from the predetermined large current value, while the discharge current of the battery is decreasing up to a target current value that is higher than a maximum discharge current value when the loads in the vehicle except the maximum power consuming load are driven, the first computing means computes the voltage-current characteristic including the influence of the polarization from the periodically measured terminal voltage and discharge current of the battery.

14. An apparatus for computing an open circuit voltage of a battery executing the steps of: periodically measuring a terminal voltage and a discharge current of a battery that supplies an electric power to loads in a vehicle; calculating a voltage-current characteristic expressing a correlation between the terminal voltage and the discharge current; estimating an estimated voltage that is an estimated terminal voltage of the battery in a constant load discharging state thereof from the voltage-current characteristic; and computing an open circuit voltage of the battery corresponding to a terminal voltage of the battery in an equilibrium state thereof on the basis of the estimated voltage, the apparatus comprising:
storing means for storing a residual voltage drop value due to a residual polarization upon a completion of the discharge when the battery carries out a constant load discharge with a current value large enough to cancel a charge-side polarization arisen in the battery at least just before the discharge;

first computing means for computing the voltage-current characteristic including an influence of a polarization from the periodically measured terminal voltage and discharge current of the battery after the discharge current of the battery starts decreasing from a maximum current value, during the constant load discharge that the battery carries out with a current value large enough to cancel a charge-side polarization arisen in the battery at least just before the discharge;

second computing means for computing a voltage-current characteristic including the influence of the polarization shifted in the direction of a voltage coordinate axis so that a voltage value at a reference current value lower than the maximum current value in the voltage-current characteristic including the influence of the polarization, which is computed by the first computing means, agrees with a reference voltage value at the reference current value in the voltage-current characteristic, which does not include the influence of the polarization but depends only on a pure resistance component of the battery, when the first computing means computes the voltage-current characteristic including the influence of the polarization; and estimating means for estimating a present estimated voltage of the battery on the basis of the voltage-current characteristic including the influence of the polarization shifted in the direction of a voltage coordinate axis computed by the second computing means, wherein the storing means in advance stores a difference value between a value of the estimated voltage in advance estimated on the basis of an in advance computed voltage-current characteristic including the influence of the polarization sifted in the direction of a voltage coordinate axis, which is obtained by shifting the in advance computed voltage-current characteristic including the influence of the polarization in the direction of the voltage coordinate axis, so that a voltage value at the reference current value in the in advance computed voltage-current characteristic including the influence of the polarization agrees with the reference voltage value in the in advance computed voltage-current characteristic not including the influence of the polarization and a value of the open circuit voltage at the current being zero in the in advance computed voltage-current characteristic not including the influence of the polarization, and a present open circuit voltage is computed by adding the residual voltage drop value in advance stored by the storing means to the present estimated voltage value estimated by the estimating means.

15. The apparatus for computing an open circuit voltage of a battery according to claim 14, further comprising third computing means for computing the voltage-current characteristic not including the influence of the polarization from the periodically measured terminal voltage and discharge current of the battery, which carries out a constant load discharge with a current value large enough to cancel a charge-side polarization arisen in the battery at least just before the discharge, wherein the second computing means computes the voltage-current characteristic including the influence of the polarization shifted in the direction of a voltage coordinate axis on the basis of the voltage-current characteristic including the influence of the polarization computed by the first computing means and the voltage-current characteristic not including the influence of the polarization computed by the third computing means.

16. The apparatus for computing an open circuit voltage of a battery according to claim 14 or 15, further comprising:

judging means for judging whether or not the battery is in an equilibrium state thereof;

measuring means for measuring a terminal voltage of the battery when the battery is judged to be in an equilibrium state thereof by the judging means;

calculating means for calculating the newest residual voltage drop value by subtracting the present estimated voltage value estimated by the estimating means on the basis of the terminal voltage and discharge current of the battery, which is judged in an equilibrium state thereof by the judging means, periodically measured while the battery carries out the constant load discharge with a current value large enough to cancel a charge-side polarization arisen in the battery at least just before the discharge from a terminal voltage value of the battery most newly measured by the measuring means;

renewing means for renewing the residual voltage drop value stored by the storing means to the newest residual voltage drop value calculated by the calculating means; and fourth computing means for computing a newest voltage-current characteristic not including the influence of the polarization on the basis of the terminal voltage and discharge current of the battery, which is judged in an equilibrium state thereof by the judging means, periodically measured while the battery carries out the constant load discharge with a current value large enough to cancel a charge-side polarization arisen in the battery at least just before the discharge.

17. The apparatus for computing an open circuit voltage of a battery according to claim 16, further comprising:

detecting means for detecting an inside or circumferential temperature of the battery; and revising means for revising the residual voltage drop value stored by the storing means in response to an inside or circumferential temperature of the battery detected by the detecting means when the estimating means estimates the present estimated voltage and another inside or circumferential temperature of the battery detected by the detecting means when the renewing means renews the residual voltage drop value stored by the storing means to the newest residual voltage drop value calculated by the calculating means, wherein the present open circuit voltage is computed by adding the residual voltage drop value revised by the revising means to the estimated voltage value estimated by the estimating means.

18. The apparatus for computing an open circuit voltage of a battery according to claim 14 or 15, wherein the first computing means computes the voltage-current characteristic including the influence of the polarization as an approximate curve equation.

19. The apparatus for computing an open circuit voltage of a battery according to claim 14 or 15, wherein the current value large enough to cancel a charge-side polarization arisen in the battery at least just before the discharge is a predetermined large current value required to drive a maximum power consuming load independently out of the loads in the vehicle, which receive an electric power from the battery, and after the discharge current of the battery starts decreasing from the predetermined large current value, while the discharge current of the battery is decreasing up to a target current value that is higher than a maximum discharge current value when the loads in the vehicle except the maximum power consuming load are driven, the first computing means computes the voltage-current characteristic including the influence of the polarization from the periodically measured terminal voltage and discharge current of the battery.

20. An apparatus for computing a battery capacity comprising the apparatus for computing an open circuit voltage of a battery according to claim 14 or 15, wherein a present charging capacity of the battery is computed from the present open circuit voltage computed by the apparatus for computing an open circuit voltage of a battery.

* * * * *